United States Patent
Yamamoto

(10) Patent No.: US 10,622,437 B2
(45) Date of Patent: Apr. 14, 2020

(54) ACTIVE MATRIX SUBSTRATE AND DISPLAY DEVICE

(71) Applicant: Sharp Kabushiki Kaisha, Sakai, Osaka (JP)

(72) Inventor: Kaoru Yamamoto, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/365,799

(22) Filed: Mar. 27, 2019

(65) Prior Publication Data

US 2019/0305071 A1    Oct. 3, 2019

(30) Foreign Application Priority Data

Mar. 28, 2018    (JP) .................................. 2018-061374

(51) Int. Cl.
   *H01L 27/32*       (2006.01)
   *G09G 3/3225*     (2016.01)
   *H01L 27/12*       (2006.01)

(52) U.S. Cl.
   CPC ....... *H01L 27/3276* (2013.01); *G09G 3/3225* (2013.01); *H01L 27/1218* (2013.01); *H01L 27/3297* (2013.01); *G09G 2310/0264* (2013.01)

(58) Field of Classification Search
   CPC ... G09G 2310/0297; G09G 2310/0264; G09G 3/3275; G09G 3/3674; G09G 3/3677
   See application file for complete search history.

(56) References Cited

U.S. PATENT DOCUMENTS

| | | | |
|---|---|---|---|
| 2005/0270258 A1* | 12/2005 | Shin ..................... | G09G 3/3275 345/76 |
| 2006/0221701 A1* | 10/2006 | Sun ...................... | G09G 3/3648 365/185.22 |
| 2012/0138922 A1 | 6/2012 | Yamazaki et al. | |
| 2013/0038518 A1 | 2/2013 | Tagawa et al. | |
| 2013/0320334 A1 | 12/2013 | Yamazaki et al. | |
| 2014/0232626 A1 | 8/2014 | Jamshidi-Roudbari et al. | |
| 2014/0286076 A1 | 9/2014 | Aoki et al. | |

FOREIGN PATENT DOCUMENTS

| | | |
|---|---|---|
| JP | 2010-102266 A | 5/2010 |
| JP | 2012-134475 A | 7/2012 |
| JP | 2014-007399 A | 1/2014 |
| JP | 2014-209727 A | 11/2014 |
| WO | 2011/118079 A1 | 9/2011 |

\* cited by examiner

*Primary Examiner* — Koosha Sharifi-Tafreshi

(74) *Attorney, Agent, or Firm* — Keating & Bennett, LLP

(57) ABSTRACT

An active matrix substrate includes a demultiplexer circuit arranged in a peripheral region, and a power source circuit configured to supply power source voltages at a plurality of levels to the demultiplexer circuit. The demultiplexer circuit includes a boost circuit configured to increase a voltage to be applied to a gate electrode of a switching TFT. The boost circuit includes a set up unit to be driven by a first drive signal to pre-charge a node coupled to the gate electrode, a reset unit to be driven by a second drive signal to reset a potential of the node, and a boost unit to be driven by a third drive signal to increase the potential of the node pre-charged by the set up unit. An amplitude of the first drive signal and an amplitude of the second drive signal are identical to each other. An amplitude of the third drive signal differs from the amplitudes of the first drive signal and the second drive signal.

22 Claims, 33 Drawing Sheets

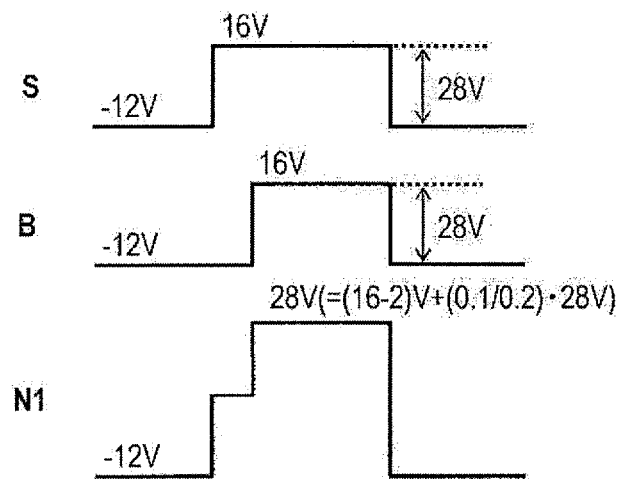
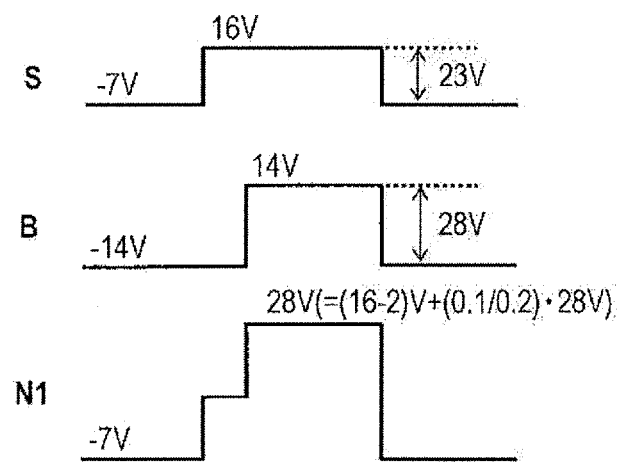

ACTIVE MATRIX SUBSTRATE AND DISPLAY DEVICE

CROSS-REFERENCE TO RELATED APPLICATIONS

This application claims the benefit of priority to Japanese Patent Application Number 2018-061374 filed on Mar. 28, 2018. The entire contents of the above-identified application are hereby incorporated by reference.

BACKGROUND

Technical Field

The disclosure relates to active matrix substrates, and, in particular, an active matrix substrate including a demultiplexer circuit. The disclosure also relates to a display device including the active matrix substrate.

An active matrix substrate used in a liquid crystal display device, for example, includes a display region including a plurality of pixels, and another region than the display region (a non-display region or a frame region). The display region is provided with switching elements such as thin film transistors (hereinafter referred to as "TFTs") respectively in pixels. As the switching elements, TFTs each including an amorphous silicon film serving as an active layer (hereinafter referred to as "amorphous silicon TFTs") and TFTs each including a poly-crystal silicon film serving as an active layer (hereinafter referred to as "poly-crystal silicon TFTs") have been widely used in the related art.

Use of an oxide semiconductor as a material for an active layer in a TFT has been proposed, instead of use of amorphous silicon and poly-crystal silicon. The TFT will be referred to as an "oxide semiconductor TFT". The oxide semiconductor is higher in mobility than amorphous silicon. The oxide semiconductor TFT can therefore operate more promptly than an amorphous silicon TFT.

A non-display region of an active matrix substrate may be monolithically (integrally) formed with a peripheral circuit such as a drive circuit. Monolithically forming a drive circuit achieves a narrower non-display region (a narrower frame) and a simplified mounting process, leading to cost reduction. For example, a non-display region may be monolithically formed with a gate driver circuit and may be mounted with a source driver circuit through a chip-on-glass (COG) style.

For devices including smartphones, narrower frames have been demanded. To satisfy the demand, monolithically forming a demultiplexer (DEMUX) circuit such as a source shared driving (SSD) circuit, in addition to a gate driver, has been proposed (e.g., WO 2011/118079 and JP 2010-102266 A). An SSD circuit is a circuit configured to distribute a video signal from one of video signal lines coupled to terminals of a source driver to a plurality of source wiring lines. Mounting an SSD circuit can further reduce a region to be arranged with terminals and wiring lines (region to be formed with terminals and wiring lines) in a non-display region. A number of outputs from a source driver and a circuit scale can also be reduced, achieving a cost reduction for a driver integrated circuit (IC).

Peripheral circuits including a drive circuit and an SSD circuit include TFTs. Here, a TFT to be arranged as a switching element in each of pixels in a display region will be referred to as a "pixel TFT", whereas a TFT configuring a peripheral circuit will be referred to as a "circuit TFT". Among circuit TFTs, a TFT to be used as a switching element in a DEMUX circuit (SSD circuit) will be referred to as a "TFT for DEMUX circuit".

SUMMARY

For active matrix substrates using oxide semiconductor TFTs as pixel TFTs, TFTs for DEMUX circuit may be the oxide semiconductor TFTs using oxide semiconductor films also used in the pixel TFTs in terms of a manufacturing process.

However, using oxide semiconductor TFTs to form a DEMUX circuit has been difficult. Instead, poly-crystal silicon TFTs have been used as TFTs for DEMUX circuit in the related art. The reasons are as follows.

An oxide semiconductor has mobility approximately one digit smaller than the mobility of poly-crystal silicon. Therefore, a current drive power for an oxide semiconductor TFT is smaller than a current drive power for a poly-crystal silicon TFT. Therefore, to use an oxide semiconductor to form a TFT for DEMUX circuit, the TFT should be increased greater in size (channel width) than a TFT formed of poly-crystal silicon, or a drive voltage should be increased higher than a drive voltage for the TFT formed of poly-crystal silicon. When a TFT is increased in size, a gate capacitance load also increases, leading to an increase in drive power for a DEMUX circuit. On the other hand, even when a drive voltage for a TFT is increased, a drive power for a DEMUX circuit also increases.

As will be described later, even when a poly-crystal silicon TFT is used as a TFT for DEMUX circuit, if only a P-channel metal oxide semiconductor (PMOS) process is adopted (i.e., if a poly-crystal silicon TFT is a PMOS transistor only), similar problems can arise.

In view of the problems described above, the disclosure has an object to reduce a drive power for an active matrix substrate including a demultiplexer circuit.

An active matrix substrate according to an embodiment of the disclosure is an active matrix substrate including a display region including a plurality of pixel regions, and a peripheral region lying at periphery of the display region. The active matrix substrate includes a substrate, a plurality of gate bus lines and a plurality of source bus lines provided on the substrate, a source driver arranged in the peripheral region, and including a plurality of output terminals, a plurality of signal output lines respectively coupled to the plurality of output terminals of the source driver, and a demultiplexer circuit arranged in the peripheral region, and including a plurality of unit circuits supported by the substrate. The plurality of unit circuits of the demultiplexer circuit each distribute a display signal from one signal output line among the plurality of signal output lines to an n number of source bus lines, where n is an integer of 2 or greater, among the plurality of source bus lines. The plurality of unit circuits each include an n number of branch wiring lines coupled to the one signal output line, an n number of switching thin film transistors (TFTs) respectively coupled to the n number of branch wiring lines, and configured to separately on/off-control electrical couplings between the n number of branch wiring lines and the n number of source bus lines. The demultiplexer circuit further includes a plurality of boost circuits configured to increase a voltage to be applied to gate electrodes of the n number of switching TFTs. The plurality of boost circuits each include a set up unit to be driven by a first drive signal S, and configured to perform a set operation to pre-charge a node coupled to a corresponding one of the gate electrodes, a reset unit to be driven by a second drive signal R, and configured to perform a reset operation to reset a potential of the node, and a boost unit to be driven by a third drive signal B, and configured to perform a boost operation to increase the potential of the node pre-charged by the set up unit. An amplitude of the first drive signal S and an amplitude of the second drive signal R are identical to each other. An amplitude of the third drive signal B differs from the amplitudes of the first drive signal S and the second drive signal R.

In an embodiment, the amplitudes of the first drive signal S and the second drive signal R are each smaller than the amplitude of the third drive signal B.

In an embodiment, high level potentials of the first drive signal S and the second drive signal R and a high level potential of the third drive signal B are identical to each other, and low level potentials of the first drive signal S and the second drive signal R are each higher than a low level potential of the third drive signal B.

In an embodiment, the active matrix substrate further includes a power source circuit unit configured to supply power source voltages at a plurality of levels used to generate the first drive signal S, the second drive signal R, and the third drive signal B. The power source voltages at the plurality of levels include a high level power source voltage corresponding to each of the high level potentials of the first drive signal S, the second drive signal R, and the third drive signal B, a first low level power source voltage corresponding to each of the low level potentials of the first drive signal S and the second drive signal R, and a second low level power source voltage corresponding to the low level potential of the third drive signal B.

In an embodiment, the low level potentials of the first drive signal S and the second drive signal R and the low level potential of the third drive signal B are identical to each other, and the high level potentials of the first drive signal S and the second drive signal R are each lower than the high level potential of the third drive signal B.

In an embodiment, the active matrix substrate further includes a power source circuit unit configured to supply power source voltages at a plurality of levels used to generate the first drive signal S, the second drive signal R, and the third drive signal B. The power source voltages at the plurality of levels include a low level power source voltage corresponding to each of the low level potentials of the first drive signal S, the second drive signal R, and the third drive signal B, a first high level power source voltage corresponding to each of the high level potentials of the first drive signal S and the second drive signal R, and a second high level power source voltage corresponding to the high level potential of the third drive signal B.

In an embodiment, a relationship of VDL1−Vsl−Vthsw<0 is satisfied, where Vthsw is a threshold voltage of each of the switching TFTs, Vsl is a low level potential of the display signal, and VDL1 is each of the low level potentials of the first drive signal S and the second drive signal R.

In an embodiment, the demultiplexer circuit includes a first drive signal line configured to supply the first drive signal S to the set up unit, a second drive signal line configured to supply the second drive signal R to the reset unit, and a third drive signal line configured to supply the third drive signal B to the boost unit.

In an embodiment, the set up unit includes a diode-coupled setting TFT including a gate electrode coupled to the first drive signal line, the reset unit includes a resetting TFT including a gate electrode coupled to the second drive signal line, and configured to pull down a potential of the node, and the boost unit includes a boosting capacitance element including a first capacitance electrode coupled to the third drive signal line, and a second capacitance electrode coupled to the node.

In an embodiment, the setting TFT includes a source electrode coupled to the node, and a drain electrode coupled to the first drive signal line, and the resetting TFT includes a source electrode configured to accept a constant potential, and a drain electrode coupled to the node.

In an embodiment, the setting TFT includes a source electrode coupled to the node, and a drain electrode coupled to the first drive signal line, and the resetting TFT includes a source electrode coupled to the first drive signal line, and a drain electrode coupled to the node.

In an embodiment, the set up unit includes a diode-coupled setting TFT including a gate electrode coupled to the first drive signal line, the boost unit includes a boosting TFT including a gate electrode coupled to the node, a source electrode coupled to another node than the node, and a drain electrode coupled to the third drive signal line, and the reset unit includes first and second resetting TFTs respectively including gate electrodes coupled to the second drive signal line, and configured to pull down the potential of the node. The first resetting TFT includes a drain electrode coupled to the node. The second resetting TFT includes a drain electrode coupled to the other node.

In an embodiment, the setting TFT includes a source electrode coupled to the node, and a drain electrode coupled to the first drive signal line, and the first resetting TFT and the second resetting TFT respectively include source electrodes each configured to accept a constant potential.

In an embodiment, the setting TFT includes a source electrode coupled to the node, and a drain electrode coupled to the first drive signal line, and the first resetting TFT and the second resetting TFT respectively include source electrodes each coupled to the first drive signal line.

In an embodiment, the boost unit further includes a boosting capacitance element including a first capacitance electrode coupled to the node, and a second capacitance electrode coupled to the other node.

In an embodiment, the n number of switching TFTs included in each of the plurality of unit circuits include a first switching TFT and a second switching TFT configured to attain an on state at timings different from each other within one horizontal scan period. The plurality of boost circuits include a first boost circuit coupled to the first switching TFT, and a second boost circuit coupled to the second switching TFT. The first drive signal line for the first boost circuit also serves as the second drive signal line for the second boost circuit. The first drive signal line for the second boost circuit also serves as the second drive signal line for the first boost circuit.

In an embodiment, the n number of switching TFTs included in each of the plurality of unit circuits are two switching TFTs. The two switching TFTs include a first switching TFT and a second switching TFT configured to attain the on state at timings different from each other within one horizontal scan period. The plurality of boost circuits include a first boost circuit coupled to the first switching TFT of one unit circuit among the plurality of unit circuits, and a second boost circuit coupled to the second switching TFT of the one unit circuit.

In an embodiment, the n number of switching TFTs included in each of the plurality of unit circuits are two switching TFTs. The two switching TFTs include a first switching TFT and a second switching TFT configured to attain the on state at timings different from each other within one horizontal scan period. The plurality of boost circuits include a first boost circuit commonly coupled to the first switching TFTs of two unit circuits among the plurality of unit circuits, and a second boost circuit commonly coupled to the second switching TFTs of the two unit circuits.

In an embodiment, the n number of switching TFTs included in each of the plurality of unit circuits are two switching TFTs. The two switching TFTs include a first switching TFT and a second switching TFT configured to attain the on state at timings different from each other within one horizontal scan period. The plurality of boost circuits include a first boost circuit commonly coupled to the first switching TFTs of three or more unit circuits among the plurality of unit circuits, and a second boost circuit commonly coupled to the second switching TFTs of the three or more unit circuits.

In an embodiment, the n number of switching TFTs included in each of the plurality of unit circuits are three switching TFTs. The three switching TFTs include a first switching TFT, a second switching TFT, and a third switching TFT configured to attain the on state at timings different from each other within one horizontal scan period. The plurality of boost circuits include a first boost circuit coupled to the first switching TFT of one unit circuit among the plurality of unit circuits, a second boost circuit coupled to the second switching TFT of the one unit circuit, and a third boost circuit coupled to the third switching TFT of the one unit circuit.

In an embodiment, the n number of switching TFTs included in each of the plurality of unit circuits are three switching TFTs. The three switching TFTs include a first switching TFT, a second switching TFT, and a third switching TFT configured to attain the on state at timings different from each other within one horizontal scan period. The plurality of boost circuits include a first boost circuit commonly coupled to the first switching TFTs of two unit circuits among the plurality of unit circuits, a second boost circuit commonly coupled to the second switching TFTs of the two unit circuits, and a third boost circuit commonly coupled to the third switching TFTs of the two unit circuits.

In an embodiment, the n number of switching TFTs included in each of the plurality of unit circuits are three switching TFTs. The three switching TFTs include a first switching TFT, a second switching TFT, and a third switching TFT configured to attain the on state at timings different from each other within one horizontal scan period. The plurality of boost circuits include a first boost circuit commonly coupled to the first switching TFTs of three or more unit circuits among the plurality of unit circuits, a second boost circuit commonly coupled to the second switching TFTs of the three or more unit circuits, and a third boost circuit commonly coupled to the third switching TFTs of the three or more unit circuits.

In an embodiment, the demultiplexer circuit further includes a plurality of clear circuits respectively coupled to the plurality of boost circuits. The plurality of clear circuits are respectively configured to initialize the corresponding boost circuits each at a predetermined timing.

In an embodiment, the clear circuits each include a clearing TFT including a gate electrode configured to accept a clear signal, a source electrode configured to accept a constant potential, and a drain electrode coupled to the node.

In an embodiment, the clear circuits each include a clearing TFT including a gate electrode configured to accept a clear signal, a source electrode coupled to the first drive signal line, and a drain electrode coupled to the node.

In an embodiment, the set up unit and the reset unit each include a plurality of TFTs coupled in series to each other.

In an embodiment, the plurality of boost circuits include two or more boost circuits to be driven at an identical timing. The demultiplexer circuit includes a first drive signal line group configured to supply a drive signal group used to drive some boost circuits among the two or more boost circuits, and a second drive signal line group configured to supply a drive signal group used to drive other boost circuits. The second drive signal line group differs from the first drive signal line group.

In an embodiment, the set up unit is a set up and reset unit configured to also function as the reset unit. The set up and reset unit is configured to perform the set operation and the reset operation at timings different from each other.

In an embodiment, the n number of switching TFTs each include an oxide semiconductor layer serving as an active layer.

In an embodiment, the oxide semiconductor layer contains an In—Ga—Zn—O based semiconductor.

In an embodiment, the In—Ga—Zn—O based semiconductor contains a crystalline portion.

In an embodiment, the n number of switching TFTs respectively are P-channel metal oxide semiconductor (PMOS) transistors each including a poly-crystal silicon semiconductor layer serving as an active layer.

A display device according to an embodiment of the disclosure includes an active matrix substrate having one of the configurations described above.

According to the embodiments of the disclosure, a drive power for an active matrix substrate including a demultiplexer circuit can be reduced.

BRIEF DESCRIPTION OF DRAWINGS

The disclosure will be described with reference to the accompanying drawings, wherein like numbers reference like elements.

FIGS. 8A and 8B are views respectively illustrating relationships between amplitudes of a set signal S and a boost signal B and potentials of a node N1 in the active matrix substrate 500 according to the comparative example and the active matrix substrate 100 according to the first embodiment.

DESCRIPTION OF EMBODIMENTS

Embodiments of the disclosure will be described herein with reference to the accompanying drawings. The disclosure is not limited to the embodiments described below.

First Embodiment

Figure 1:
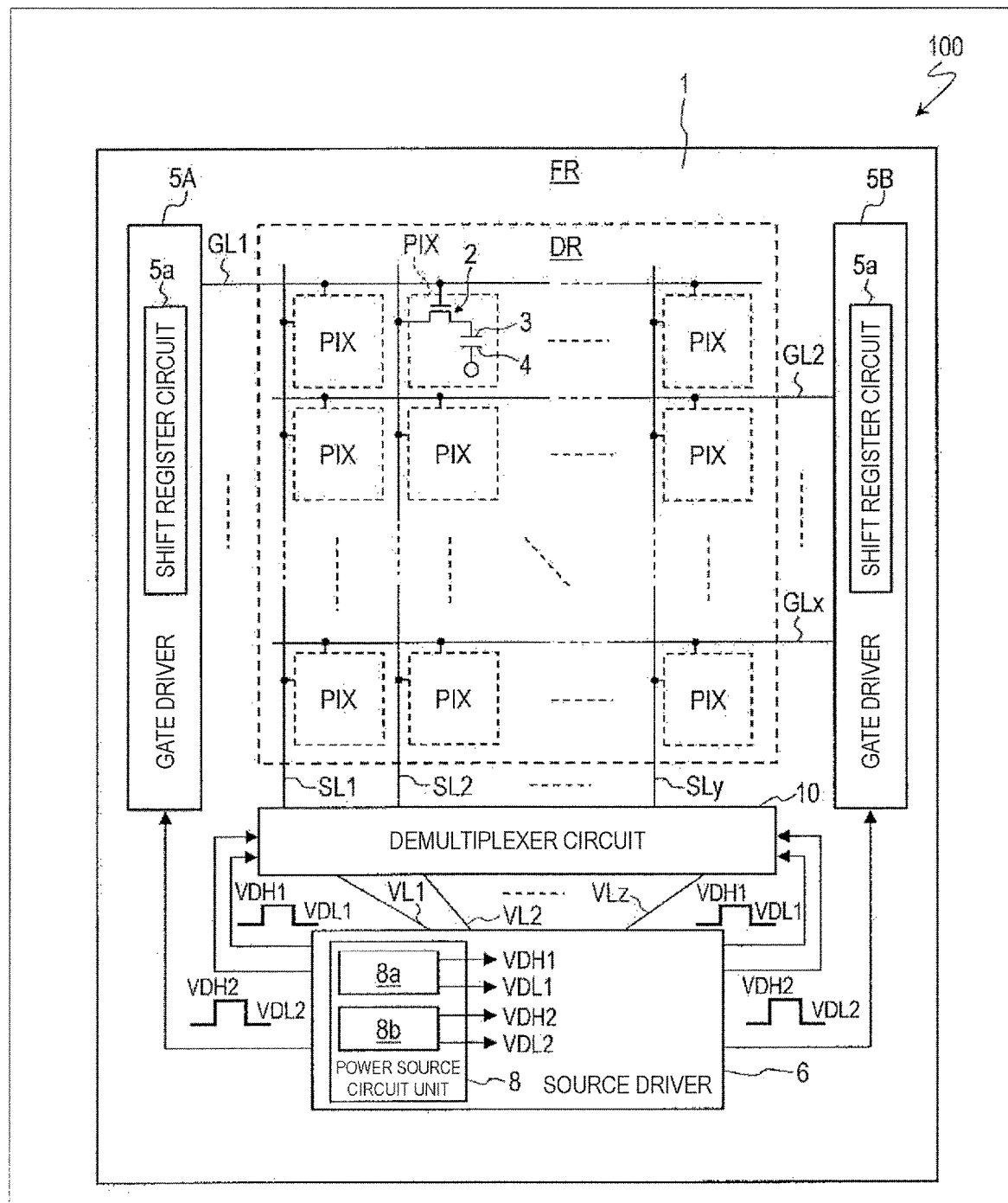
FIG. 1 is a schematic view illustrating an example of a plane structure of an active matrix substrate 100 according to a first embodiment.

FIG. 1 is a schematic view illustrating an example of a plane structure of an active matrix substrate 100 according to the embodiment. As illustrated in FIG. 1, the active matrix substrate 100 includes a display region DR, and a peripheral region FR.

The display region DR includes a plurality of pixel regions PIX. The pixel regions PIX are regions corresponding to pixels of a display device. Hereinafter the pixel regions PIX will sometimes be simply referred to as "pixels". The plurality of pixel regions PIX are arranged in a matrix shape including a plurality of rows and a plurality of columns. The plurality of pixel regions PIX arranged in a matrix shape define the display region DR.

The peripheral region FR lies at periphery of the display region DR. The peripheral region FR is a region that does not contribute to displaying, and will sometimes be referred to as a "non-display region" or a "frame region".

Components of the active matrix substrate 100 are supported by a substrate 1. The substrate 1 is a glass substrate, for example.

On the substrate 1, a plurality of gate bus lines (scanning line) GL and a plurality of source bus lines (signal line) SL are provided. The plurality of gate bus lines GL respectively extend in a row direction. The plurality of source bus lines SL respectively extend in a column direction. FIG. 1 illustrates the gate bus lines GL at a first row, a second row, . . . an x-th row as "GL1", "GL2", . . . "GLx", whereas the source bus lines SL at a first column, a second column, . . . a y-th column as "SL1", "SL2", . . . "SLy".

Typically, a region surrounded by the two adjacent gate bus lines GL and the two adjacent source bus lines SL represents each of the pixel regions PIX. The pixel regions PIX each include a thin film transistor 2 and a pixel electrode 3.

The thin film transistor 2 is also referred to as a "pixel TFT". A gate electrode and a source electrode of the thin film transistor 2 are respectively coupled to a corresponding one of the gate bus lines GL and a corresponding one of the source bus lines SL. A drain electrode of the thin film transistor 2 is coupled to the pixel electrode 3. When the active matrix substrate 100 is used in a liquid crystal display device with a transverse electrical field mode such as a fringe field switching (FFS) mode, the active matrix substrate 100 is provided with commonly used electrodes (common electrodes) 4 respectively corresponding to the plurality of pixel regions PIX. When the active matrix substrate 100 is applied in a liquid crystal display device with a vertical electric field mode, the common electrodes 4 are provided to a counter substrate arranged to face the active matrix substrate 100 via a liquid crystal layer.

The peripheral region FR is arranged with gate drivers (scanning line drive circuits) 5A and 5B configured to drive the gate bus lines GL, a source driver (signal line drive circuit) 6 configured to drive the source bus lines SL, and a demultiplexer (DEMUX) circuit 10. The DEMUX circuit 10 functions as an SSD circuit configured to drive the source bus lines SL in a time division manner. The peripheral region FR is further arranged with a power source circuit unit 8. The power source circuit unit 8 is configured to supply power source voltages at a plurality of levels used to generate a first drive signal, a second drive signal, and a third drive signal, described later.

In the embodiment, the gate drivers 5A and 5B and the DEMUX circuit 10 are integrally (monolithically) formed on the substrate 1. The source driver 6 is mounted (more specifically, COG-mounted) on the substrate 1. The power source circuit unit 8 is incorporated within the source driver 6 being COG-mounted.

In the illustrated example, the gate driver 5A configured to drive the gate bus lines GL at odd-numbered rows is arranged on a left-hand side to the display region DR, whereas the gate driver 5B configured to drive the gate bus lines GL at even-numbered rows is arranged on a right-hand side to the display region DR.

A plurality of output terminals (not illustrated) of the gate driver 5A are respectively coupled to the gate bus lines GL at the odd-numbered rows. A plurality of output terminals (not illustrated) of the gate driver 5B are respectively coupled to the gate bus lines GL at the even-numbered rows. The gate drivers 5A and 5B each include a shift register circuit 5a.

The source driver 6 is arranged below the display region DR. The DEMUX circuit 10 is arranged between the source driver 6 and the display region DR. The source driver 6 includes a plurality of output terminals (not illustrated). A plurality of signal output lines (video signal lines) VL are provided within a region between the source driver 6 and the DEMUX circuit 10. The plurality of signal output lines VL are respectively coupled to the plurality of output terminals of the source driver 6. FIG. 1 illustrates the first, second, . . . z-th signal output lines VL as "VL1", "VL2", . . . "VLz".

Figure 2:
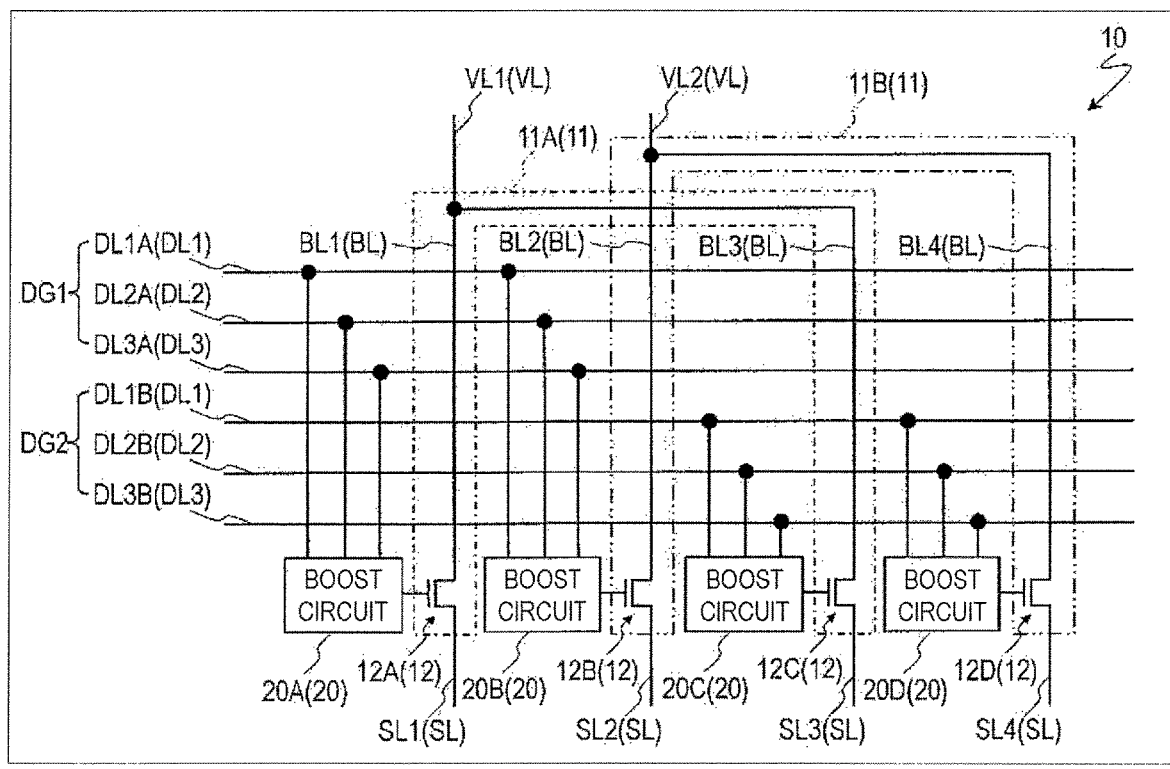
FIG. 2 is a view illustrating a configuration example of a DEMUX circuit 10 included in the active matrix substrate 100.

The DEMUX circuit 10 is configured to distribute a display signal supplied from one of the signal output lines VL to two or more of the source bus lines SL. The DEMUX circuit 10 will be described herein in more detail with reference to FIG. 2. FIG. 2 is a view illustrating a configuration example of the DEMUX circuit 10.

As illustrated in FIG. 2, the DEMUX circuit 10 includes a plurality of unit circuits 11 supported by the substrate 1. The plurality of unit circuits 11 each distribute a display signal from one of the signal output lines VL to an n number of the source bus lines SL, where n is an integer of 2 or greater. FIG. 2 illustrates a case when n=2, i.e., the unit circuits 11 each distribute a display signal from one of the signal output lines VL to two of the source bus lines SL. FIG. 2 illustrates two of the unit circuits 11. One of the two unit circuits 11, i.e., (hereinafter also referred to as a "first unit circuit") 11A, distributes a display signal from a signal output line VL1 to source bus lines SL1 and SL3. Another one of the two unit circuits 11, i.e., (hereinafter also referred to as a "second unit circuit") 11B, distributes a display signal from a signal output line VL2 to source bus lines SL2 and SL4.

The unit circuits 11 each include an n number (two in here) of branch wiring lines BL, and an n number (two in here) of switching TFTs 12.

The two branch wiring lines BL of each of the unit circuits 11 are coupled to one of the signal output lines VL. The two switching TFTs 12 of each of the unit circuits 11 are respectively coupled to the two branch wiring lines BL. The two switching TFTs 12 are configured to separately (independently) on/off-control electrical couplings between the two branch wiring lines BL and the two source bus lines SL. In the embodiment, the two switching TFTs 12 each include an oxide semiconductor layer serving as an active layer (i.e., an oxide semiconductor TFT).

As for the two switching TFTs, i.e., 12A and 12C, of the first unit circuit, i.e., 11A, the switching TFT 12A on/off-controls an electrical coupling between a branch wiring line BL1 and a source bus line SL1, whereas the switching TFT 12C on/off-controls an electrical coupling between a branch wiring line BL3 and the source bus line SL3. A source electrode and a drain electrode of the former, i.e., the switching TFT 12A, are respectively coupled to the branch wiring line BL1 and the source bus line SL1. A source electrode and a drain electrode of the latter, i.e., the switching TFT 12C, are respectively coupled to the branch wiring line BL3 and the source bus line SL3.

As for the two switching TFTs, 12B and 12D, of the second unit circuit, i.e., 11B, the switching TFT 12B on/off-controls an electrical coupling between a branch wiring line BL2 and a source bus line SL2, whereas the switching TFT 12D on/off-controls an electrical coupling between a branch wiring line BL4 and a source bus line SL4. A source electrode and a drain electrode of the former, i.e., the switching TFT 12B, are respectively coupled to the branch wiring line BL2 and the source bus line SL2. A source electrode and a drain electrode of the latter, i.e., the switching TFT 12D, are respectively coupled to the branch wiring line BL4 and the source bus line SL4.

As illustrated in FIG. 2, the DEMUX circuit 10 according to the embodiment further includes a plurality of boost circuits 20 each configured to increase a voltage to be applied to gate electrodes of the n number (two in here) of switching TFTs 12 of each of the unit circuits 11. In the example illustrated in FIG. 2, the switching TFTs 12 are respectively coupled with the boost circuits 20 one by one. Specifically, gate electrodes of the switching TFTs 12A, 12B, 12C, and 12D are respectively coupled to output sides of boost circuits 20A, 20B, 20C, and 20D.

In the example illustrated in FIG. 2, the boost circuits 20 are each driven by a drive signal group to be supplied by a first drive signal line DL1, a second drive signal line DL2, and a third drive signal line DL3. A drive signal to be supplied by the first drive signal line DL1 will hereinafter sometimes be referred to as a "first drive signal". A drive signal to be supplied by the second drive signal line DL2 will hereinafter sometimes be referred to as a "second drive signal". A drive signal to be supplied by the third drive signal line DL3 will hereinafter sometimes be referred to as a "third drive signal". As will be described later in detail, the boost circuits 20 increase voltages to increase drive amplitudes of gate potentials of the switching TFTs 20 in response to amplitudes of the first drive signal, the second drive signal, and the third drive signal. A power source voltage to be supplied by the power source circuit unit 8 is used to generate the first drive signal, the second drive signal, and the third drive signal.

In the example illustrated in FIG. 2, two-system, drive signal line groups DG1 and DG2 are provided. The boost circuits 20A and 20B are to be driven by a first drive signal line DL1A, a second drive signal line DL2A, and a third drive signal line DL3A in one of the drive signal line groups DG1 and DG2, i.e., DG1. The boost circuits 20C and 20D are driven by a first drive signal line DL1B, a second drive signal line DL2B, and a third drive signal line DL3B in another one of the drive signal line groups DG1 and DG2, i.e., DG2.

As described above, in the active matrix substrate 100 according to the embodiment, the DEMUX circuit 10 includes the boost circuits 20 configured to increase a voltage to be applied to the gate electrodes of the switching TFTs 12. Therefore, an effective drive voltage for the DEMUX circuit can be increased. Therefore, even a drive signal having a relatively smaller amplitude can drive the DEMUX circuit, reducing power consumption due to charging and discharging of drive signals. The boost circuits 20 can increase voltages (drive voltages) to be applied to the gate electrodes of the switching TFTs 12, lowering resistance (on resistance) of the switching TFTs 12 when selected to improve charging performance. A drive voltage can further be increased, contributing to a reduction in size of the switching TFTs 12. A layout size of the DEMUX circuit 10 can be therefore reduced, narrowing the peripheral region FR (frame). As described above, with the embodiment of the disclosure, a drive power for an active matrix substrate including a DEMUX circuit can be reduced, as well as a narrower frame can be achieved.

Figure 3:
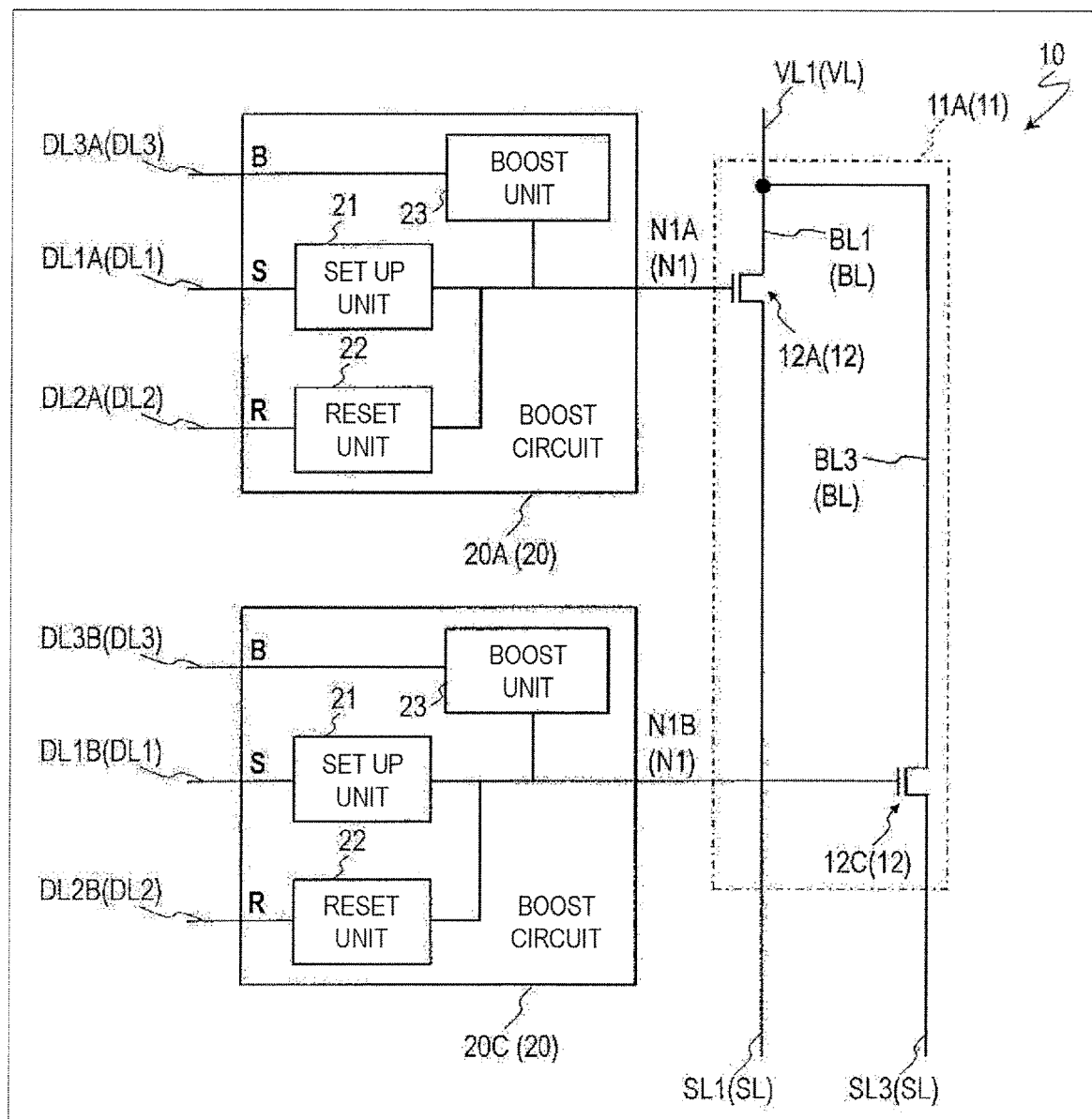
FIG. 3 is a view illustrating a configuration example of boost circuits 20 included in the DEMUX circuit 10.

Next, a specific configuration of each of the boost circuits 20 will be described with reference to FIG. 3. FIG. 3 is a view illustrating a configuration example of the boost circuits 20.

In the example illustrated in FIG. 3, the boost circuits 20 each include a set up unit 21, a reset unit 22, and a boost unit 23. The set up unit 21, the reset unit 22, and the boost unit 23 are coupled to a node N1 coupled to the gate electrode of each of the switching TFTs 12. The set up unit 21 is coupled to the first drive signal line DL1. The reset unit 22 is coupled to the second drive signal line DL2. The boost unit 23 is coupled to the third drive signal line DL3.

The set up unit 21 is to be driven by a first drive signal (set signal) S to be supplied from the first drive signal line DL1 to perform an operation of pre-charging the node N1 (hereinafter referred to as a "set operation"). The boost unit 23 is to be driven by a third drive signal (boost signal) B to be supplied from the third drive signal line DL3 to perform an operation of increasing a potential of the node N1 being pre-charged by the set up unit 21 (hereinafter referred to as a "boost operation"). The reset unit 22 is to be driven by a second drive signal (reset signal) R to be supplied from the second drive signal line DL2 to perform an operation of resetting the potential of the node N1 (hereinafter referred to as a "reset operation").

Figure 4:
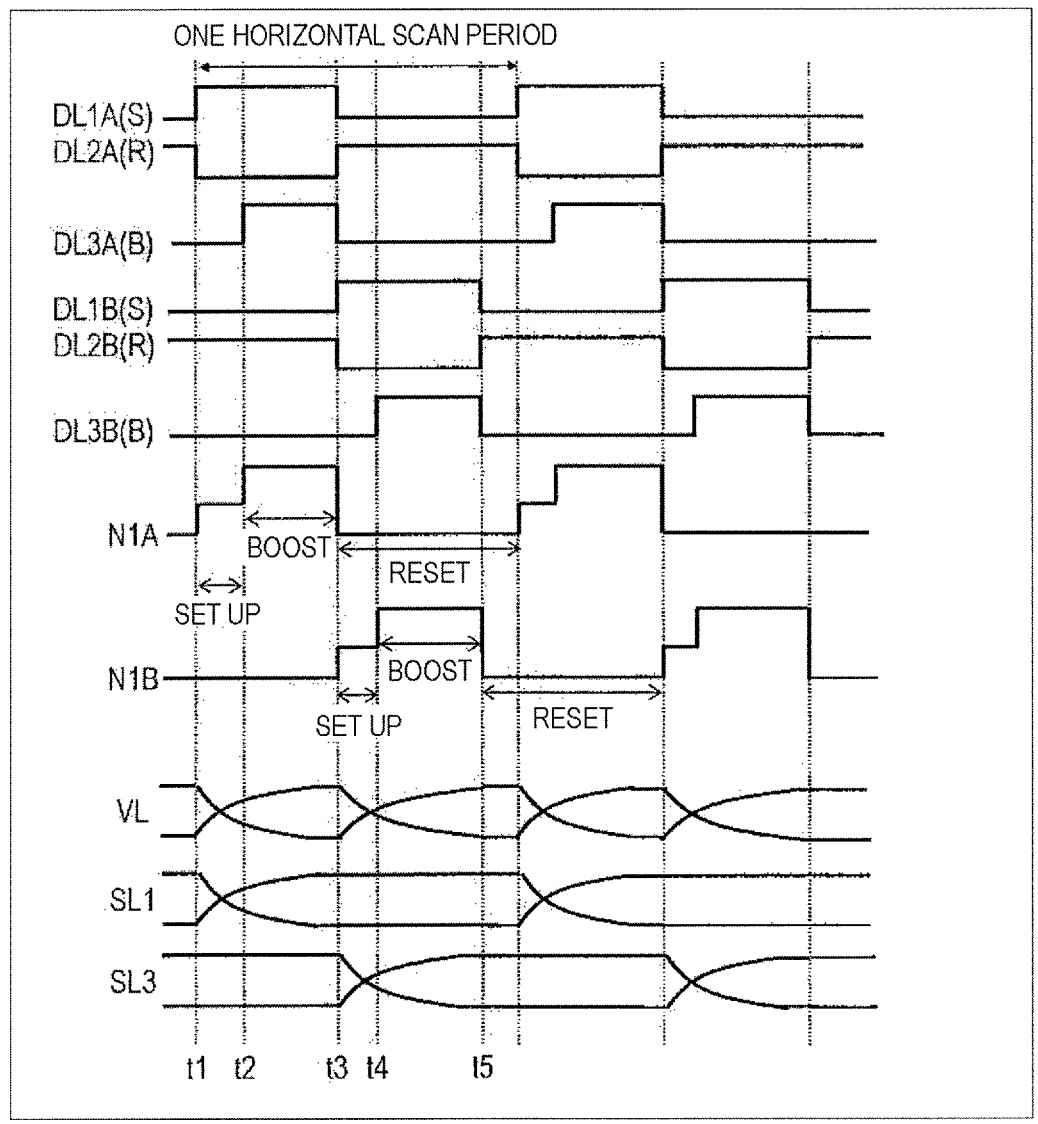
FIG. 4 is a timing chart illustrating operations of the DEMUX circuit 10.

Operations of each of the boost circuits 20 (the DEMUX circuit 10) will be described herein with further reference to FIG. 4. FIG. 4 is a timing chart illustrating operations of the DEMUX circuit 10. FIG. 4 illustrates potentials of the first drive signal lines DL1A and DL1B, the second drive signal lines DL2A and DL2B, the third drive signal lines DL3A and DL3B, nodes N1A and N1B, each of the signal output lines VL, and the source bus lines SL1 and SL3. The potentials of the first drive signal lines DL1A and DL1B each represent a signal potential of the set signal S. The potentials of the second drive signal lines DL2A and DL2B each represent a signal potential of the reset signal R. The potentials of the third drive signal lines DL3A and DL3B each represent a signal potential of the boost signal B.

First, at a time t1, the potential of the first drive signal line DL1A reaches a high level, whereas the potential of the second drive signal line DL2A reaches a low level. A first drive signal enters as the set signal S into the set up unit 21 of the boost circuit 20A. The node N1A coupled to the gate electrode of the switching TFT 12A is thus pre-charged (set operation). At the timing, the potential of each of the signal output lines VL (i.e., a display signal) changes to a writing voltage level. Charging of the selected source bus line SL1 starts.

Next, at a time t2, the potential of the third drive signal line DL3A reaches the high level. A third drive signal enters as the boost signal B into the boost unit 23 of the boost circuit 20A. The potential of the node N1A thus increases (boost operation). After the potential of the node N1A has increased, the source bus line SL1 is fully charged via the switching TFT 20A.

Next, at a time t3, the potential of the first drive signal line DL1A reaches the low level, the potential of the second drive signal line DL2A reaches the high level, and the potential of the third drive signal line DL3A reaches the low level. A second drive signal enters as the reset signal R into the reset unit 22 of the boost circuit 20A. The potential of the node N1A is thus reset (reset operation). At this time, the switching TFT 20A attains an off state. A potential of the source bus line SL1 is thus determined.

At the time t3, the potential of the first drive signal line DL1B reaches the high level, whereas the potential of the second drive signal line DL2B reaches the low level. A first drive signal enters as the set signal S into the set up unit 21 of the boost circuit 20B. The node N1B coupled to the gate electrode of the switching TFT 12B is thus pre-charged (set operation). At the timing, the potential of each of the signal output lines VL (i.e., a display signal) changes to the writing voltage level. Charging of the selected source bus line SL3 starts.

Next, at a time t4, the potential of the third drive signal line DL3B reaches the high level. A third drive signal enters as the boost signal B into the boost unit 23 of the boost circuit 20B. The potential of the node N1B thus increases (boost operation). After the potential of the node N1B has increased, the source bus line SL3 is fully charged via the switching TFT 20B.

After that, at a time t5, the potential of the first drive signal line DL1B reaches the low level, the potential of the second drive signal line DL2B reaches the high level, and the potential of the third drive signal line DL3B reaches the low level. A second drive signal enters as the reset signal R into the reset unit 22 of the boost circuit 20B. The potential of the node N1B is thus reset (reset operation). At this time, the switching TFT 12B attains the off state. A potential of the source bus line SL3 is thus determined.

After writing to the source bus lines, SL1 and SL3, has been completed (a potential has been determined), a gate signal supplied from each of the gate bus lines GL reaches an off level. A display voltage has been written to each of the pixels PIX.

Figure 5:
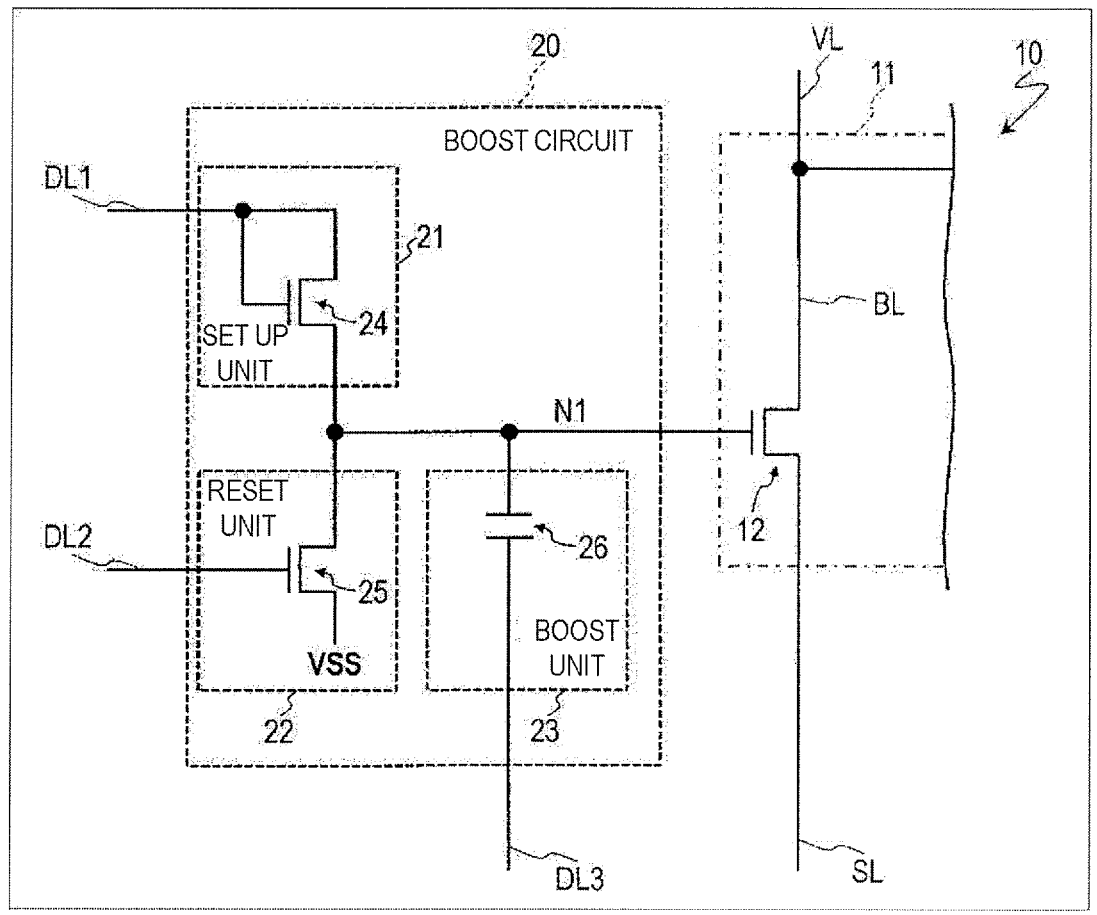
FIG. 5 is a view illustrating a specific configuration example of a set up unit 21, a reset unit 22, and a boost unit 23 included in each of the boost circuits 20.

A more specific configuration of each of the boost circuits 20 will be described with reference to FIG. 5. FIG. 5 is a view illustrating a specific configuration example of the set up unit 21, the reset unit 22, and the boost unit 23 of each of the boost circuits 20.

In the example illustrated in FIG. 5, the set up unit 21 includes a TFT (hereinafter referred to as a "setting TFT") 24. The setting TFT 24 is diode-coupled. A gate electrode and a drain electrode of the setting TFT 24 are coupled to the first drive signal line DL1. A source electrode of the setting TFT 24 is coupled to the node N1.

The reset unit 22 includes a TFT (hereinafter referred to as a "resetting TFT") 25. A gate electrode of the resetting TFT 25 is coupled to the second drive signal line DL2. The resetting TFT 25 is configured to pull down the potential of the node N1. Specifically, a source electrode of the resetting TFT 25 is configured to accept a constant potential (a negative power source potential VSS). A drain electrode of the resetting TFT 25 is coupled to the node N1.

The boost unit 23 includes a capacitance element (hereinafter referred to as a "boosting capacitance element") 26.

The boosting capacitance element 26 includes an electrode coupled to the third drive signal line DL3 (first capacitance electrode), and an electrode coupled to the node N1 (second capacitance electrode).

Before describing operations of each of the boost circuits 20 illustrated in FIG. 5, here will describe the power source circuit unit 8 included in the active matrix substrate 100 according to the embodiment, and amplitudes of the set signal S, the reset signal R, and the boost signal B.

As illustrated in FIG. 1, the power source circuit unit 8 according to the embodiment includes a first power source circuit 8*a* and a second power source circuit 8*b*. The first power source circuit 8*a* can supply (generate) a first high level power source voltage VDH1 and a first low level power source voltage VDL1. The second power source circuit 8*b* can supply (generate) a second high level power source voltage VDH2 and a second low level power source voltage VDL2. The first high level power source voltage VDH1 and the second high level power source voltage VDH2 are different from each other. The first low level power source voltage VDL1 and the second low level power source voltage VDL2 are different from each other. That is, the power source circuit unit 8 includes two-system power source circuits (the first power source circuit 8*a* and the second power source circuit 8*b*). The two-system power source circuits can respectively supply two kinds (that are different from each other in magnitude) of power source voltages as a high level side power source voltage and a low level side power source voltage.

In the embodiment, an amplitude of the set signal (first drive signal) S and an amplitude of the reset signal (second drive signal) R are identical to each other. An amplitude of the boost signal (third drive signal) B differs from each of the amplitudes of the set signal S and the reset signal R. Specifically, the amplitude of the boost signal B is greater than each of the amplitudes of the set signal S and the reset signal R. That is, the amplitudes of the set signal S and the reset signal R are each smaller than the amplitude of the boost signal B.

Here, high level potentials of the set signal S and the reset signal R each correspond to the first high level power source voltage VDH1, whereas low level potentials of the set signal S and the reset signal R each correspond to the first low level power source voltage VDL1. A high level potential of the boost signal B corresponds to the second high level power source voltage VDH2, whereas a low level potential of the boost signal B corresponds to the second low level power source voltage VDL2. As described above, the amplitudes of the set signal S and the reset signal R are each smaller than the amplitude of the boost signal B. Therefore, a relationship of (VDH1−VDL1)<(VDH2−VDL2) is satisfied.

Figure 6:
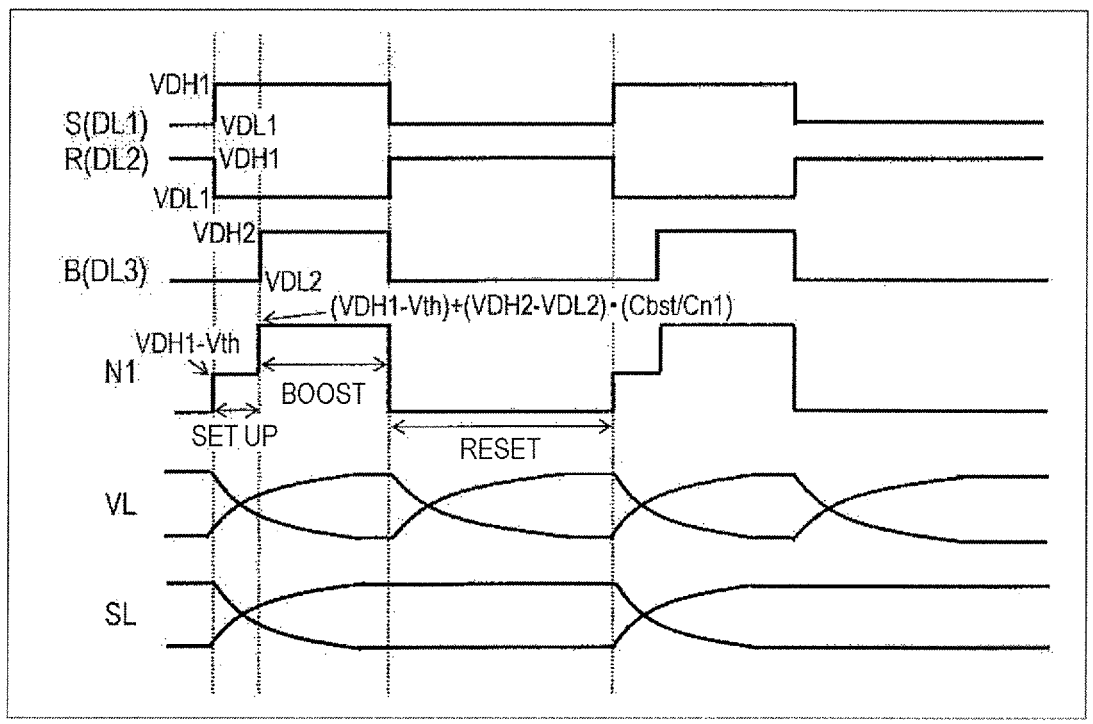
FIG. 6 is a timing chart illustrating operations of each of the boost circuits 20.

Operations of each of the boost circuits 20 illustrated in FIG. 5 will be described with reference to FIG. 6. FIG. 6 is a timing chart illustrating operations of each of the boost circuits 20. FIG. 6 illustrates potentials of the set signal S (the first drive signal line DL1), the reset signal R (the second drive signal line DL2), the boost signal B (the third drive signal line DL3), the node N1, each of the signal output lines VL, and each of the source bus lines SL.

First, as the set signal S changes from the low level potential (VDL1) to the high level potential (VDH1), the setting TFT 24 attains the on state, and the node N1 is pre-charged (set operation). At this time, since the setting TFT 24 is diode-coupled, and when Vth is a threshold voltage of the setting TFT 24, the node N1 is pre-charged to a potential of (VDH1−Vth).

Next, as the boost signal B changes from the low level potential (VDL2) to the high level potential (VDH2), the potential of the node N1 increases. A degree of increase differs depending on a ratio of a capacitance value Cbst of the boosting capacitance element 26 with respect to a total of a load capacitance (total load capacitance) Cn1 of the node N1. Specifically, a potential equivalent to an amount of increase can be obtained by multiplying the amplitude of the boost signal B (=VDH2−VDL2) with (Cbst/Cn1). For example, when the total load capacitance Cn1 of the node N1 is 0.2 pF, and the capacitance value Cbst of the boosting capacitance element 26 is 0.1 pF, the potential of the node N1 increases from (VDH1−Vth) to {(VDH1−Vth)+(VDH2−VDL2)×(0.1/0.2)}.

For example, when VDH1=16 V, VDL1=−7 V, VDH2=14 V, VDL2=−14 V, and Vth=2 V, the node N1 increases to 28 V.

In the active matrix substrate 100 according to the embodiment, as described above, the amplitude of the boost signal B differs from each of the amplitudes of the set signal S and the reset signal R (specifically, the amplitudes of the set signal S and the reset signal R are each smaller than the amplitude of the boost signal B). Further low power consumption can thus be achieved. The reasons will be described from hereon.

An ordinary oxide semiconductor TFT is low in mobility than a poly-crystal silicon TFT, and, for the purpose of compensation, is often driven at a voltage higher than a voltage for driving a poly-crystal silicon TFT. For example, a low-temperature polysilicon (LTPS) TFT is driven at a signal voltage having a high level potential of 9.5 V and a low level potential of −7 V (amplitude is 16.5 V). An oxide semiconductor TFT including an In—Ga—Zn—O based semiconductor layer is driven at a signal voltage having a high level potential of 16 V and a low level potential of −12 V (amplitude is 28 V). An ordinary driver to be COG-mounted includes a one-system power source circuit (i.e., one kind of a power source voltage is supplied as high level side and low level side power source voltages). Therefore, amplitudes of all drive voltages should conform to a signal requiring a highest voltage.

Figure 7:
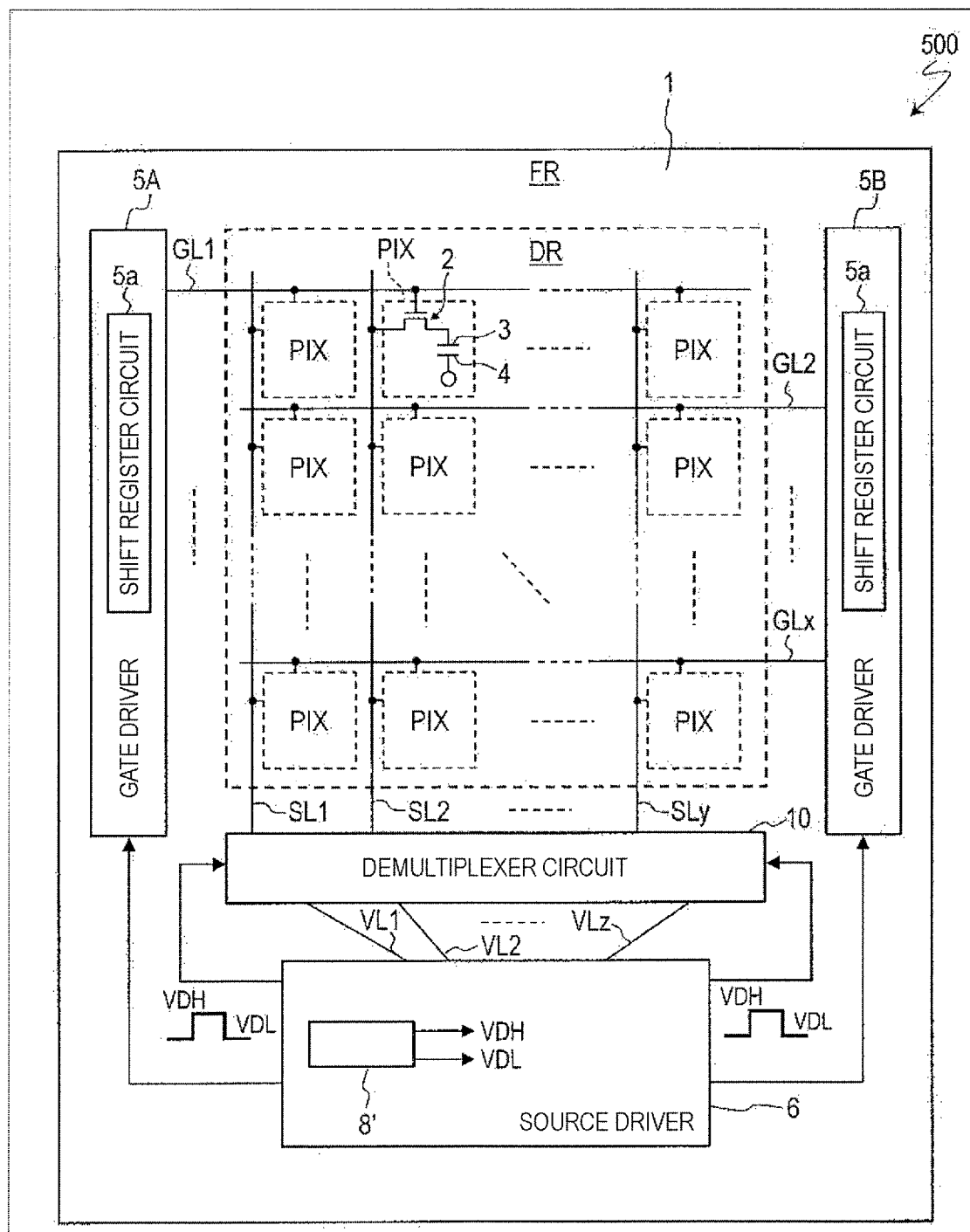
FIG. 7 is a view illustrating a plane structure of an active matrix substrate 500 according to a comparative example.

Advantages of the active matrix substrate 100 according to the embodiment will be described with comparison to an active matrix substrate 500 according to a comparative example illustrated in FIG. 7. The active matrix substrate 500 according to the comparative example differs from the active matrix substrate 100 according to the embodiment in the sense that a source driver 6 being COG-mounted includes a power source circuit 8' serving as a power source circuit unit. The power source circuit 8' is configured to supply a high level power source voltage VDH and a low level power source voltage VDL. Therefore, in the active matrix substrate 500 according to the comparative example, a set signal S, a reset signal R, and a boost signal B are identical to each other in amplitude (a high level potential is VDH and a low level potential is VDL).

In the active matrix substrate 500 according to the comparative example, when VDH=16 V, VDL=−12 V, Vth=2 V, Cbst=0.1 pF, and Cn1=0.2 pF, for example, as illustrated in FIG. 8A, a potential of a node N1 after a boost operation is (16−2)+{16−(−12)}×(0.1/0.2)=28 V.

In the active matrix substrate 100 according to the embodiment, when VDH1=16 V, VDL1=−7 V, VDH2=14 V, VDL2=−14 V, Vth=2 V, Cbst=0.1 pF, and Cn1=0.2 pF, for example, as illustrated in FIG. 8B, the potential of the node N1 after a boost operation is (16−2)+{14−(−14)}×(0.1/0.2)=28 V. Therefore, the potential can increase to the potential in the active matrix substrate 500 according to the comparative example.

On the other hand, the amplitude of the set signal S (and the reset signal R) is 28 V in the comparative example, whereas 23 V in the embodiment. Frequency f, load capacitance C, and voltage V can be used to express power consumption P as P=fCV². In the illustrated example, the active matrix substrate 100 according to the embodiment can reduce power consumption approximately 30% from the active matrix substrate 500 according to the comparative example.

As described above, by differentiating the amplitude of the boost signal B from each of the amplitudes of the set signal S and the reset signal R (specifically, by reducing the amplitudes of the set signal S and the reset signal R each smaller than the amplitude of the boost signal B), further low power consumption can be achieved, while keeping drive power (performance).

Note that the high level potential and the low level potential of the set signal S and the reset signal R (the first high level power source voltage VDH1 and the first low level power source voltage VDL1), and the high level potential and the low level potential of the boost signal B (the second high level power source voltage VDH2 and the second low level power source voltage VDL2) are obviously not limited to the illustrated values. However, for the low level potential VDL1 of the set signal S and the reset signal R, the switching TFTs 12 should not be selected. Therefore, a relationship of VDL1−Vsl−Vthsw<0 may be satisfied, where Vthsw is a threshold voltage of each of the switching TFTs 12, and Vsl is a low level potential of the display signal.

Figure 9:
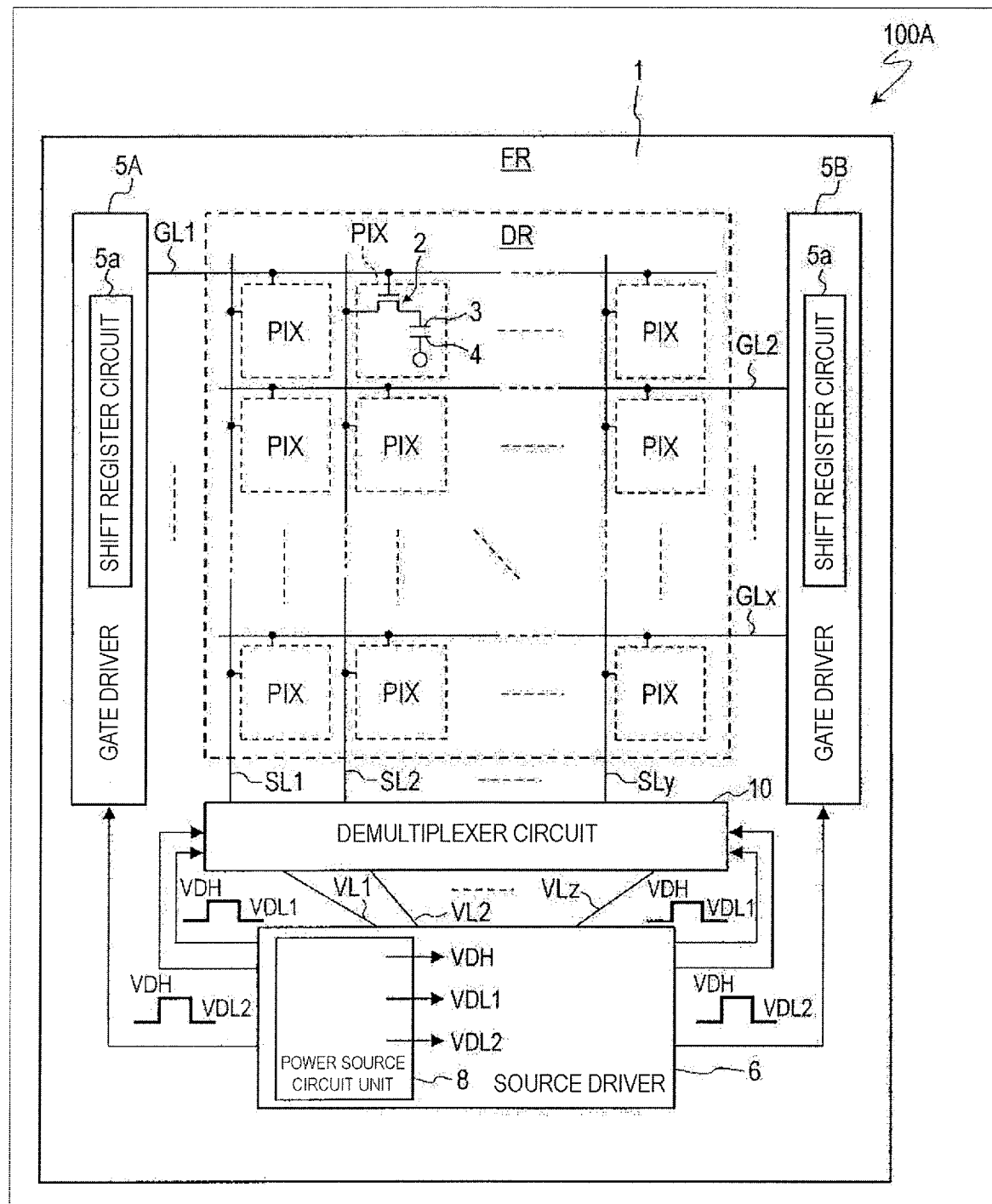
FIG. 9 is a schematic view illustrating an example of a plane structure of an active matrix substrate 100A according to a modification example to a first embodiment.

FIG. 9 illustrates an active matrix substrate 100A according to a modification example of the embodiment. In the active matrix substrate 100A illustrated in FIG. 9, high level potentials of a set signal S and a reset signal R are each identical to a high level potential of a boost signal B. Low level potentials of the set signal S and the reset signal R are each higher than a low level potential of the boost signal B. Therefore, a power source circuit unit 8 of the active matrix substrate 100A supplies a high level power source voltage VDH corresponding to the high level potentials of the set signal S, the reset signal R, and the boost signal B, a first low level power source voltage VDL1 corresponding to the low level potentials of the set signal S and the reset signal R, and a second low level power source voltage VDL2 corresponding to the low level potential of the boost signal B (where VDL1>VDL2).

As described above, in the active matrix substrate 500 according to the comparative example, when VDH=16 V, VDL=−12 V, Vth=2 V, Cbst=0.1 pF, and Cn1=0.2 pF, as illustrated in FIG. 8A, a potential of the node N1 after a boost operation is 28 V.

Figure 10:
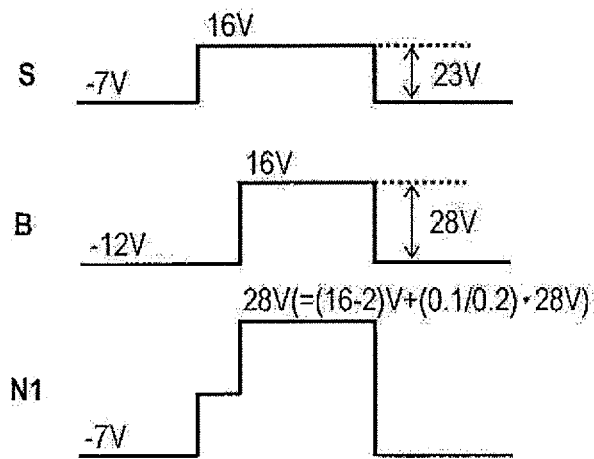
FIG. 10 is a view illustrating a relationship between amplitudes of a set signal S and a boost signal B and a potential of a node N1 in the active matrix substrate 100A according to the modification example to the first embodiment.

In the active matrix substrate 100A illustrated in FIG. 9, when VDH=16 V, VDL1=−7 V, VDL2=−12 V, Vth=2 V, Cbst=0.1 pF, and Cn1=0.2 pF, for example, as illustrated in FIG. 10, the potential of the node N1 after a boost operation is (16−2)+{16−(−12)}×(0.1/0.2)=28 V. Therefore, the potential can increase to the potential in the active matrix substrate 500 according to the comparative example.

On the other hand, the amplitude of the set signal S (and the reset signal R) is 28 V in the active matrix substrate 500 according to the comparative example, whereas 23 V in the active matrix substrate 100A. Therefore, power consumption can be reduced by approximately 30%. As described above, even in the active matrix substrate 100A according to the modification example, further low power consumption can be achieved, while keeping drive power (performance). In the active matrix substrate 100A according to the modification example, the power source circuit unit 8 requires two-system, low level side power source voltages, and an only one-system, high level side power source voltage. Therefore, the configuration of the power source circuit unit 8 can be simplified.

Figure 11:
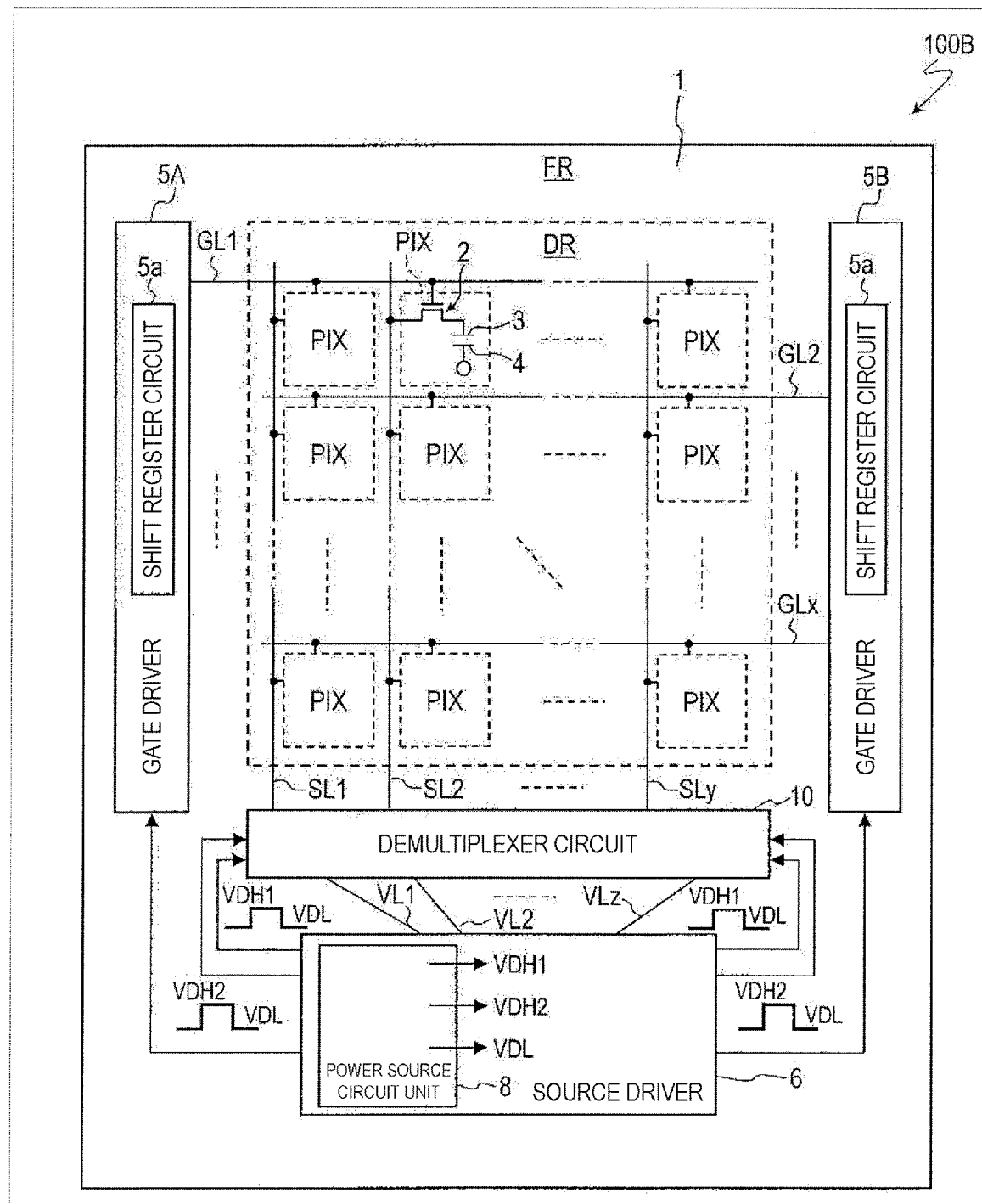
FIG. 11 is a view illustrating a relationship between amplitudes of a set signal S and a boost signal B and a potential of a node N1 in an active matrix substrate 100B according to another modification example to the first embodiment.

FIG. 11 illustrates an active matrix substrate 100B according to another modification example of the embodiment. In the active matrix substrate 100B illustrated in FIG. 11, low level potentials of a set signal S and a reset signal R are each identical to a low level potential of a boost signal B. High level potentials of the set signal S and the reset signal R are each lower than a high level potential of the boost signal B. Therefore, a power source circuit unit 8 of the active matrix substrate 100B supplies a low level power source voltage VDL corresponding to the low level potentials of the set signal S, the reset signal R, and the boost signal B, a first high level power source voltage VDH1 corresponding to the high level potentials of the set signal S and the reset signal R, and a second high level power source voltage VDH2 corresponding to the high level potential of the boost signal B (where VDH1<VDH2).

Even in the active matrix substrate 100B according to the other modification example, further low power consumption can be achieved, while keeping drive power (performance). In the active matrix substrate 100B, the power source circuit unit 8 requires two-system, high level side power source voltages, and an only one-system, low level side power source voltage. Therefore, the configuration of the power source circuit unit 8 can be simplified.

Here, the examples where the power source circuit unit 8 is incorporated in the source driver 6 being COG-mounted have been described. However, the examples do not intend to limit embodiments of the disclosure.

Figure 33:
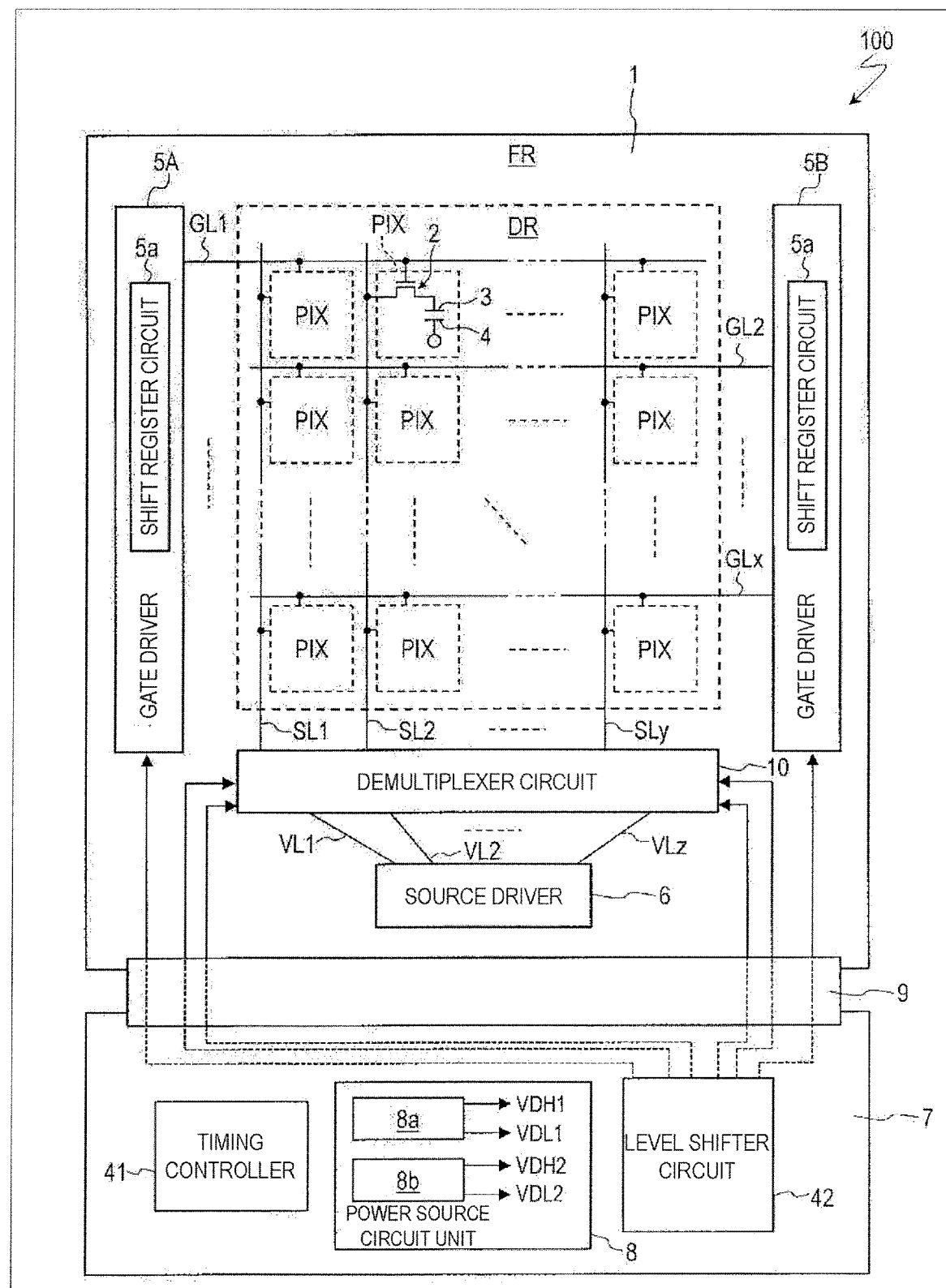
FIG. 33 is a view illustrating another structure example of the active matrix substrate 100 according to the first embodiment.

FIG. 33 illustrates another configuration example of the power source circuit unit 8. In the example illustrated in FIG. 33, a substrate 1 is coupled with a printed circuit board (PCB) 7 via a flexible printed circuit board (FPC) 9. On the PCB 7, a power source circuit unit 8, a timing controller 41, and a level shifter circuit 42 are provided.

Similar to the power source circuit unit 8 illustrated in FIG. 1, the power source circuit unit 8 includes a first power source circuit 8a configured to supply (generate) a first high level power source voltage VDH1 and a first low level power source voltage VDL1, and a second power source circuit 8b configured to supply (generate) a second high level power source voltage VDH2 and a second low level power source voltage VDL2. In here, the power source circuit unit 8 is a power source IC.

The timing controller 41 is configured to generate various timing pulses necessary for driving the active matrix substrate 100. The level shifter circuit 42 is configured to change (i.e., control) a potential level of an input signal.

Liquid crystal televisions and PC displays are often each arranged with a power source IC on a panel exterior, and are controlled with a timing controller. Therefore, the configuration illustrated in FIG. 33 can be preferably used. A power source voltage generated in the power source circuit unit 8 is controlled by the level shifter circuit 42, and is output to the substrate 1.

Second Embodiment

Figure 12:
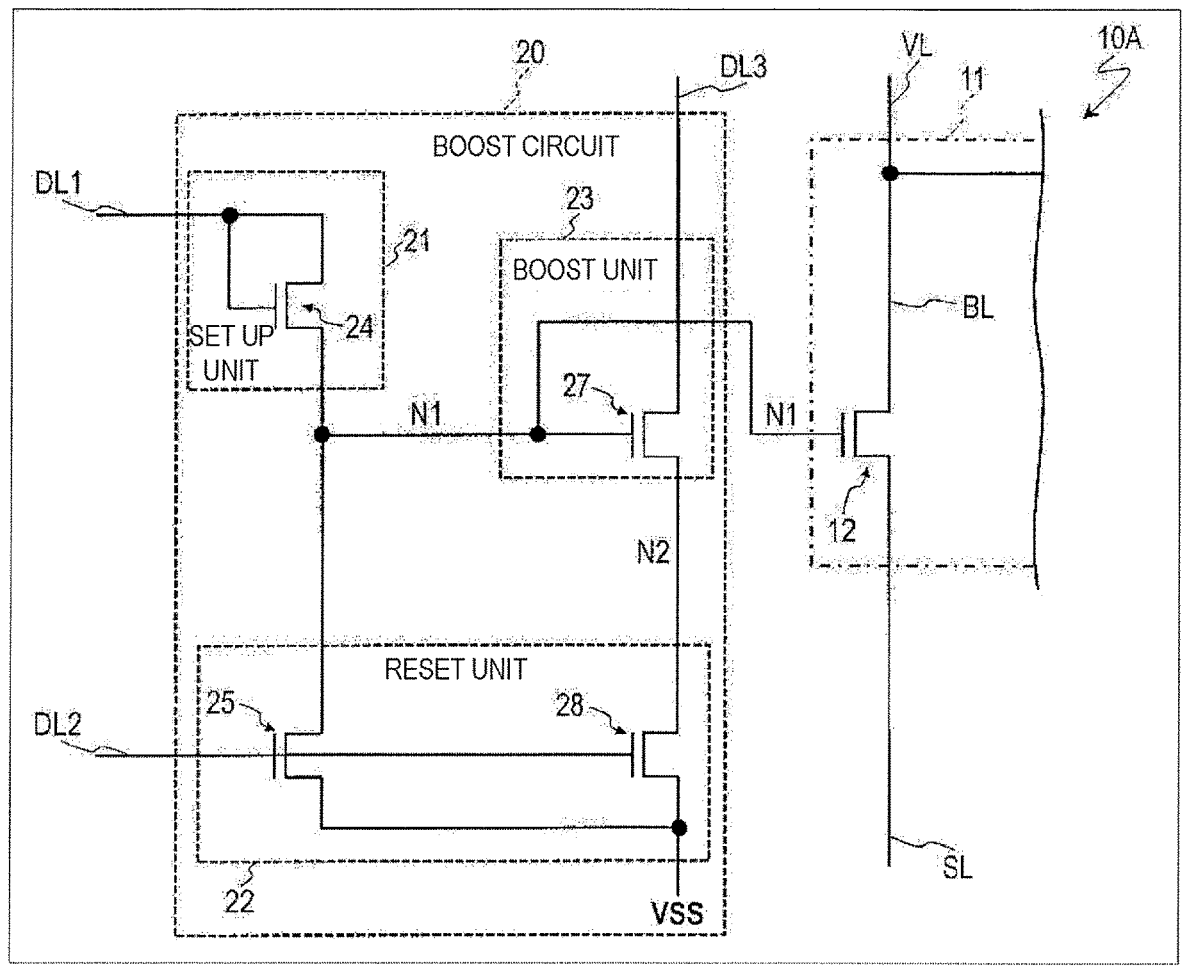
FIG. 12 is a view illustrating a configuration of a DEMUX circuit 10A included in an active matrix substrate according to a second embodiment.

An active matrix substrate according to the embodiment will be described herein with reference to FIG. 12. FIG. 12 is a view illustrating a configuration of a DEMUX circuit 10A included in the active matrix substrate according to the embodiment.

In the DEMUX circuit 10 illustrated in FIG. 5, the boost unit 23 of each of the boost circuits 20 includes the boosting capacitance element 26. On the other hand, in the DEMUX circuit 10A according to the embodiment, as illustrated in FIG. 12, a boost unit 23 includes a TFT (hereinafter referred to as a "boosting TFT") 27. A gate electrode of the boosting TFT 27 is coupled to a node N1. A drain electrode of the boosting TFT 27 is coupled to a third drive signal line DL3. A source electrode of the boosting TFT 27 is coupled to a node N2 that differs from the node N1.

In the DEMUX circuit 10 illustrated in FIG. 5, the reset unit 22 of each of the boost circuits 20 includes the resetting TFT 25 only. On the other hand, in the DEMUX circuit 10A according to the embodiment, as illustrated in FIG. 12, a reset unit 22 includes two resetting TFTs 25 and 28 configured to pull down a potential of the node N1.

A gate electrode of either of the resetting TFTs 25 and 28, i.e., (first resetting TFT) 25, is coupled to a second drive signal line DL2. A source electrode of the first resetting TFT 25 is configured to accept a constant potential (a negative power source potential VSS). A drain electrode of the first resetting TFT 25 is coupled to the node N1.

A gate electrode of another one of the resetting TFTs 25 and 28, i.e., (second resetting TFT) 28, is coupled to the second drive signal line DL2. A source electrode of the second resetting TFT 28 is configured to accept the constant potential (the negative power source potential VSS). A drain electrode of the second resetting TFT 28 is coupled to the node N2 (i.e., coupled to the source electrode of the boosting TFT 27 via the node N2).

In the embodiment, the boost unit 23 includes the boosting TFT 27, instead of the boosting capacitance element 26, reducing a signal load. Therefore, further low power consumption and prompt operation can be achieved. Even when the boost unit 23 includes the boosting TFT 27, similar to a case where the boost unit 23 includes the boosting capacitance element 26, each of boost circuits 20 can be driven with drive signals behaving as illustrated in the timing chart in FIG. 4.

When the boost unit 23 includes the boosting TFT 27, a degree of increase by each of the boost circuits 20 is determined in accordance with a ratio of a capacitance value Ctft_on of the boosting TFT 27 being in the on state with respect to a total load capacitance Cn1 of the node N1. Therefore, when the capacitance value Ctft_on is identical to a capacitance value Cbst of the boosting capacitance element 26, a degree of increase is identical to the degree of increase when the boost unit 23 includes the boosting capacitance element 26.

Figure 13:
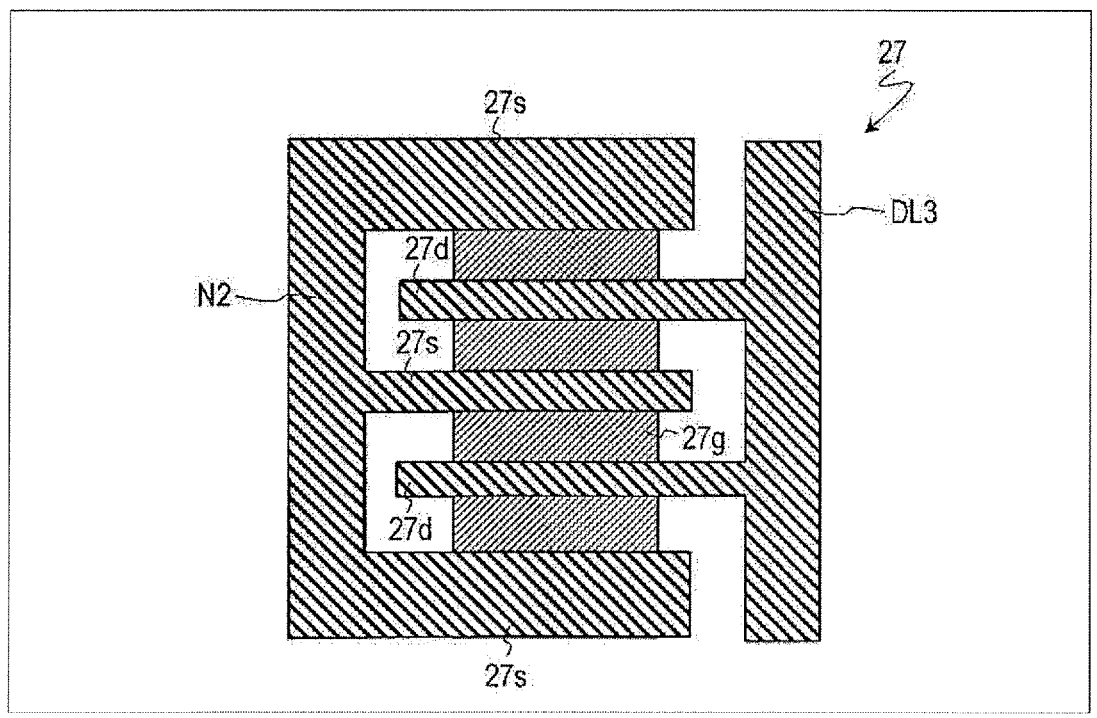
FIG. 13 is a plan view illustrating an electrode layout example of a boosting TFT 27 included in each of boost circuits 20 in the DEMUX circuit 10A.

In terms of increasing a voltage at the node N1 with high efficacy, the boosting TFT 27 may have an electrode layout that reduces as much as possible a capacitance hanging down from the third drive signal line DL3. FIG. 13 illustrates the electrode layout (shapes and arrangements of gate electrodes 27g, source electrodes 27s, and drain electrodes 27d) of the boosting TFT 27.

In the example illustrated in FIG. 13, the source electrodes 27s extend and branch from a wiring line (applied with a reference sign "N2", identically to the node N2) coupled to the node N2. The drain electrodes 27d extend and branch from the third drive signal line DL3. The gate electrodes 27g are arranged so as not to overlap with the third drive signal line DL3 itself. Therefore, a capacitance hanging down from the third drive signal line DL3 can be reduced.

Third Embodiment

Figure 14:
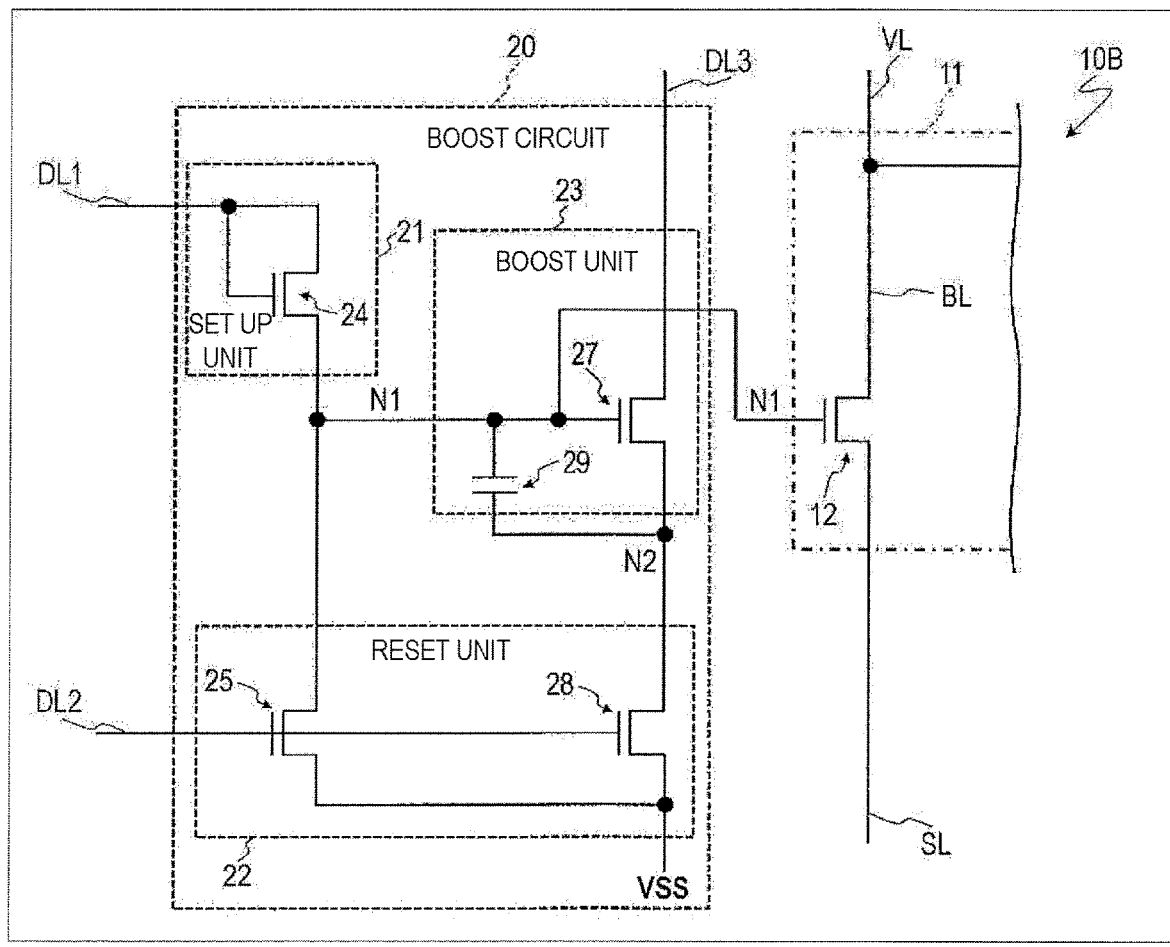
FIG. 14 is a view illustrating a configuration of a DEMUX circuit 10B included in an active matrix substrate according to a third embodiment.

An active matrix substrate according to the embodiment will be described with reference to FIG. 14. FIG. 14 is a view illustrating a configuration of a DEMUX circuit 10B included in the active matrix substrate according to the embodiment.

In the DEMUX circuit 10A illustrated in FIG. 12, the boost unit 23 includes the boosting TFT 27. On the other hand, in the DEMUX circuit 10B according to the embodiment, as illustrated in FIG. 14, a boost unit 23 includes a capacitance element (boosting capacitance element) 29 in addition to a boosting TFT 27. The boosting capacitance element 29 includes an electrode (first capacitance electrode) coupled to a node N1, and an electrode (second capacitance electrode) coupled to a node N2.

As illustrated in the embodiment, with the boost unit 23 including the boosting capacitance element 29 in addition to the boosting TFT 27, a potential of the node N1 can further highly effectively be increased. An effect of preventing oscillation can also be achieved.

Fourth Embodiment

Figure 15:
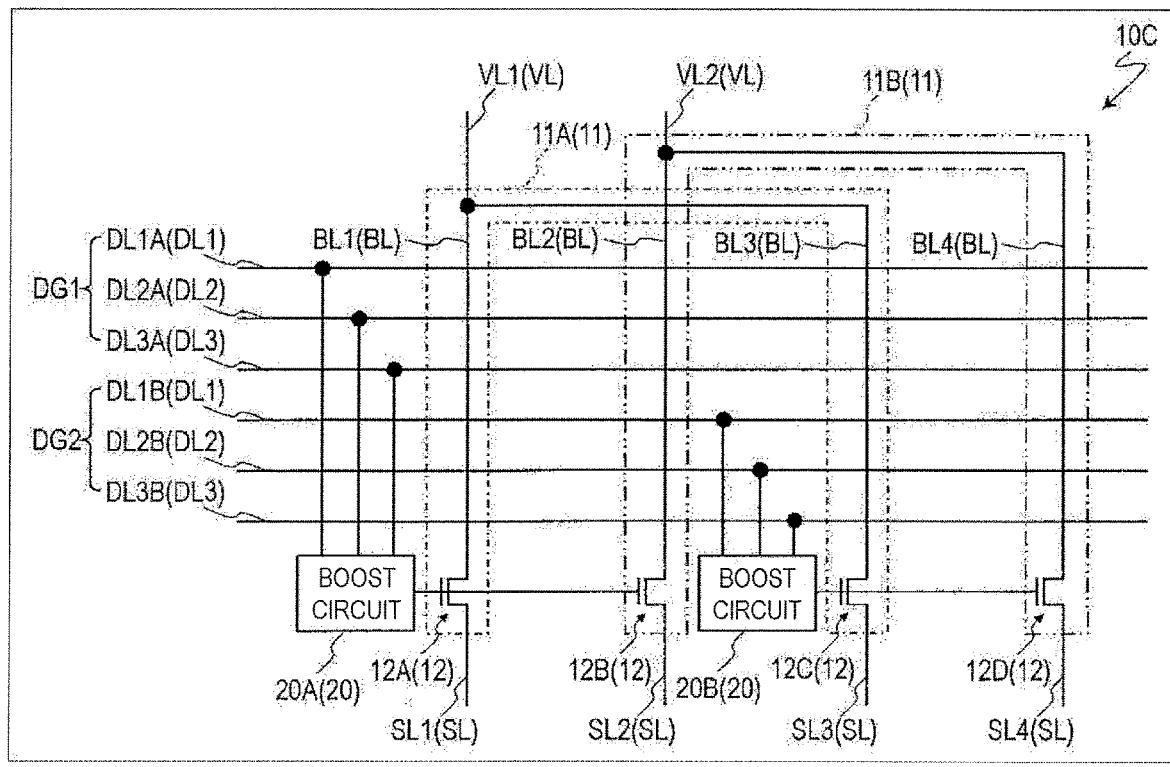
FIG. 15 is a view illustrating a configuration of a DEMUX circuit 10C included in an active matrix substrate according to a fourth embodiment.

An active matrix substrate according to the embodiment will be described with reference to FIG. 15. FIG. 15 is a view illustrating a configuration of a DEMUX circuit 10C included in the active matrix substrate according to the embodiment.

In the DEMUX circuit 10 illustrated in FIG. 2, the switching TFTs 12 are respectively coupled with the boost circuits 20 one by one. On the other hand, in the DEMUX circuit 10C according to the embodiment, as illustrated in FIG. 15, two of switching TFTs 12 are coupled with one of boost circuits 20. A more specific description follows.

The two switching TFTs 12 included in a first unit circuit 11A are a first switching TFT 12A and a second switching TFT 12C configured to attain the on state at timings different from each other within one horizontal scan period. Similarly, the two switching TFTs 12 included in a second unit circuit 11B are a first switching TFT 12B and a second switching TFT 12D configured to attain the on state at timings different from each other within one horizontal scan period.

Either of two boost circuits 20A and 20B illustrated in FIG. 15, i.e., 20A, is commonly coupled to the first switching TFT 12A of the first unit circuit 11A and the first switching TFT 12B of the second unit circuit 11B. Another one of the two boost circuits 20A and 20B, i.e., 20B, is commonly coupled to the second switching TFT 12C of the first unit circuit 11A and the second switching TFT 12D of the second unit circuit 11B.

As described above, in the embodiment, the two switching TFTs 12 to be selected simultaneously share one of the boost circuits 20. Therefore, a number of circuit elements can be reduced. With a reduced number of circuit elements, a load can be reduced. As a result, further low power consumption can be achieved. Further, with the reduced number of circuit elements, a circuit area can be reduced, reducing a layout size. As a result, a further narrower frame can be achieved.

Fifth Embodiment

Figure 16:
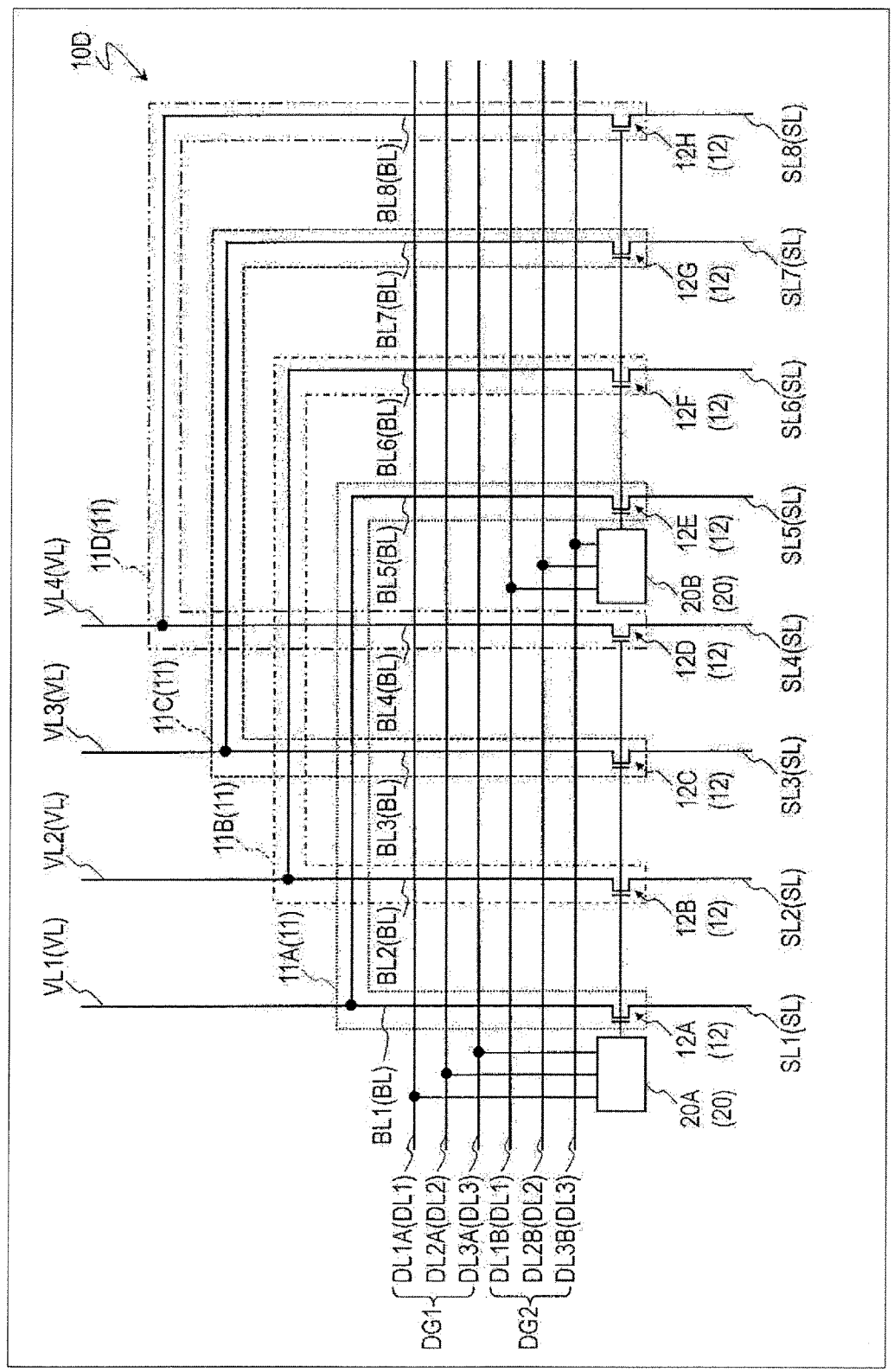
FIG. 16 is a view illustrating a configuration of a DEMUX circuit 10D included in an active matrix substrate according to a fifth embodiment.

In the DEMUX circuit 10C according to the fourth embodiment, the two of the switching TFTs 12 share the one of the boost circuits 20. However, three or more switching TFTs 12 may share one of boost circuits 20. An active matrix substrate according to the embodiment will be described with reference to FIG. 16. FIG. 16 is a view illustrating a configuration of a DEMUX circuit 10D included in the active matrix substrate according to the embodiment.

FIG. 16 illustrates four unit circuits (hereinafter respectively referred to as a "first unit circuit", a "second unit circuit", a "third unit circuit", and a "fourth unit circuit") 11A, 11B, 11C, and 11D, among a plurality of unit circuits 11 included in the DEMUX circuit 10D.

The first unit circuit 11A includes two branch wiring lines BL1 and BL5, and two switching TFTs 12A and 12E, and is configured to distribute a display signal from a signal output line VL1 to source bus lines SL1 and SL5. The two switching TFTs (a first switching TFT and a second switching TFT) 12A and 12E of the first unit circuit 11A are configured to attain the on state at timings different from each other within one horizontal scan period.

The second unit circuit 11B includes two branch wiring lines BL2 and BL6, and two switching TFTs 12B and 12F, and is configured to distribute a display signal from a signal output line VL2 to source bus lines SL2 and SL6. The two switching TFTs (a first switching TFT and a second switching TFT) 12B and 12F of the second unit circuit 11B are configured to attain the on state at timings different from each other within one horizontal scan period.

The third unit circuit 11C includes two branch wiring lines BL3 and BL7, and two switching TFTs 12C and 12G, and is configured to distribute a display signal from a signal output line VL3 to source bus lines SL3 and SL7. The two switching TFTs (a first switching TFT and a second switching TFT) 12C and 12G of the third unit circuit 11C are configured to attain the on state at timings different from each other within one horizontal scan period.

The fourth unit circuit 11D includes two branch wiring lines BL4 and BL8, and two switching TFTs 12D and 12H, and is configured to distribute a display signal from a signal output line VL4 to source bus lines SL4 and SL8. The two switching TFTs (a first switching TFT and a second switching TFT) 12D and 12H of the fourth unit circuit 11D are configured to attain the on state at timings different from each other within one horizontal scan period.

Either of the two boost circuits 20A and 20B illustrated in FIG. 16, i.e., 20A, is commonly coupled to the first switching TFT 12A of the first unit circuit 11A, the first switching TFT 12B of the second unit circuit 11B, the first switching TFT 12C of the third unit circuit 11C, and the first switching TFT 12D of the fourth unit circuit 11D. Another one of the two boost circuits 20A and 20B, i.e., 20B, is commonly coupled to the second switching TFT 12E of the first unit circuit 11A, the second switching TFT 12F of the second unit circuit 11B, the second switching TFT 12G of the third unit circuit 11C, and the second switching TFT 12H of the fourth unit circuit 11D.

As described above, in the embodiment, the four switching TFTs 12 to be selected simultaneously share one of boost circuits 20. Therefore, a number of circuit elements can further be reduced, compared with the fourth embodiment where the two of the switching TFTs 12 share the one of the boost circuits 20. Therefore, further low power consumption and a further narrower frame can be achieved.

In the embodiment, the example where the four switching TFTs 12 share the one of the boost circuits 20 has been illustrated. However, when three or more switching TFTs 12 share one of boost circuits 20, a number of circuit elements can be further reduced, compared with the fourth embodiment. Three switching TFTs 12 to be selected simultaneously may share one of boost circuits 20. Five or more switching TFTs 12 to be selected simultaneously may share one of boost circuits 20.

Sixth Embodiment

Figure 17:
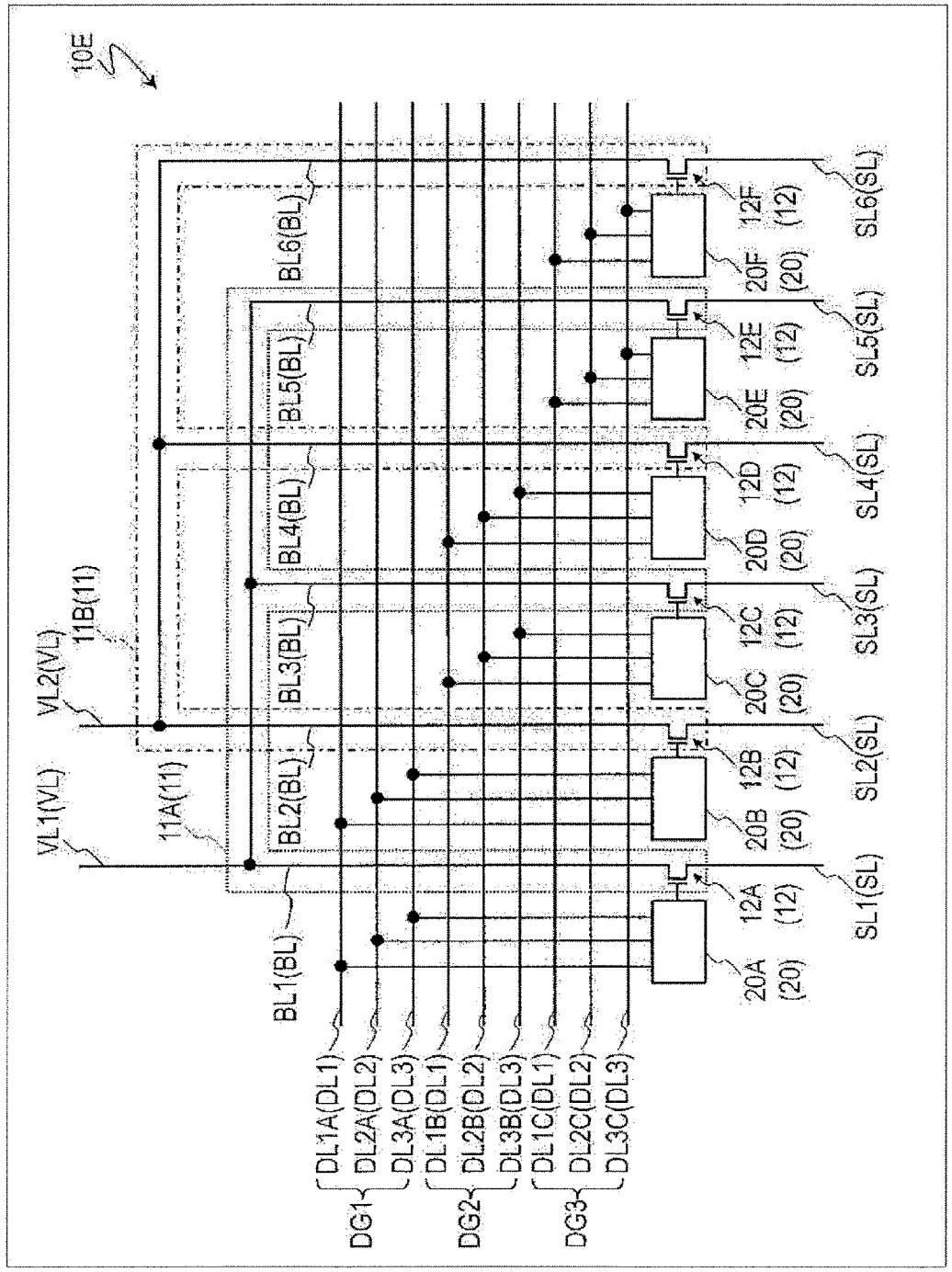
FIG. 17 is a view illustrating a configuration of a DEMUX circuit 10E included in an active matrix substrate according to a sixth embodiment.

An active matrix substrate according to the embodiment will be described with reference to FIG. 17. FIG. 17 is a view illustrating a configuration of a DEMUX circuit 10E included in the active matrix substrate according to the embodiment.

In the DEMUX circuits 10, 10C, and 10D illustrated in FIG. 2, FIG. 15, and FIG. 16, the unit circuits 11 are each configured to distribute a display signal from one of the signal output lines VL to two of the source bus lines SL. On the other hand, in the DEMUX circuit 10E according to the embodiment, unit circuits 11 are each configured to distribute a display signal from one of signal output lines VL to three of source bus lines SL. A more specific description follows.

FIG. 17 illustrates two unit circuits (a first unit circuit and a second unit circuit) 11A and 11B among the plurality of unit circuits 11 included in the DEMUX circuit 10E.

The first unit circuit 11A includes three branch wiring lines BL1, BL3, and BL5, and three switching TFTs 12A, 12C, and 12E, and is configured to distribute a display signal from one signal output line VL1 to three source bus lines SL1, SL3, and SL5.

The second unit circuit 11B includes three branch wiring lines BL2, BL4, and BL6, and three switching TFTs 12B, 12D, and 12F, and is configured to distribute a display signal from one signal output line VL2 to three source bus lines SL2, SL4, and SL6.

The DEMUX circuit 10E includes a plurality of boost circuits 20 configured to increase a voltage to be applied to gate electrodes of the three switching TFTs 12 of each of the unit circuits 11. In the example illustrated in FIG. 17, the switching TFTs 12 are respectively coupled with the boost circuits 20 one by one. Specifically, gate electrodes of the switching TFTs 12A, 12B, 12C, 12D, 12E, and 12F are respectively coupled to output sides of boost circuits 20A, 20B, 20C, 20D, 20E, and 20F.

In the example illustrated in FIG. 17, three-system drive signal line groups DG1, DG2, and DG3 are provided. The boost circuits 20A and 20B are to be driven by a first drive signal line DL1A, a second drive signal line DL2A, and a third drive signal line DL3A in the drive signal line group DG1. The boost circuits 20C and 20D are to be driven by a first drive signal line DL1B, a second drive signal line DL2B, and a third drive signal line DL3B in the drive signal line group DG2. The boost circuits 20E and 20F are to be driven by a first drive signal line DL1C, a second drive signal line DL2C, and a third drive signal line DL3C in the drive signal line group DG3.

Even in the active matrix substrate according to the embodiment, the DEMUX circuit 10E includes the boost circuits 20. Therefore, drive power can be reduced, similar to the active matrix substrates according to the first to fifth embodiments. In the embodiment, the unit circuits 11 are each configured to distribute a display signal from the one signal output line VL to the three source bus lines SL. Therefore, a number of the signal output lines VL can be reduced, compared with the first to fifth embodiments. Therefore, a wiring line region (a region arranged with the signal output lines VL) can be reduced, achieving a further narrower frame. Further, a number of amplifiers in a source driver 6 to be COG-mounted can be reduced, further reducing a chip size. Therefore, a number of chips to be manufactured from a wafer can be increased, reducing a chip cost.

Seventh Embodiment

Figure 18:
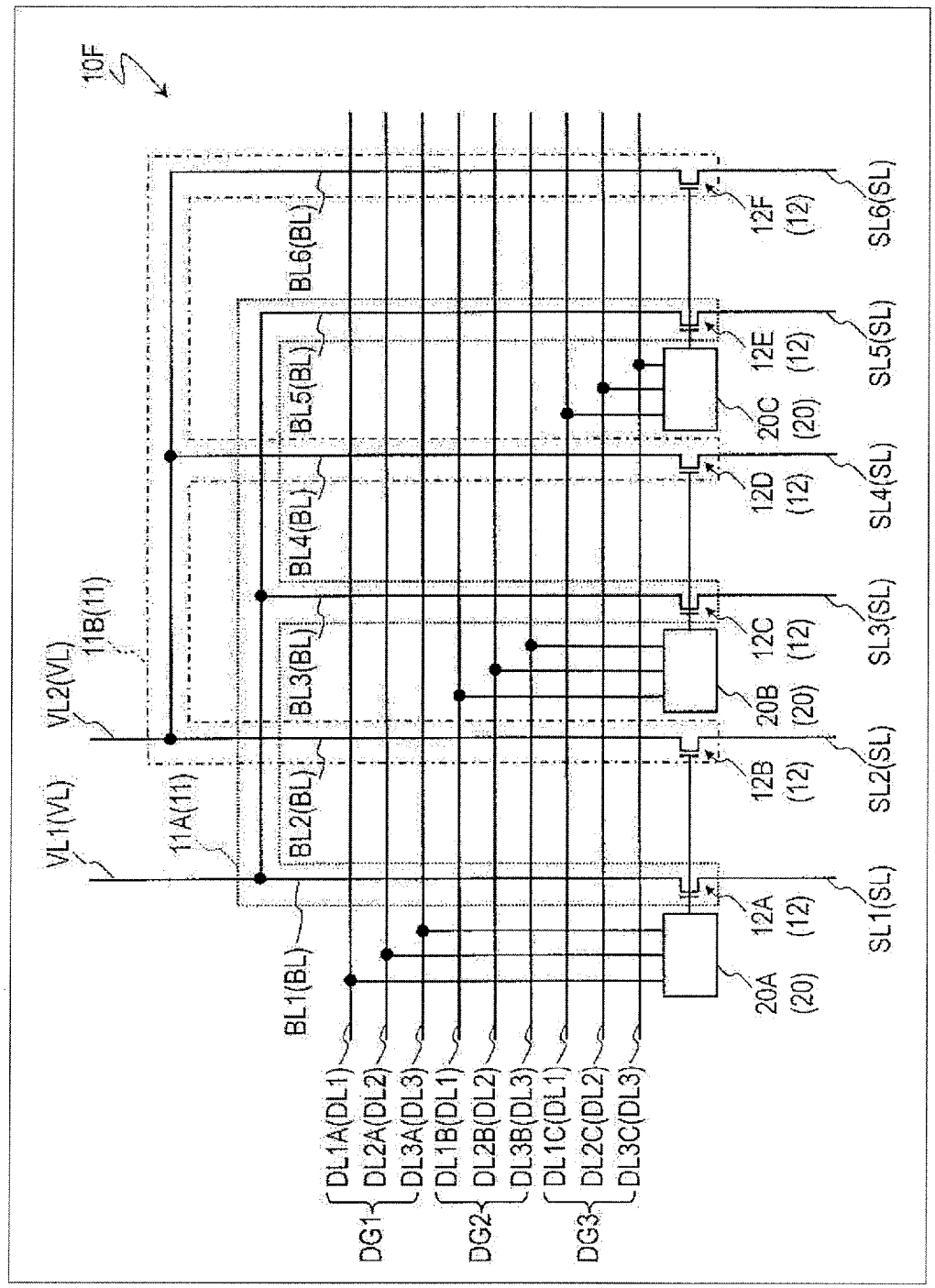
FIG. 18 is a view illustrating a configuration of a DEMUX circuit 10F included in an active matrix substrate according to a seventh embodiment.

An active matrix substrate according to the embodiment will be described with reference to FIG. 18. FIG. 18 is a view illustrating a configuration of a DEMUX circuit 10F included in the active matrix substrate according to the embodiment.

In the DEMUX circuit 10E illustrated in FIG. 17, the switching TFTs 12 are respectively coupled with the boost circuits 20 one by one. On the other hand, in the DEMUX circuit 10F according to the embodiment, as illustrated in FIG. 18, two of switching TFTs 12 are coupled with one of boost circuits 20. A more specific description follows.

Three of the switching TFTs 12 included in a first unit circuit 11A are a first switching TFT 12A, a second switching TFT 12C, and a third switching TFT 12E configured to attain the on state at timings different from each other within one horizontal scan period. Similarly, three of the switching TFTs 12 included in a second unit circuit 11B are a first switching TFT 12B, a second switching TFT 12D, and a third switching TFT 12F configured to attain the on state at timings different from each other within one horizontal scan period.

Among three boost circuits 20A, 20B, and 20C illustrated in FIG. 18, the boost circuit 20A is commonly coupled to the first switching TFT 12A of the first unit circuit 11A and the first switching TFT 12B of the second unit circuit 11B. The boost circuit 20B is commonly coupled to the second switching TFT 12C of the first unit circuit 11A and the second switching TFT 12D of the second unit circuit 11B. The boost circuit 20C is commonly coupled to the third switching TFT 12E of the first unit circuit 11A and the third switching TFT 12F of the second unit circuit 11B.

As described above, in the embodiment, the two switching TFTs 12 to be selected simultaneously share one of the boost circuits 20. Therefore, a number of circuit elements can be reduced. With a reduced number of circuit elements, a load can be reduced. As a result, further low power consumption can be achieved. Further, with the reduced number of circuit elements, a circuit area can be reduced, reducing a layout size. As a result, a further narrower frame can be achieved.

Eighth Embodiment

Figure 19:
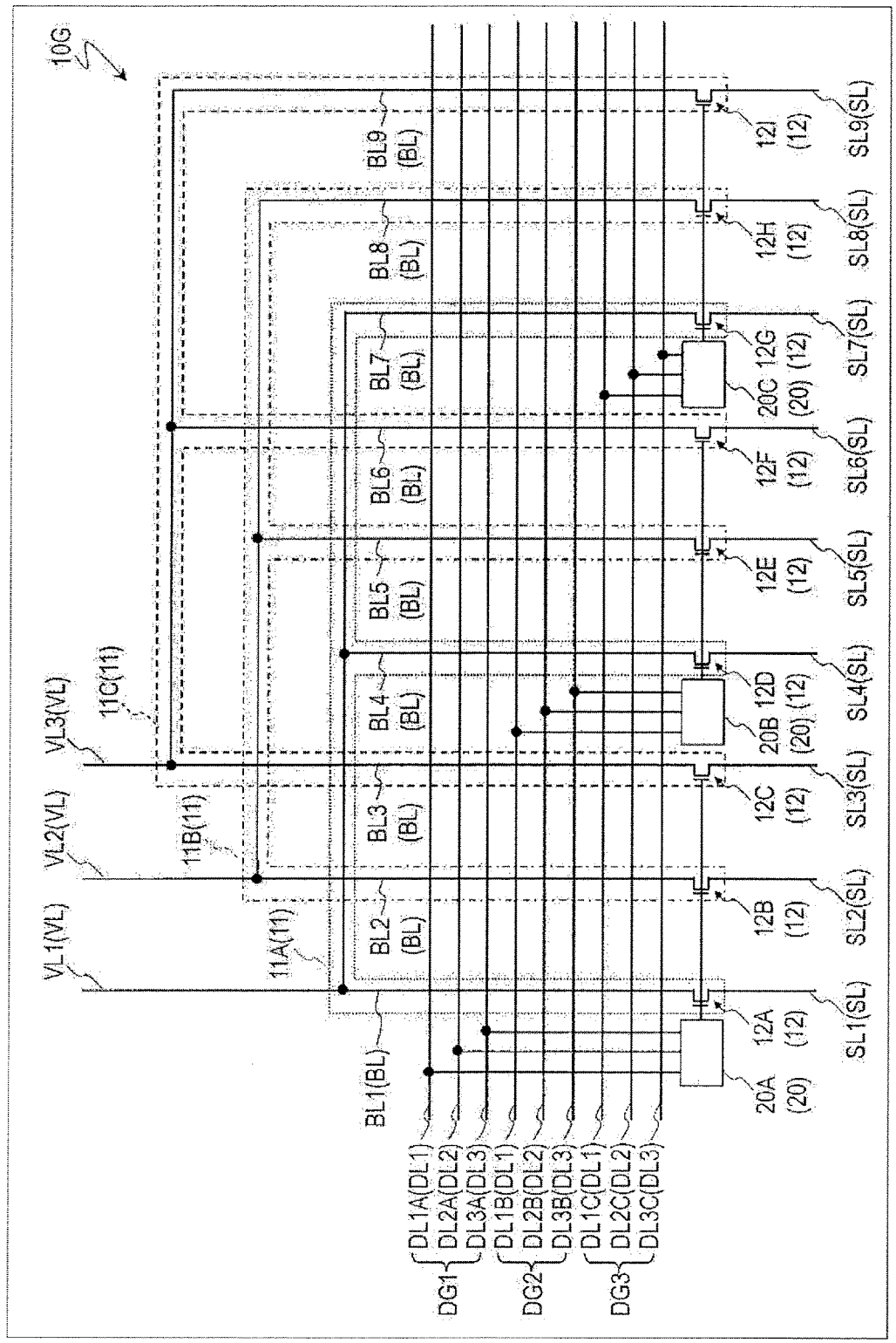
FIG. 19 is a view illustrating a configuration of a DEMUX circuit 10G included in an active matrix substrate according to an eighth embodiment.

In the DEMUX circuit 10F according to the seventh embodiment, the two of the switching TFTs 12 share the one of the boost circuits 20. However, three or more of switching TFTs 12 may share one of boost circuits 20. An active matrix substrate according to the embodiment will be described with reference to FIG. 19. FIG. 19 is a view illustrating a configuration of a DEMUX circuit 10G included in the active matrix substrate according to the embodiment.

FIG. 19 illustrates, among a plurality of unit circuits 11 included in the DEMUX circuit 10G, three unit circuits (hereinafter respectively referred to as a "first unit circuit", a "second unit circuit", and a "third unit circuit") 11A, 11B, and 11C.

The first unit circuit 11A includes three branch wiring lines BL1, BL4, and BL7, and three switching TFTs 12A, 12D, and 12G, and is configured to distribute a display signal from a signal output line VL1 to source bus lines SL1, SL4, and SL7. The three switching TFTs (a first switching TFT, a second switching TFT, and a third switching TFT) 12A, 12D, and 12G of the first unit circuit 11A are configured to attain the on state at timings different from each other within one horizontal scan period.

The second unit circuit 11B includes three branch wiring lines BL2, BL5, and BL8, and three switching TFTs 12B, 12E, and 12H, and is configured to distribute a display signal from a signal output line VL2 to source bus lines SL2, SL5, and SL8. The three switching TFTs (a first switching TFT, a second switching TFT, and a third switching TFT) 12B, 12E, and 12H of the second unit circuit 11B are configured to attain the on state at timings different from each other within one horizontal scan period.

The third unit circuit 11C includes three branch wiring lines BL3, BL6, and BL9, and three switching TFTs 12C, 12F, and 12I, and is configured to distribute a display signal from a signal output line VL3 to source bus lines SL3, SL6, and SL9. The three switching TFTs (a first switching TFT, a second switching TFT, and a third switching TFT) 12C, 12F, and 12I of the third unit circuit 11C are configured to attain the on state at timings different from each other within one horizontal scan period.

Among three boost circuits 20A, 20B, and 20C illustrated in FIG. 19, the boost circuit 20A is commonly coupled to the first switching TFT 12A of the first unit circuit 11A, the first switching TFT 12B of the second unit circuit 11B, and the first switching TFT 12C of the third unit circuit 11C. The boost circuit 20B is commonly coupled to the second switching TFT 12D of the first unit circuit 11A, the second switching TFT 12E of the second unit circuit 11B, and the second switching TFT 12F of the third unit circuit 11C. The boost circuit 20C is commonly coupled to the third switching TFT 12G of the first unit circuit 11A, the third switching TFT 12H of the second unit circuit 11B, and the third switching TFT 12I of the third unit circuit 11C.

As described above, in the embodiment, the three switching TFTs 12 to be selected simultaneously share one of the boost circuits 20. Therefore, a number of circuit elements can further be reduced, compared with the seventh embodiment where the two of the switching TFTs 12 share one of the boost circuits 20. Therefore, further low power consumption and a further narrower frame can be achieved.

In the embodiment, the example where the three switching TFTs 12 share one of the boost circuits 20 has been illustrated. However, four or more switching TFTs 12 to be selected simultaneously may share one of boost circuits 20.

Ninth Embodiment

Figure 20:
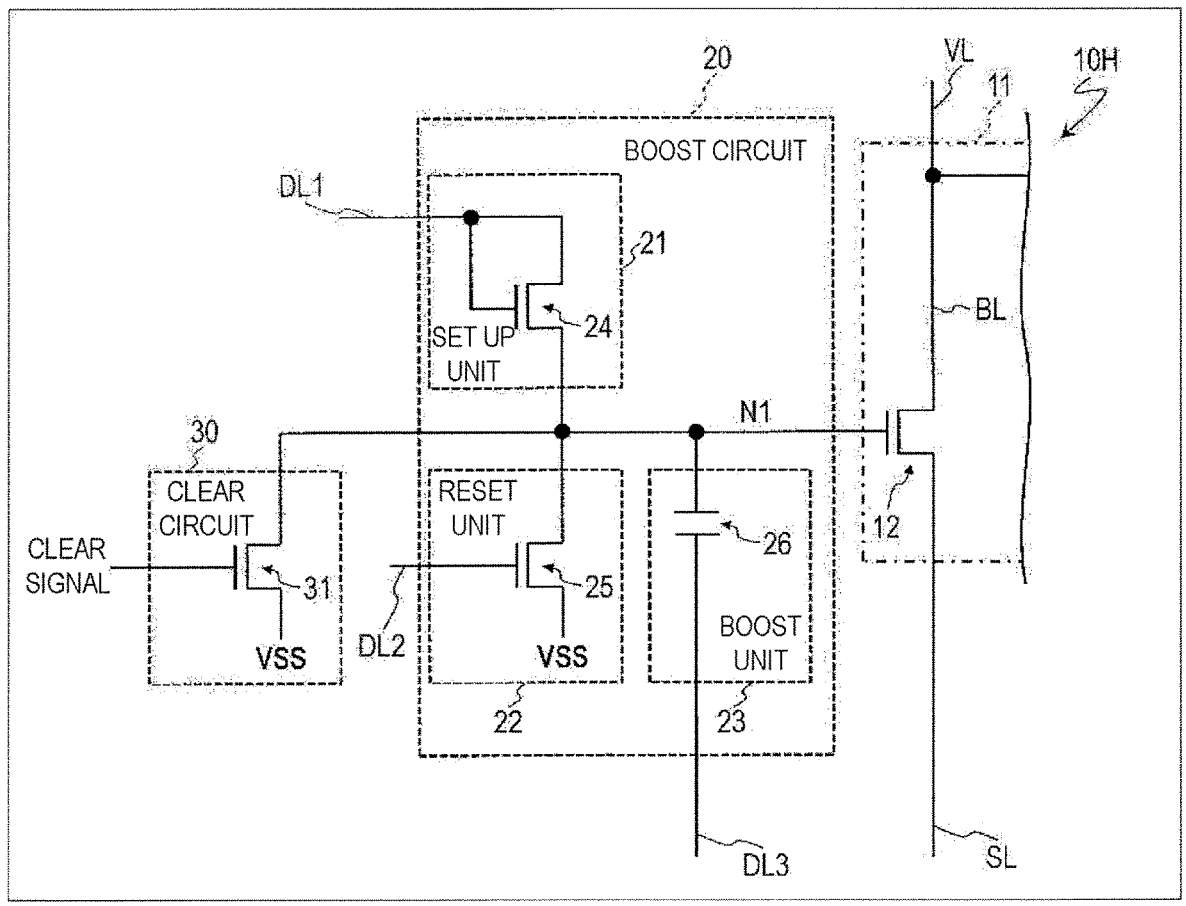
FIG. 20 is a view illustrating a configuration of a DEMUX circuit 10H included in an active matrix substrate according to a ninth embodiment.

An active matrix substrate according to the embodiment will be described with reference to FIG. 20. FIG. 20 is a view illustrating a configuration of a DEMUX circuit 10H included in the active matrix substrate according to the embodiment.

As illustrated in FIG. 20, the DEMUX circuit 10H further includes a plurality of clear circuits 30 respectively coupled to boost circuits 20 (FIG. 20 illustrates one of the clear circuits 30). The clear circuits 30 are each configured to initialize a corresponding one of the boost circuits 20 at a predetermined timing.

In the example illustrated in FIG. 20, the clear circuits 30 each include a TFT (hereinafter referred to as a "clearing TFT") 31. A gate electrode of the clearing TFT 31 is configured to accept a clear signal. A source electrode of the clearing TFT 31 is configured to accept a constant potential (a negative power source potential VSS). A drain electrode of the clearing TFT 31 is coupled to a node N1.

In the DEMUX circuit 10H including the clear circuits 30, when a clear signal supplied to the gate electrode of the clearing TFT 31 reaches the high level, a corresponding one of the boost circuits 20 is initialized. The clear circuits 30 respectively initialize the boost circuits 20 at an initial stage or a final stage of a drive period, for example.

When one of the boost circuits 20 is initialized at the initial stage of a drive period, the one of the boost circuits 20 operates from an initialized state, suppressing unexpected operations and outputs. When one of the boost circuits 20 is initialized at the final stage of a drive period, electric charge (accumulated through driving) at each node can be canceled, preventing the corresponding TFT from being deteriorated due to the electric charge kept remained while an operation is stopped.

Tenth Embodiment

Figure 21:
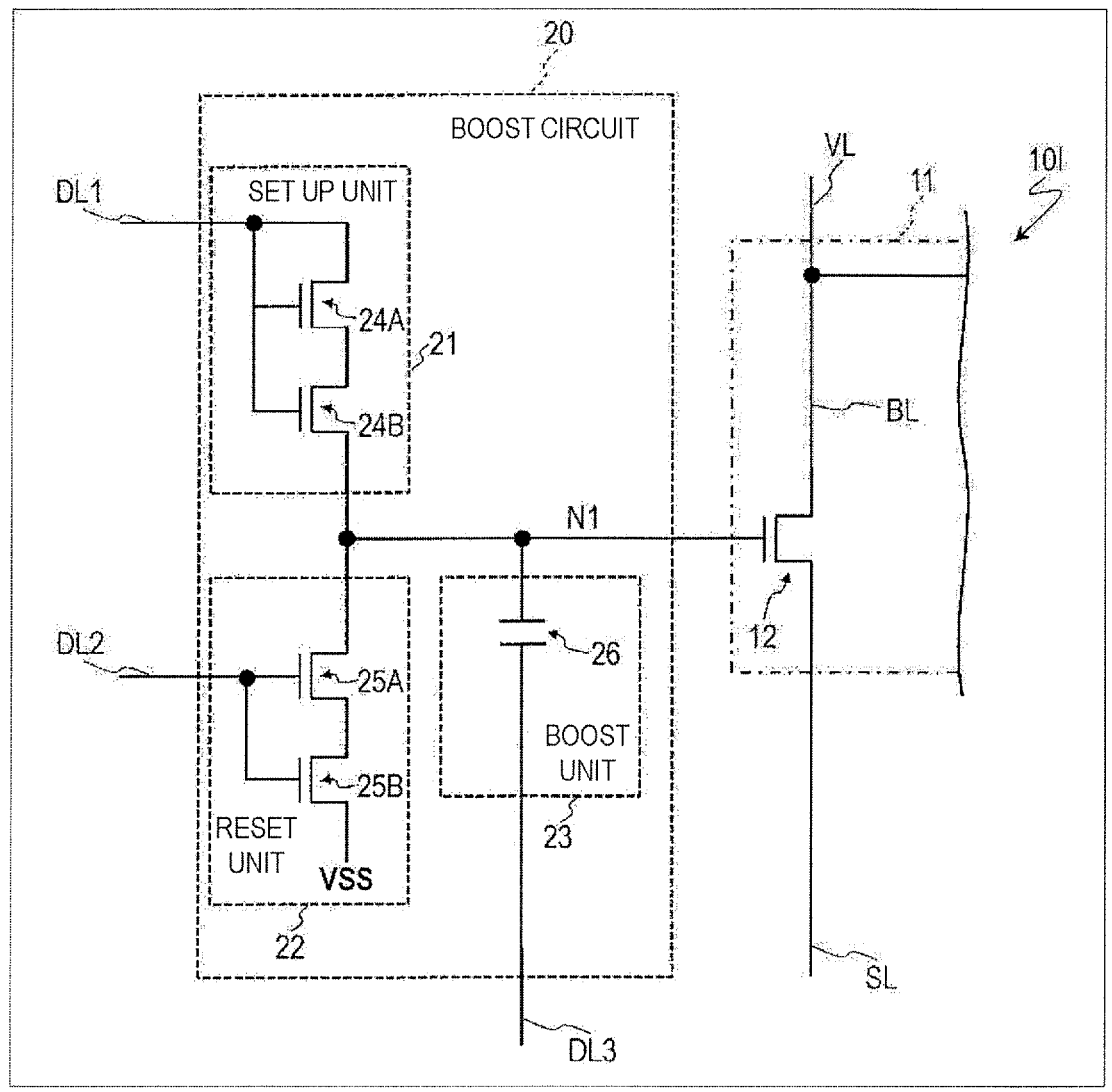
FIG. 21 is a view illustrating a configuration of a DEMUX circuit 10I included in an active matrix substrate according to a tenth embodiment.

An active matrix substrate according to the embodiment will be described with reference to FIG. 21. FIG. 21 is a view illustrating a configuration of a DEMUX circuit 10I included in the active matrix substrate according to the embodiment.

In the DEMUX circuit 10I, as illustrated in FIG. 21, a set up unit 21 of each of boost circuits 20 includes a plurality of setting TFTs 24A and 24B coupled in series to each other. A reset unit 22 of each of the boost circuits 20 includes a plurality of resetting TFTs 25A and 25B coupled in series to each other.

In the example illustrated in FIG. 21, the set up unit 21 includes the two setting TFTs 24A and 24B (hereinafter respectively referred to as a "first setting TFT" and a "second setting TFT"). A gate electrode and a drain electrode of the first setting TFT 24A are coupled to a first drive signal line DL1. That is, the first setting TFT 24A is diode-coupled. A source electrode of the first setting TFT 24A is coupled to a drain electrode of the second setting TFT 24B. A gate electrode of the second setting TFT 24B is coupled to the first drive signal line DL1. A source electrode of the second setting TFT 24B is coupled to a node N1.

In the example illustrated in FIG. 21, the reset unit 22 includes the two resetting TFTs 25A and 25B (hereinafter respectively referred to as a "first resetting TFT" and a "second resetting TFT"). A gate electrode of the first resetting TFT 25A is coupled to a second drive signal line DL2. A drain electrode of the first resetting TFT 25A is coupled to the node N1. A source electrode of the first resetting TFT 25A is coupled to a drain electrode of the second resetting TFT 25B. A gate electrode of the second resetting TFT 25B is coupled to the second drive signal line DL2. A source electrode of the second resetting TFT 25B is configured to accept a constant potential (a negative power source potential VSS).

As described above, the set up unit 21 of the boost circuit 20 includes the plurality of setting TFTs 24A and 24B coupled in series to each other, as well as the reset unit 22 includes the plurality of resetting TFTs 25A and 25B coupled in series to each other. Even when the boost circuit 20 operates, and a voltage at the node N1 increases, a difference between potentials supplied to the source and the drain of each of the TFTs can be reduced (approximately halved in the illustrated configuration). That is, higher voltage resistance capability can be achieved.

Eleventh Embodiment

Figure 22:
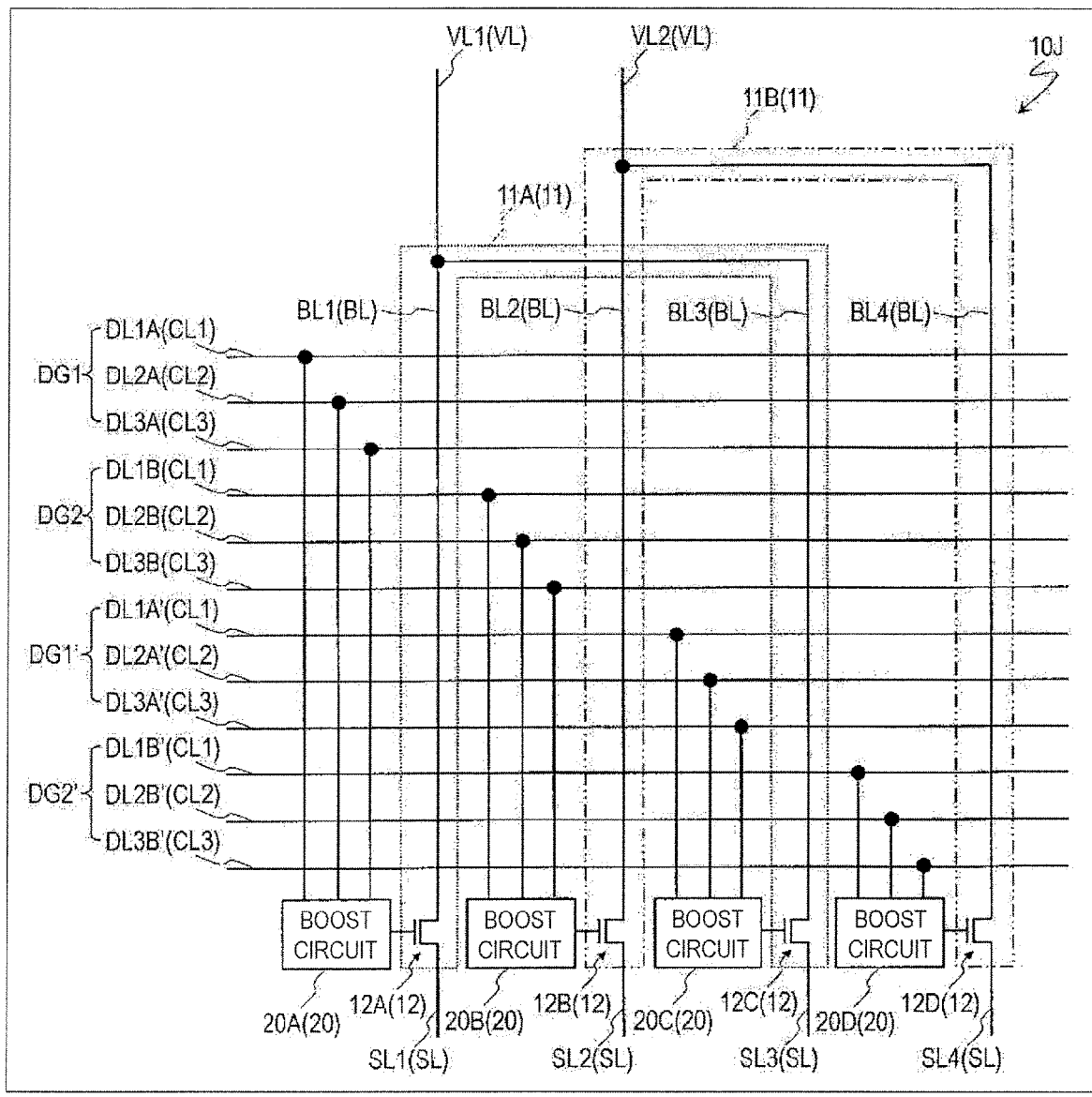
FIG. 22 is a view illustrating a configuration of a DEMUX circuit 10J included in an active matrix substrate according to an eleventh embodiment.

An active matrix substrate according to the embodiment will be described with reference to FIG. 22. FIG. 22 is a view illustrating a configuration of a DEMUX circuit 10J included in the active matrix substrate according to the embodiment.

The DEMUX circuit 10J illustrated in FIG. 22 differs from the DEMUX circuit 10 illustrated in FIG. 2 in the sense that drive signal line groups DG1' and DG2' are further included, in addition to drive signal line groups DG1 and DG2.

Among four boost circuits 20 illustrated in FIG. 22, a boost circuit 20A is to be driven by the drive signal line group DG1. A boost circuit 20B is to be driven by the drive signal line group DG2. A boost circuit 20C is to be driven by the drive signal line group DG1'. A boost circuit 20D is to be driven by the drive signal line group DG2'.

In the DEMUX circuit 10 illustrated in FIG. 2, the boost circuit 20A and the boost circuit 20B to be driven at an identical timing are to be driven by the drive signal line group DG1. The boost circuit 20C and the boost circuit 20D to be driven at an identical timing are to be driven by the drive signal line group DG2.

On the other hand, in the DEMUX circuit 10J illustrated in FIG. 22, the boost circuit 20A and the boost circuit 20B to be driven at an identical timing are respectively to be driven by the drive signal line groups GD1 and GD1' different from each other. The boost circuit 20C and the boost circuit 20D to be driven at an identical timing are respectively to be driven by the drive signal line groups GD2 and GD2' different from each other.

The drive signal line groups GD1 and GD1' are supplied with drive signals being phase-developed for driving each of the boost circuits 20 at a timing. That is, the drive signal line groups GD1 and GD1' are distinct wiring line groups configured to supply substantially identical signals.

The drive signal line groups GD2 and GD2' are supplied with drive signals being phase-developed for driving each of the boost circuits 20 at another timing. That is, the drive signal line groups GD2 and GD2' are distinct wiring line groups configured to supply substantially identical signals.

As described above, the embodiment is provided with wiring line groups configured to supply drive signal groups used to drive some boost circuits 20 among the two or more boost circuits 20 to be driven at an identical timing, and other wiring line groups configured to supply drive signal groups used to drive other boost circuits 20. Therefore, a number of circuits coupled to one drive signal line can be reduced, reducing loads to be respectively applied to drive signal lines, as well as shortening transition times (rise time and fall time) for a drive signal. Therefore, faster operation can be achieved.

Twelfth Embodiment

Figure 23A:
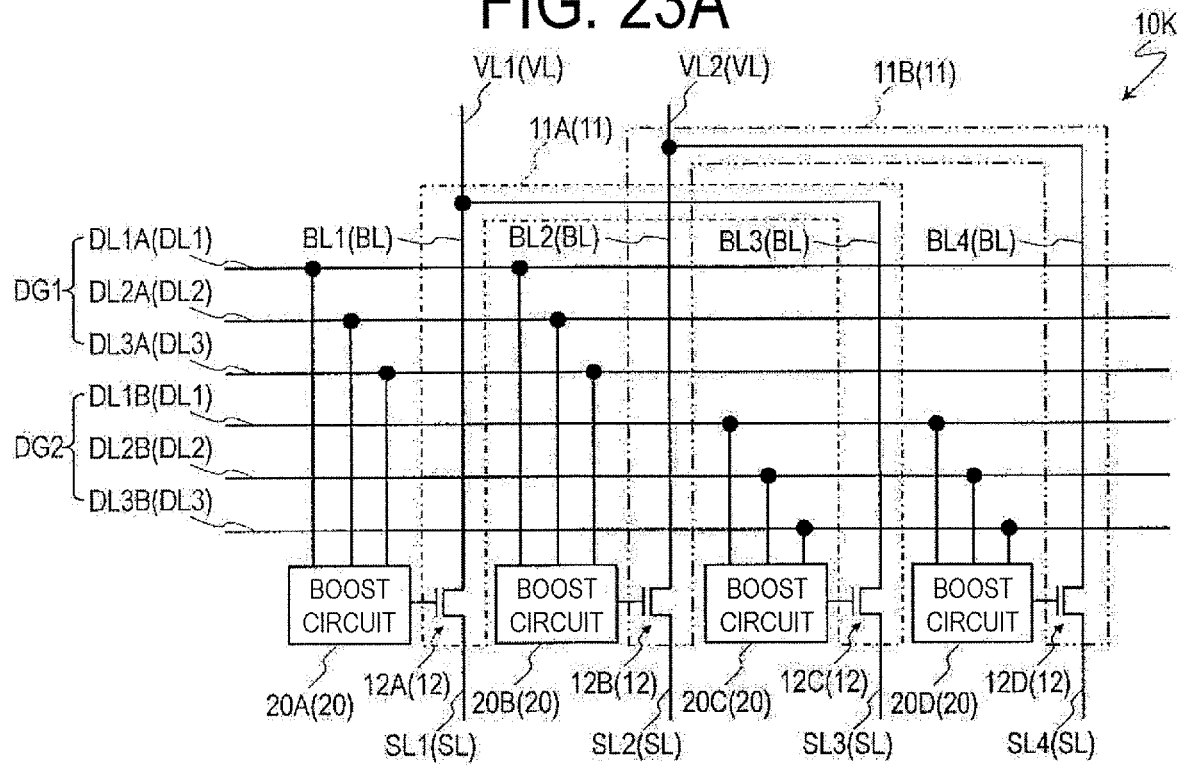
FIGS. 23A and 23B are views illustrating a configuration of a DEMUX circuit 10K included in an active matrix substrate according to a twelfth embodiment.
Figure 23B:
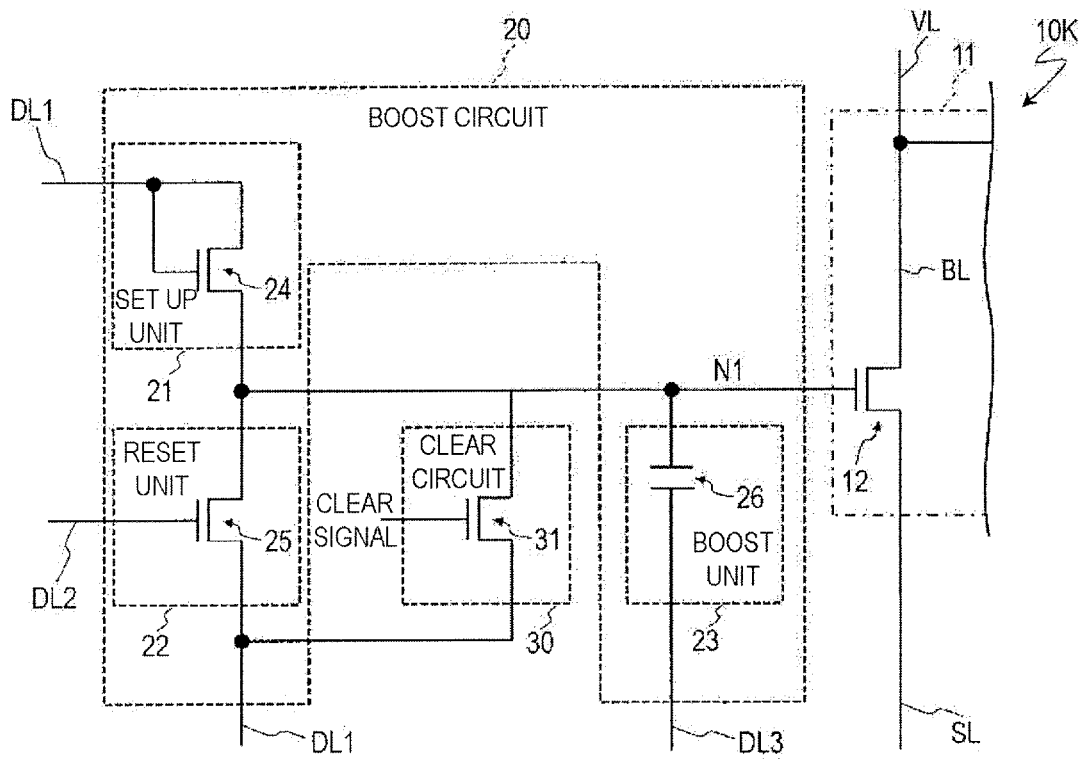

An active matrix substrate according to the embodiment will be described with reference to FIGS. 23A and 23B. FIGS. 23A and 23B are views illustrating a configuration of a DEMUX circuit 10K included in the active matrix substrate according to the embodiment.

As illustrated in FIG. 23B, the DEMUX circuit 10K according to the embodiment differs from the DEMUX circuit 10H illustrated in FIG. 20 in the sense that a source electrode of a resetting TFT 25 and a source electrode of a clearing TFT 31 are coupled to a first drive signal line DL1. When the configuration according to the embodiment is adopted, no wiring lines (VSS wiring lines) are required to couple the source electrode of the resetting TFT 25 and the source electrode of the clearing TFT 31 to a negative power source.

Figure 24:
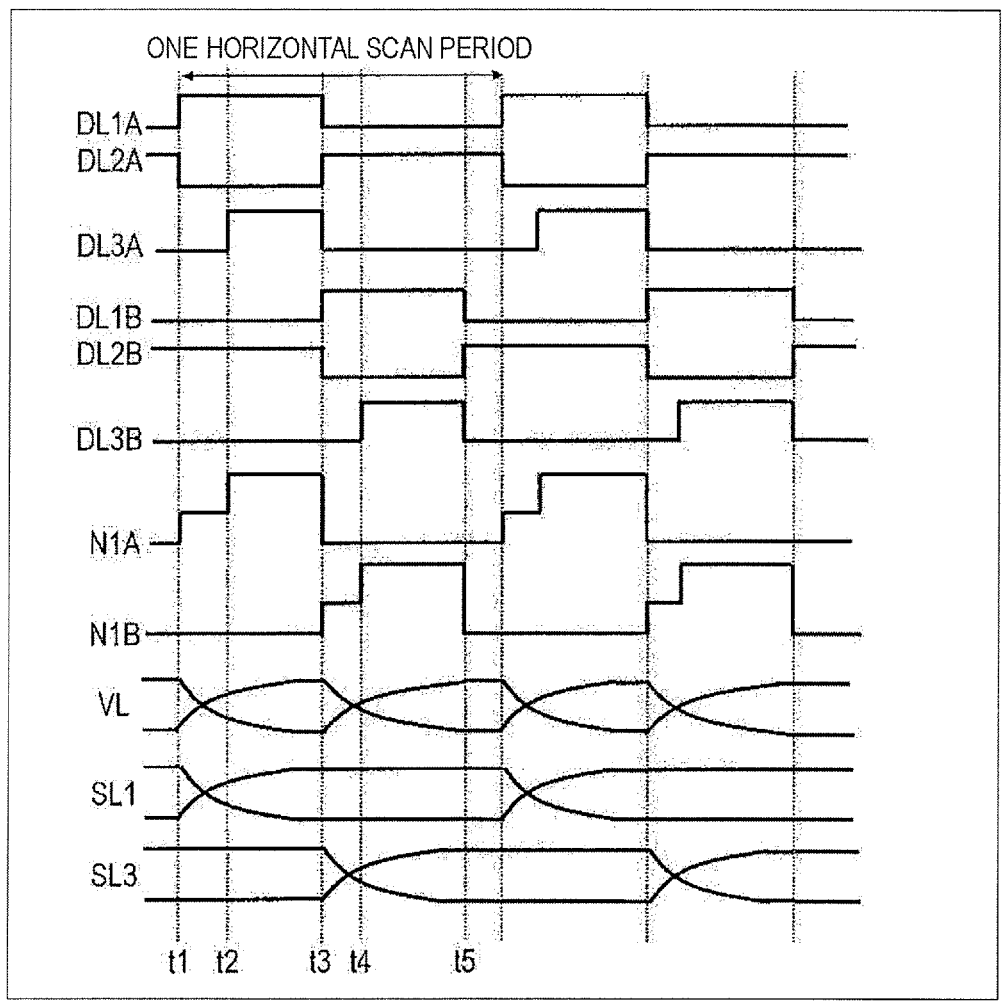
FIG. 24 is a timing chart illustrating operations of the DEMUX circuit 10K.

Why a reset operation and a clear operation can be preferably performed even when the source electrode of the resetting TFT 25 and the source electrode of the clearing TFT 31 are coupled to the first drive signal line DL1 will be described with further reference to FIG. 24. FIG. 24 is a timing chart illustrating operations of the DEMUX circuit 10K.

When the first drive signal line DL1 and a second drive signal line DL2 configured to drive each of boost circuits 20 are focused on, as it can be seen in FIG. 24, a signal to be supplied from the first drive signal line DL1 is a signal (inverted signal) inverted from a signal to be supplied from the second drive signal line DL2. Therefore, when a potential of the second drive signal line DL2 is at the high level (i.e., when a reset signal enters into the resetting TFT 25), a potential of the first drive signal line DL1 is at the low level. Therefore, a reset operation can be safely performed. When a timing at which the potential of the first drive signal line DL1 is at the low level is selected as a timing for performing a clear operation, the clear operation can be safely performed.

The timing chart illustrated in FIG. 24 is substantially identical to the timing chart illustrated in FIG. 4. For respective operations at times t1 to t5, see the description provided with reference to the timing chart in FIG. 4.

Here, the configuration including the clear circuits 30 has been illustrated. However, even in the DEMUX circuit 10 illustrated in FIG. 5, the DEMUX circuit 10A illustrated in FIG. 12, and the DEMUX circuit 10B illustrated in FIG. 14, when the source electrodes of the resetting TFTs 25 and 28 are coupled to the first drive signal line DL1, similar effects can be achieved.

Thirteenth Embodiment

Figure 25A:
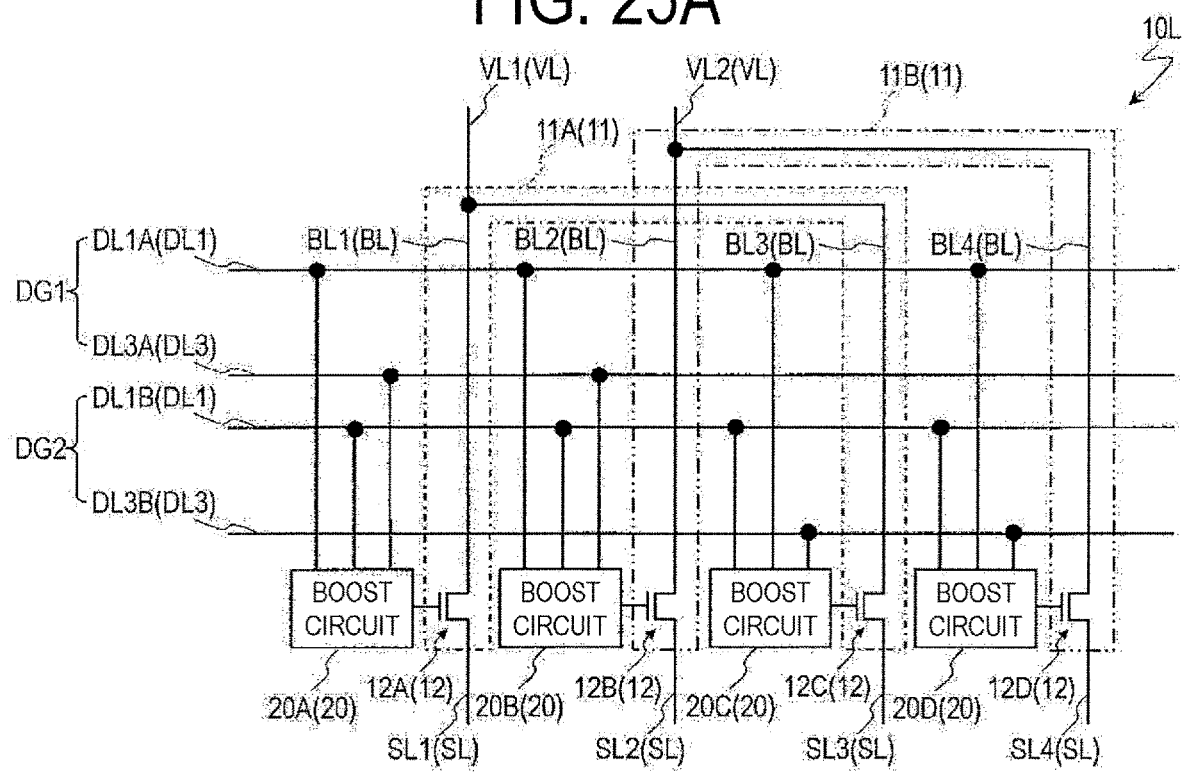
FIGS. 25A and 25B are views illustrating a configuration of a DEMUX circuit 10L included in an active matrix substrate according to a thirteenth embodiment.
Figure 25B:
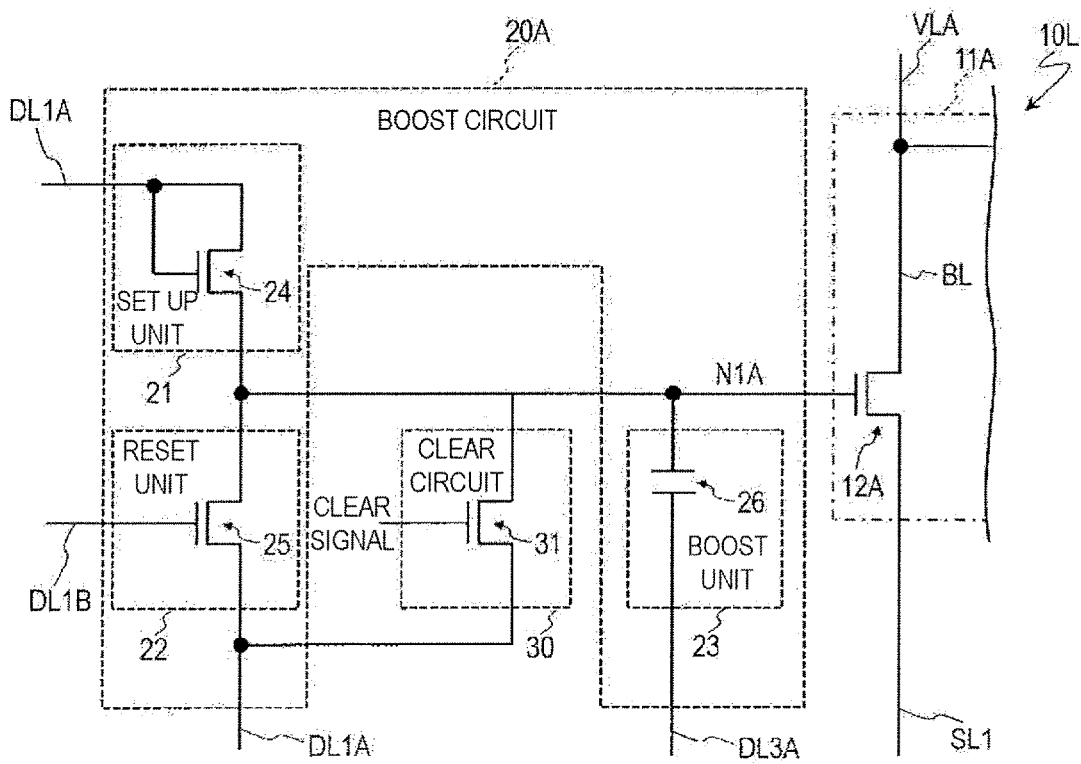

An active matrix substrate according to the embodiment will be described with reference to FIGS. 25A and 25B. FIGS. 25A and 25B are views illustrating a configuration of a DEMUX circuit 10L included in the active matrix substrate according to the embodiment.

As illustrated in FIG. 25A, the DEMUX circuit 10L according to the embodiment differs from the DEMUX circuit 10K illustrated in FIGS. 23A and 23B in the sense that no second drive signal line DL2 is included. FIG. 25B illustrates a boost circuit (first boost circuit) 20A coupled to either of two switching TFTs 12A and 12C included in a unit circuit 11A in the DEMUX circuit 10L, i.e., (first switching TFT) 12A. As illustrated in FIG. 25B, a gate electrode of a resetting TFT 25 of the first boost circuit 20A is coupled to a first drive signal line DL1B for a boost circuit (second boost circuit) 20C coupled to another one of the two switching TFTs, i.e., (second switching TFT) 12B. Although not illustrated, a gate electrode of a resetting TFT 25 in the second boost circuit 20C is coupled to a first drive signal line DL1A for the first boost circuit 20A.

As described above, in the embodiment, the first drive signal line DL1A for the first boost circuit 20A also serves as the second drive signal line for the second boost circuit 20C, and the first drive signal line DL1B for the second boost circuit 20C also serves as the second drive signal line for the first boost circuit 20A. When the configuration according to the embodiment is adopted, second drive signal lines can be omitted, further reducing a number of wiring lines.

Why the first drive signal line DL1 for one of the boost circuits 20 can also serve as a second drive signal line for another one of the boost circuits 20 will be described with further reference to FIG. 26.

Figure 26:
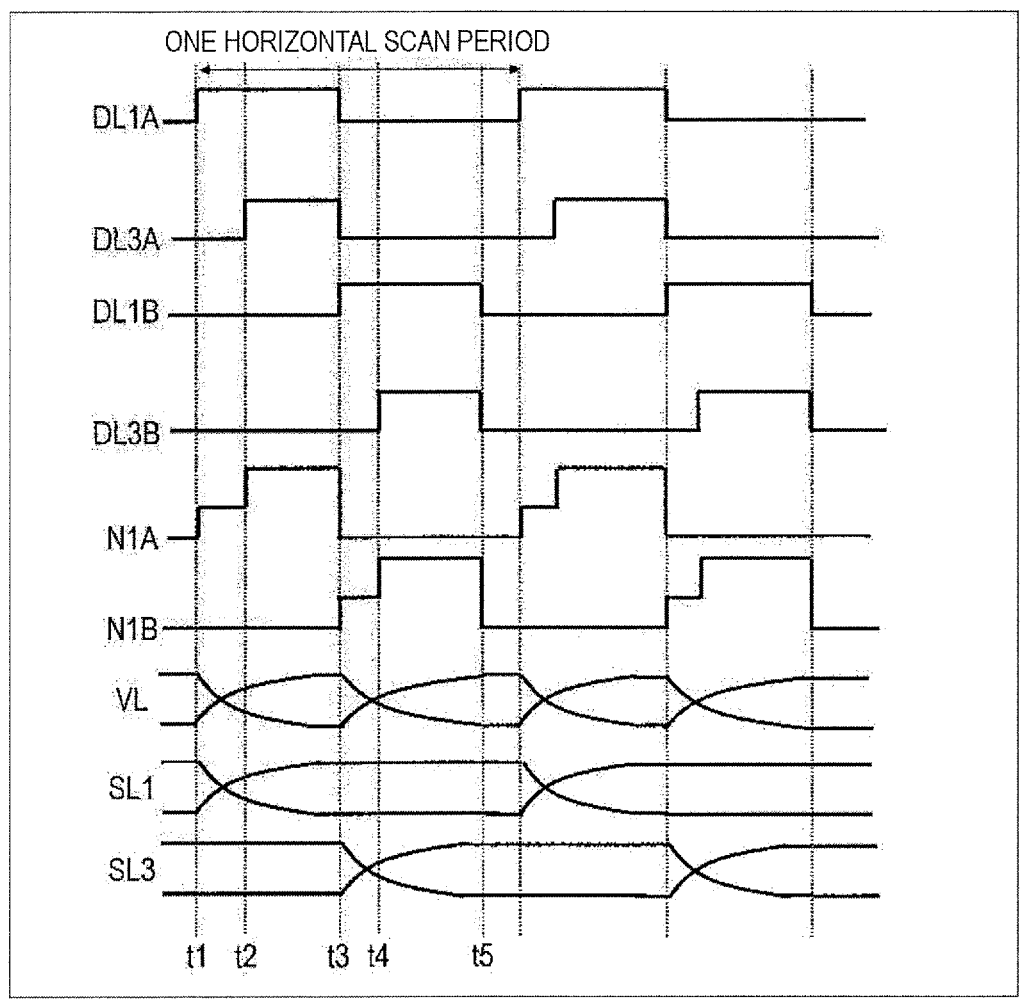
FIG. 26 is a timing chart illustrating operations of the DEMUX circuit 10L.

FIG. 26 is a timing chart illustrating operations of the DEMUX circuit 10L.

As can be seen from FIG. 26, a signal to be supplied from the first drive signal line DL1A for the first boost circuit 20A and a signal to be supplied from the first drive signal line DL1B for the second boost circuit 20C are opposite in phase from each other. Therefore, the first drive signal line DL1A for the first boost circuit 20A and the first drive signal line DL1B for the second boost circuit 20C reach the high level at timings different from each other. Therefore, a signal to be supplied from the first drive signal line DL1B for the second boost circuit 20C can be used as a reset signal for the first boost circuit 20A, whereas a signal to be supplied from the first drive signal line DL1A for the first boost circuit 20A can be used as a reset signal for the second boost circuit 20C.

Here, the configuration including the clear circuits 30 has been illustrated. However, even in the DEMUX circuit 10 illustrated in FIG. 5, the DEMUX circuit 10A illustrated in FIG. 12, and the DEMUX circuit 10B illustrated in FIG. 14, when similar modifications have been made, similar effects can be achieved.

Fourteenth Embodiment

Figure 27:
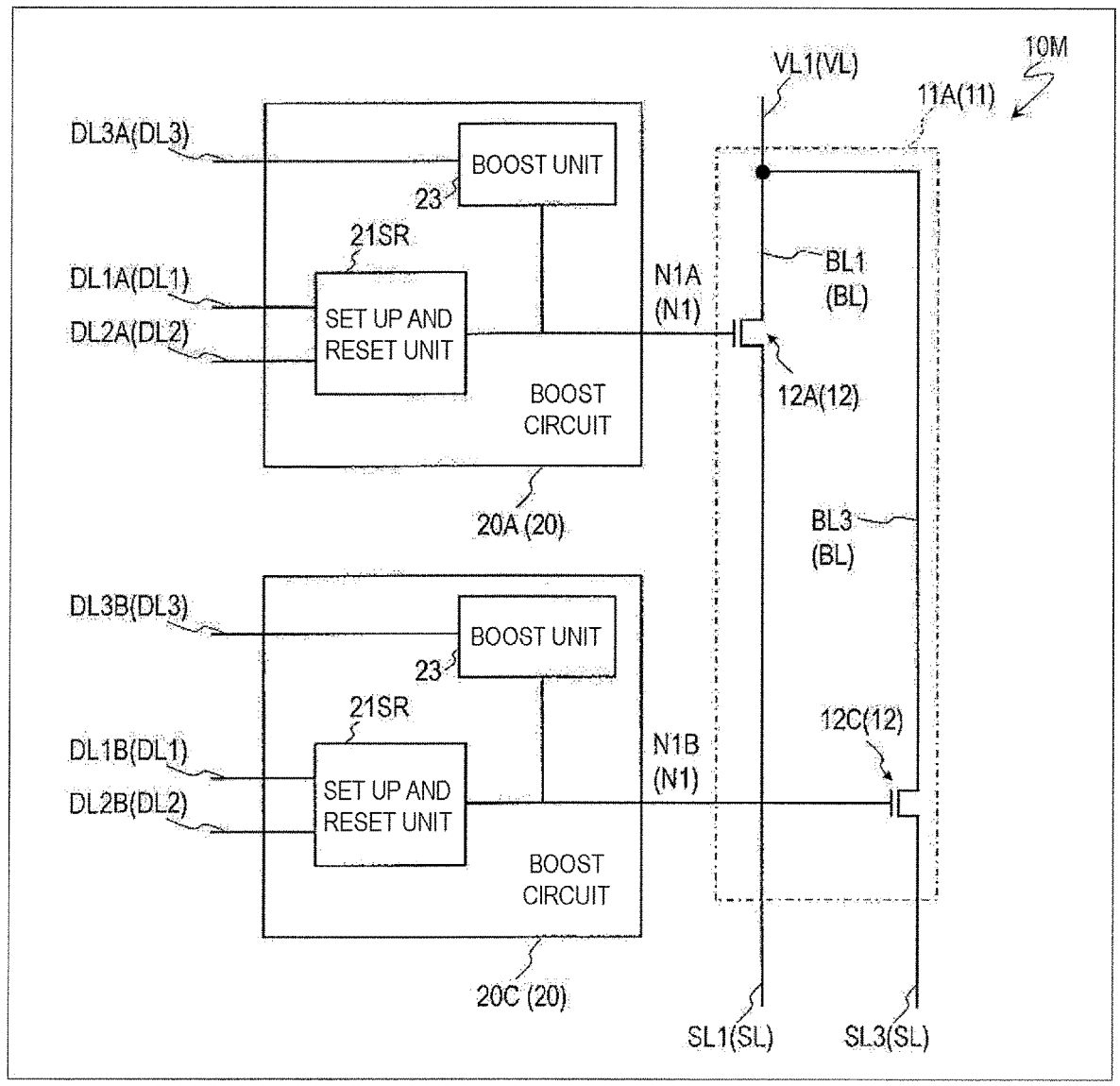
FIG. 27 is a view illustrating a configuration of a DEMUX circuit 10M included in an active matrix substrate according to a fourteenth embodiment.

An active matrix substrate according to the embodiment will be described with reference to FIG. 27. FIG. 27 is a view illustrating a configuration of a DEMUX circuit 10M included in the active matrix substrate according to the embodiment.

Boost circuits 20 in the DEMUX circuit 10M illustrated in FIG. 27 each include a set up and reset unit 21SR and a boost unit 23. The set up and reset unit 21SR and the boost unit 23 are respectively coupled to a node N1 coupled to a gate electrode of each of switching TFTs 12. The set up and reset unit 21SR is coupled to a first drive signal line DL1 and a second drive signal line DL2. The boost unit 23 is coupled to a third drive signal line DL3. That is, the DEMUX circuit 10M illustrated in FIG. 27 differs from the DEMUX circuit 10 illustrated in FIG. 3 in the sense that the boost circuits 20 each include the set up and reset unit 21SR, instead of the set up unit 21 and the reset unit 22. In other words, in the DEMUX circuit 10M illustrated in FIG. 27, a set up unit also functions as a reset unit.

The set up and reset unit 21SR is configured to accept a first drive signal (set signal) S from the first drive signal line DL1 to pre-charge the node N1 (set operation). The set up and reset unit 21SR is further configured to accept a second drive signal (reset signal) R from the second drive signal line DL2 to reset a potential of the node N1 (reset operation). The set up and reset unit 21SR performs the set operation and the reset operation at timings different from each other.

The boost unit 23 is configured to accept a third drive signal (boost signal) B from the third drive signal line DL3 to increase the potential of the node N1 being pre-charged through the set operation by the set up and reset unit 21 (boost operation).

Figure 28:
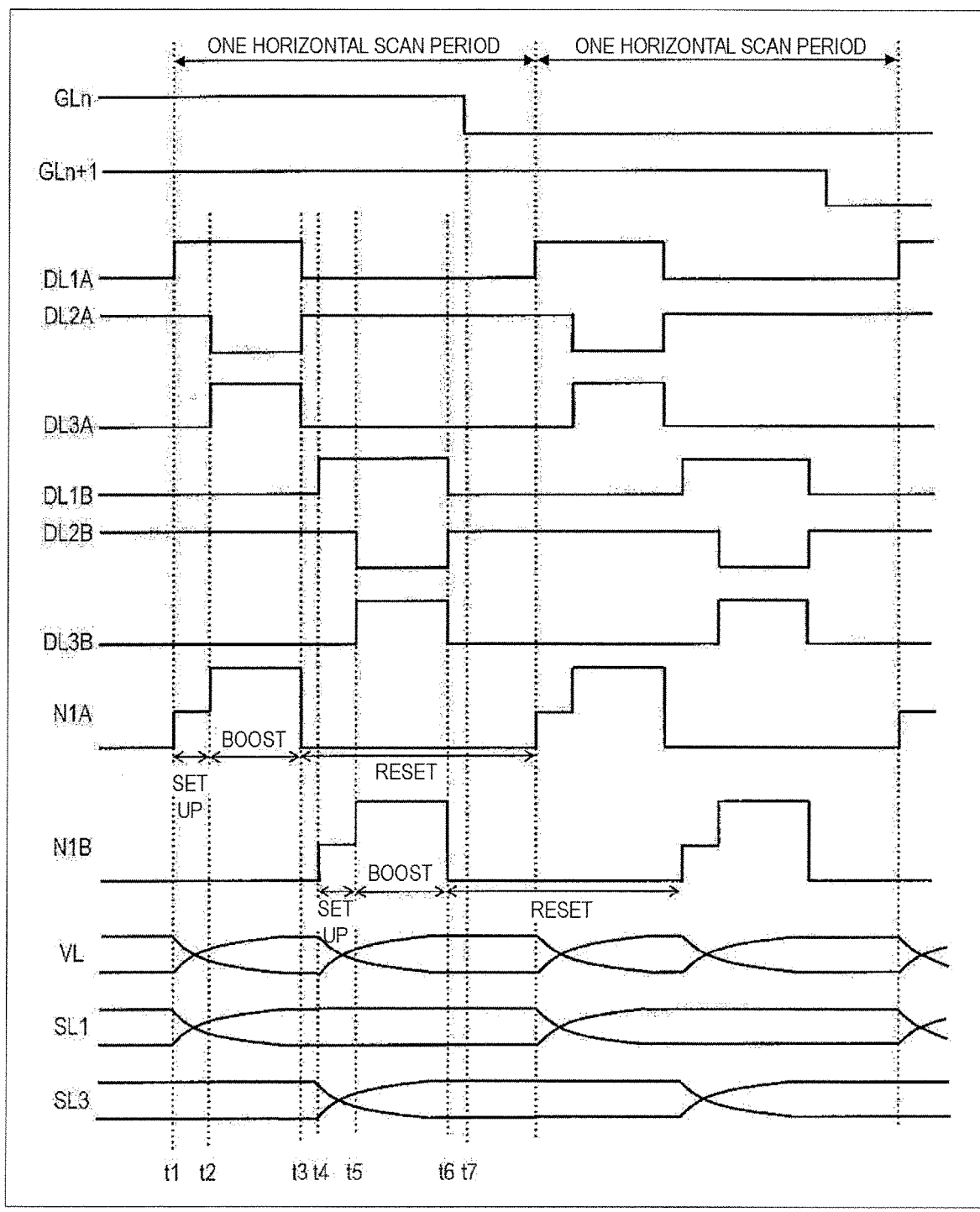
FIG. 28 is a timing chart illustrating operations of the DEMUX circuit 10M.

Operations of each of the boost circuits 20 in the DEMUX circuit 10M will be described with further reference to FIG. 28. FIG. 28 is a timing chart illustrating operations of the DEMUX circuit 10M. FIG. 28 illustrates potentials of first drive signal lines DL1A and DL1B, second drive signal lines DL2A and DL2B, third drive signal lines DL3A and DL3B, nodes N1A and N1B, each of signal output lines VL, and source bus lines SL1 and SL3. FIG. 28 further illustrates potentials of gate bus lines GLn and GLn+1.

First, at a time t1, the potential of the first drive signal line DL1A reaches the high level. At this time, the potential of the second drive signal line DL2A is kept at the high level from a previous horizontal scan period. A first drive signal enters as the set signal S into the set up and reset unit 21SR of a boost circuit 20A. The node N1A coupled to a gate electrode of a switching TFT 12A is thus pre-charged (set operation). At the timing, the potential of each of the signal output lines VL (i.e., a display signal) changes to a writing voltage level. Charging of the selected source bus line SL1 starts.

Next, at a time t2, the potential of the second drive signal line DL2A reaches the low level, and the potential of the third drive signal line DL3A reaches the high level. A third drive signal enters as a boost signal B into the boost unit 23 of the boost circuit 20A. The potential of the node N1A thus increases (boost operation). After the potential of the node N1A has increased, the source bus line SL1 is fully charged via the switching TFT 12A.

Next, at a time t3, the potential of the first drive signal line DL1A reaches the low level, the potential of the second drive signal line DL2A reaches the high level, and the potential of the third drive signal line DL3A reaches the low level. A second drive signal enters as a reset signal R into the set up and reset unit 21SR of the boost circuit 20A. The potential of the node N1A is thus reset (reset operation). Writing to the source bus line SL1 has been completed.

Next, at a time t4, the potential of the first drive signal line DL1B reaches the high level. At this time, the potential of the second drive signal line DL2B is kept at the high level from a previous horizontal scan period. A first drive signal enters as a set signal S into the set up and reset unit 21SR of a boost circuit 20C. The node N1B coupled to a gate electrode of a switching TFT 12C is thus pre-charged (set operation). At the timing, the potential of each of the signal output lines VL (i.e., a display signal) changes to the writing voltage level. Charging of the selected source bus line SL3 starts.

Next, at a time t5, the potential of the second drive signal line DL2B reaches the low level, and the potential of the third drive signal line DL3B reaches the high level. A third drive signal enters as a boost signal B into the boost unit 23 of the boost circuit 20C. The potential of the node N1B thus increases (boost operation). After the potential of the node N1B has increased, the source bus line SL3 is fully charged via the switching TFT 12C.

Next, at a time t6, the potential of the first drive signal line DL1B reaches the low level, the potential of the second drive signal line DL2B reaches the high level, and the potential of the third drive signal line DL3B reaches the low level. A second drive signal enters as a reset signal R into the set up and reset unit 21SR of the boost circuit 20C. The potential of the node N1B is thus reset (reset operation). Writing to the source bus line SL3 has been completed.

After that, when writing to the source bus lines SL1 and SL3 has been completed (potentials have been determined), a gate signal supplied from the gate bus line GLn reaches the off level (time t7). A display voltage has been written to each of pixels PIX. The operation described above is repeated to perform writing to all gate bus lines GL.

Figure 29:
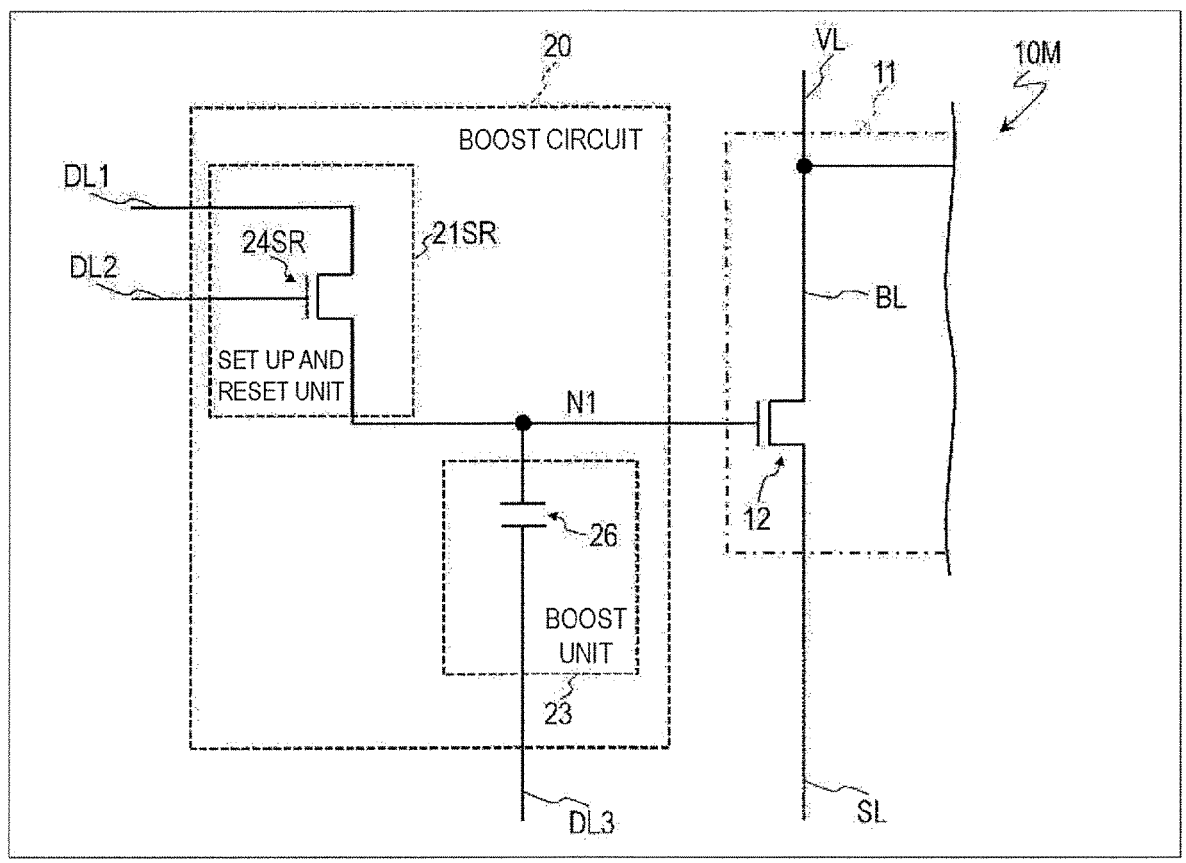
FIG. 29 is a view illustrating a specific configuration example of a set up and reset unit 21SR and a boost unit 23 included in each of boost circuits 20 of the DEMUX circuit 10M.

A more specific configuration of each of the boost circuits 20 will be described with reference to FIG. 29. FIG. 29 is a view illustrating a specific configuration example of the set up and reset unit 21SR and the boost unit 23 of the boost circuit 20.

In the example illustrated in FIG. 29, the set up and reset unit 21SR includes a TFT (hereinafter referred to as a "setting and resetting TFT") 24SR. A gate electrode of the setting and resetting TFT 24SR is coupled to the second drive signal line DL2. A drain electrode of the setting and resetting TFT 24SR is coupled to the first drive signal line DL1. A source electrode of the setting and resetting TFT 24SR is coupled to the node N1.

The boost unit 23 includes a capacitance element (boosting capacitance element) 26. The boosting capacitance element 26 includes an electrode coupled to the third drive signal line DL3 (first capacitance electrode), and an electrode coupled to the node N1 (second capacitance electrode).

Figure 30:
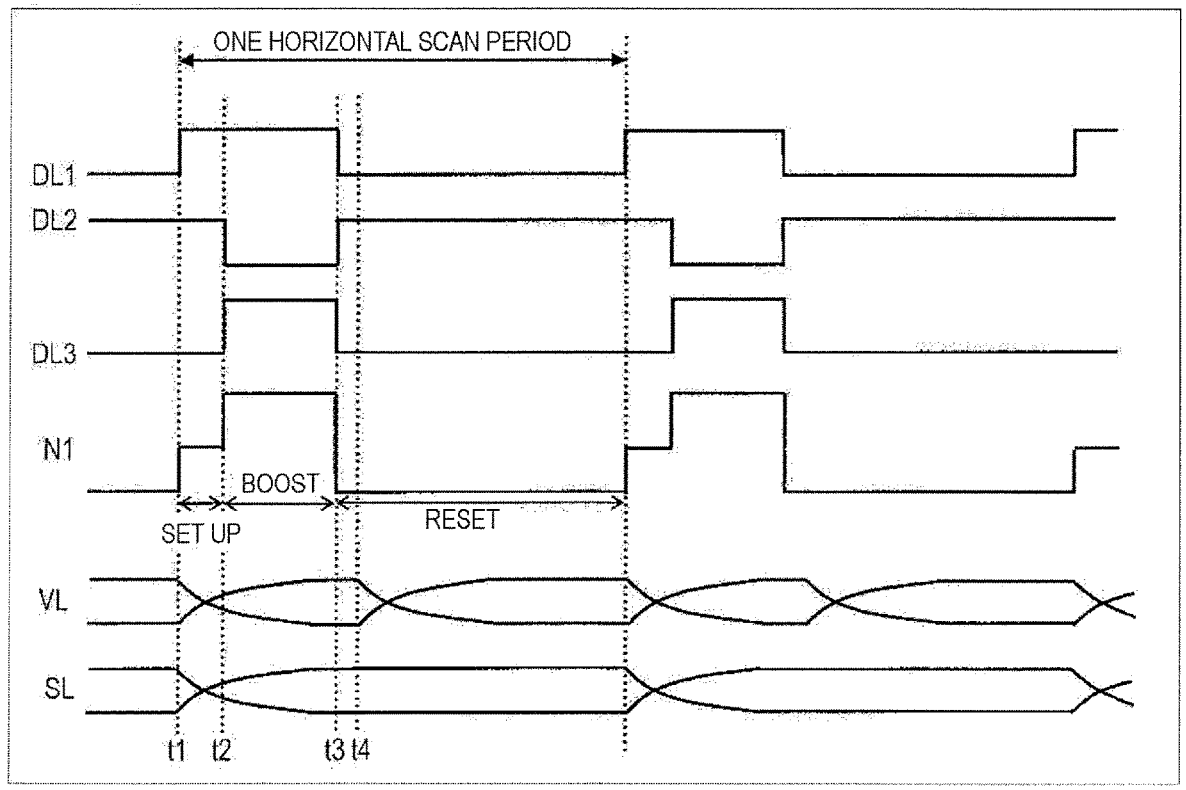
FIG. 30 is a timing chart illustrating operations of each of boost circuits 20 of the DEMUX circuit 10M.

Operations of each of the boost circuits 20 illustrated in FIG. 29 will be described with reference to FIG. 30. FIG. 30 is a timing chart illustrating operations of each of the boost circuits 20. FIG. 30 illustrates potentials of the first drive signal line DL1, the second drive signal line DL2, the third drive signal line DL3, the node N1, each of the signal output lines VL, and each of source bus lines SL. Herein, the high level potential and the low level potential of the set signal S and the reset signal R are respectively designated as VDH1 and VDL1, whereas the high level potential and the low level potential of the boost signal B are respectively designated as VDH2 and VDL2.

First, at a time t1, while the potential of the second drive signal line DL2 (the reset signal R) is kept to the high level (VDH1), when the potential of the first drive signal line DL1 (the set signal S) changes from the low level (VDL1) to the high level (VDH1), the setting and resetting TFT 24SR attains the on state. The node N1 is thus pre-charged. At this time, the gate electrode and the drain electrode of the setting and resetting TFT 24SR are both at an identical potential, making the setting and resetting TFT 24SR in a diode-coupled state. When a threshold voltage of the setting TFT 24SR is designated as Vth, the node N1 is pre-charged to a potential of (VDH1−Vth).

Next, at a time t2, when the potential of the third drive signal line DL3 (the boost signal B) changes from the low level (VDL2) to the high level (VDH2) (at this time, the potential of the second drive signal line DL2 reaches the low level (VDL1)), the potential of the node N1 increases. A degree of increase differs depending on a ratio of a capacitance value Cbst of the boosting capacitance element 26 with respect to a total of a load capacitance (total load capacitance) Cn1 of the node N1. Specifically, a potential equivalent to an amount of increase can be obtained by multiplying the amplitude of the boost signal B (=VDH2−VDL2) with (Cbst/Cn1). For example, when the total load capacitance Cn1 of the node N1 is 0.2 pF, and the capacitance value Cbst of the boosting capacitance element 24 is 0.1 pF, the potential of the node N1 increases from (VDH1−Vth) to {(VDH1−Vth)+(VDH2−VDL2)×(0.1/0.2)}. For example, when VDH1=16 V, VDL1=−7 V, VDH2=14 V, VDL2=−14 V, and Vth=2 V, the node N1 increases to 28 V.

After that, at a time t3, when the potential of the first drive signal line DL1 and the potential of the third drive signal line DL3 both change to the low level (VDL1 and VDL2), and the potential of the second drive signal line DL2 (the reset signal R) changes to the high level (VDH1), the potential of the node N1 is reset (pulled down).

As described above, the first drive signal, the second drive signal, and the third drive signal respectively have cyclical waveforms including a change from the low level to the high level and a change from the high level to the low level. When the first drive signal and the second drive signal are both at the high level, a set operation is performed. When the third drive signal is at the high level, a boost operation is performed. When the first drive signal is at the low level, and the second drive signal is at the high level, a reset operation is performed.

In the DEMUX circuit 10 illustrated in FIG. 3, the boost circuits 20 each include the set up unit 21, the reset unit 22, and the boost unit 23. On the other hand, in the DEMUX circuit 10M according to the embodiment, the boost circuits 20 each include the set up and reset unit 21SR and the boost unit 23. Therefore, according to the embodiment, a number of elements in each of the boost circuits 20 can be reduced. For example, in the configuration illustrated in FIG. 5, the boost circuits 20 each include the two TFTs (the setting TFT 24 and the resetting TFT 25) and a capacitance element (the boosting capacitance element 26). On the other hand, in the configuration illustrated in FIG. 29, the boost circuits 20 each include a TFT (the setting and resetting TFT 24SR) and a capacitance element (the boosting capacitance element 26). Therefore, according to the embodiment, a further narrower frame can be achieved.

About Oxide Semiconductor

The oxide semiconductor included in the oxide semiconductor layer in each of the switching TFTs 12 may be an amorphous oxide semiconductor or a crystalline oxide semiconductor having a crystalline portion. Examples of the crystalline oxide semiconductor include a polycrytalline oxide semiconductor, a microcrystalline oxide semiconductor, and a crystalline oxide semiconductor having a c-axis oriented substantially perpendicular to a layer face.

The oxide semiconductor layer may have a layered structure of two or more layers. In cases where the oxide semiconductor layer has a layered structure, the oxide semiconductor layer may include an amorphous oxide semiconductor layer and a crystalline oxide semiconductor layer, a plurality of crystalline oxide semiconductor layers respectively having different crystal structures, or a plurality of amorphous oxide semiconductor layers. In cases where the oxide semiconductor layer has a two-layer structure including an upper layer and a lower layer, an energy gap of the oxide semiconductor included in the upper layer is preferably greater than an energy gap of the oxide semiconductor included in the lower layer. However, when the difference in the energy gap between these layers is relatively small, the energy gap of the lower layer oxide semiconductor may be greater than the energy gap of the upper layer oxide semiconductor.

JP 2014-007399 A, for example, describes materials, structures, film formation methods, and the configuration of oxide semiconductor layers having layered structures for amorphous oxide semiconductors and each of the above described crystalline oxide semiconductors. For reference, the entire contents of JP 2014-007399 A are incorporated herein.

The oxide semiconductor layer may include, for example, at least one metal element selected from In, Ga, and Zn. In the embodiments of the disclosure, the oxide semiconductor layer includes, for example, an In—Ga—Zn—O based semiconductor (e.g., indium gallium zinc oxide). Here, the In—Ga—Zn—O based semiconductor is a ternary oxide of In (indium), Ga (gallium), and Zn (zinc), and the ratio (composition ratio) of In, Ga, and Zn is not particularly limited to a specific value. For example, the ratio includes In:Ga:Zn=2:2:1, In:Ga:Zn=1:1:1, or In:Ga:Zn=1:1:2. Such an oxide semiconductor layer can be formed from an oxide semiconductor film including an In—Ga—Zn—O based semiconductor.

The In—Ga—Zn—O based semiconductor may be an amorphous semiconductor or a crystalline semiconductor. A crystalline In—Ga—Zn—O based semiconductor in which the c-axis is oriented substantially perpendicular to the layer surface is preferable as the crystalline In—Ga—Zn—O based semiconductor.

Note that the crystal structure of the crystalline In—Ga—Zn—O based semiconductor is disclosed in, for example, the above-mentioned JP 2014-007399 A, JP 2012-134475 A, and JP 2014-209727 A. For reference, the entire contents of JP 2012-134475 A and 2014-209727 A are incorporated herein. Since a TFT including an In—Ga—Zn—O based semiconductor layer has high mobility (more than 20 times in comparison with an a-Si TFT) and low leakage current (less than 1/100th in comparison with an a-Si TFT), such a TFT can suitably be used as a switching TFT 12, as well as can suitably be used as a driving TFT (e.g., a TFT included in a driving circuit provided around a display region including a plurality of pixels on a substrate including the display region) and a pixel TFT (a TFT provided in a pixel).

In place of the In—Ga—Zn—O based semiconductor, the oxide semiconductor layer may include another oxide semiconductor. For example, the oxide semiconductor layer may include an In—Sn—Zn—O based semiconductor (e.g., $In_2O_3$—$SnO_2$—ZnO; InSnZnO). The In—Sn—Zn—O based semiconductor is a ternary oxide of In (indium), Sn (tin), and Zn (zinc). Alternatively, the oxide semiconductor layer may contain an In—Al—Zn—O-based semiconductor, an In—Al—Sn—Zn—O-based semiconductor, a Zn—O-based semiconductor, an In—Zn—O-based semiconductor, a Zn—Ti—O-based semiconductor, a Cd—Ge—O-based semiconductor, a Cd—Pb—O-based semiconductor, CdO (cadmium oxide), an Mg—Zn—O-based semiconductor, an In—Ga—Sn—O-based semiconductor, an In— Ga—O-based semiconductor, a Zr—In—Zn—O-based semiconductor, or an Hf—In—Zn—O-based semiconductor.

Fifteenth Embodiment

Figure 31:
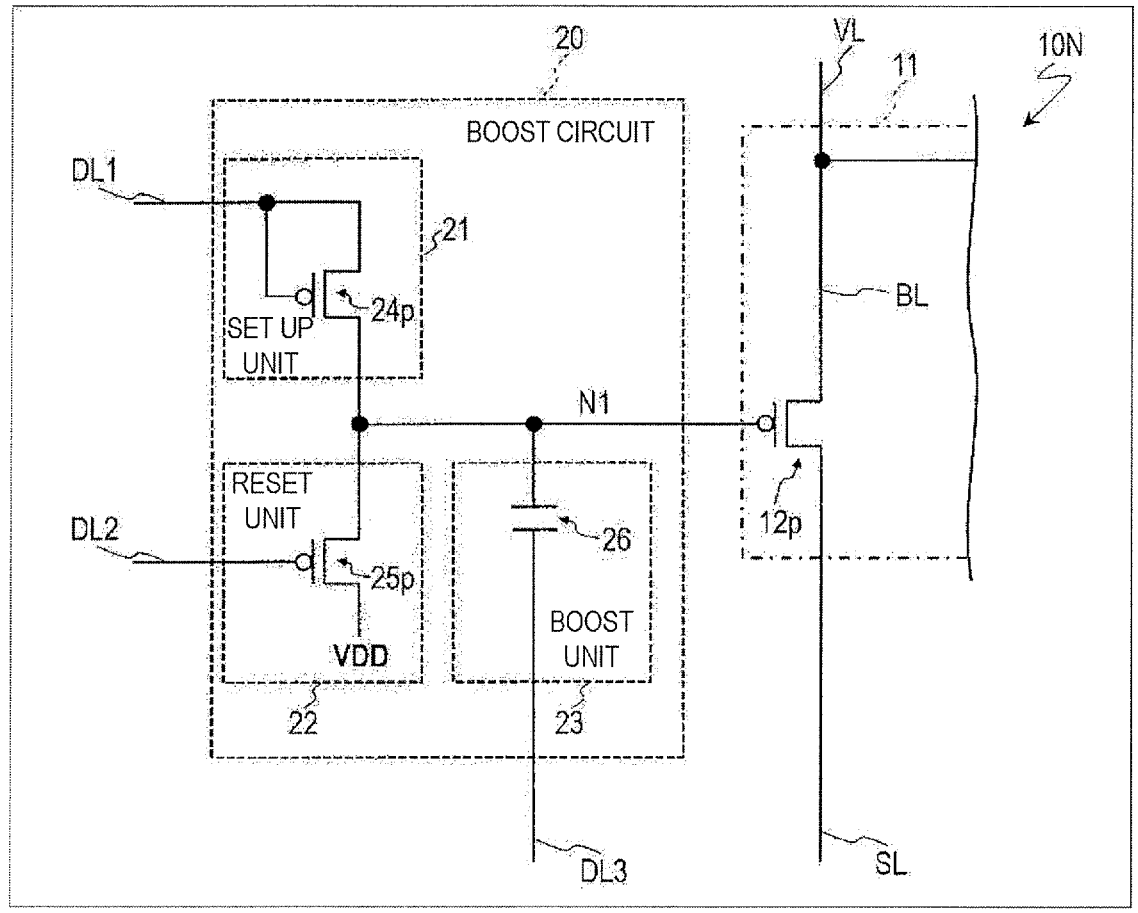
FIG. 31 is a view illustrating a configuration of a DEMUX circuit 10N included in an active matrix substrate according to a fifteenth embodiment.
Figure 32:
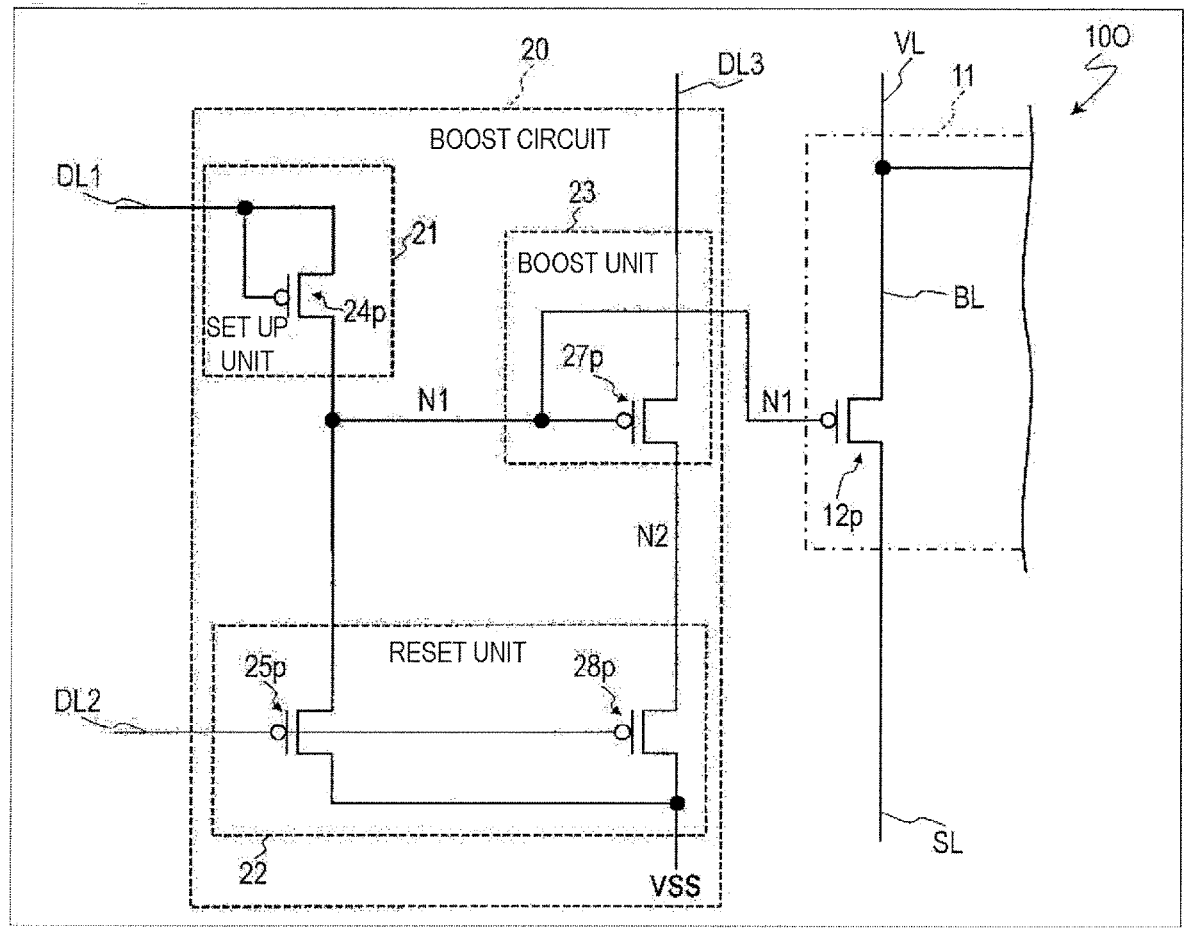
FIG. 32 is a view illustrating a configuration of a DEMUX circuit 10O included in another active matrix substrate according to the fifteenth embodiment.

An active matrix substrate according to the embodiment will be described with reference to FIG. 31 and FIG. 32. FIG. 31 is a view illustrating a configuration of a DEMUX circuit 10N included in the active matrix substrate according to the embodiment. FIG. 32 is a view illustrating a configuration of a DEMUX circuit 10O included in another active matrix substrate according to the embodiment.

The DEMUX circuit 10N illustrated in FIG. 31 differs from the DEMUX circuit 10 illustrated in FIG. 5 in the sense that a switching TFT 12p in each of unit circuits 11 is a PMOS transistor including a poly-crystal silicon semiconductor layer (e.g., low-temperature polysilicon (LIPS) layer) serving as an active layer. In the DEMUX circuit 10N, other TFTs configuring a circuit are also PMOS transistors each including a poly-crystal silicon semiconductor layer. Therefore, a setting TFT 24p of a set up unit 21 and a resetting TFT 25p of a reset unit 22 are also PMOS transistors each including a poly-crystal silicon semiconductor layer.

The DEMUX circuit 10O illustrated in FIG. 32 differs from the DEMUX circuit 10A illustrated in FIG. 12 in the sense that a switching TFT 12p in each of unit circuits 11 is a PMOS transistor including a poly-crystal silicon semiconductor layer (e.g., low-temperature polysilicon (LTPS) layer) serving as an active layer. In the DEMUX circuit 10O, other TFTs configuring a circuit are also PMOS transistors each including a poly-crystal silicon semiconductor layer. Therefore, a setting TFT 24p of a set up unit 21, resetting TFTs 25p and 28p of a reset unit 22, and a boosting TFT 27p of a boost unit 23 are also PMOS transistors each including a poly-crystal silicon semiconductor layer.

As described in the DEMUX circuits 10N and 10O illustrated in FIG. 31 and FIG. 32, DEMUX circuits including PMOS transistors can be driven at identical timings, for example, only with signals, for example, opposite in polarity to signals, for example, in the DEMUX circuit 10 illustrated in FIG. 2 and the DEMUX circuit 10A illustrated in FIG. 12 (a source electrode of a resetting TFT 25p accepts a positive power source potential VDD).

As described above, poly-crystal silicon is higher in mobility than an oxide semiconductor. A PMOS is lower in mobility than an N-channel metal oxide semiconductor (NMOS). Therefore, when a PMOS transistor including a poly-crystal silicon semiconductor layer serving as an active layer is only used as a TFT for DEMUX circuit, similar problems to the problems when an oxide semiconductor TFT is used arise.

As illustrated in the embodiment, with the DEMUX circuits 10N and 10O including boost circuits 20, drive power can be reduced, and a narrower frame can be achieved.

Display Device

The active matrix substrates (semiconductor devices) according to the embodiments of the disclosure are preferably used in display devices. The examples of the active matrix substrates for liquid crystal display devices configured to perform displaying in the transverse electrical field mode such as an FFS mode have been described so far. However, the disclosure is applicable to active matrix substrates for liquid crystal display devices configured to perform displaying in a vertical electric field mode where a voltage is applied in a thickness direction of a liquid crystal layer (e.g., a TN mode and a vertical alignment mode). The active matrix substrates according to the embodiments of the disclosure may also be preferably used in other display devices than liquid crystal display devices (display devices each including another display medium layer than a liquid crystal layer). For example, the active matrix substrates according to the embodiments of the disclosure are also used in electrophoresis display devices and organic electroluminescence (EL) display devices, for example.

A liquid crystal display device can include an active matrix substrate, a counter substrate arranged to face the active matrix substrate, and a liquid crystal layer provided between the active matrix substrate and the counter substrate. An organic EL display device can include an active matrix substrate, and an organic EL layer provided on the active matrix substrate.

INDUSTRIAL APPLICABILITY

According to the embodiments of the disclosure, a drive power for an active matrix substrate including a demultiplexer circuit can be reduced. The active matrix substrates according to the embodiments of the disclosure may be preferably used in various display devices.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. An active matrix substrate including
a display region including a plurality of pixel regions, and
a peripheral region lying at periphery of the display region,
the active matrix substrate comprising:
a substrate;
a plurality of gate bus lines and a plurality of source bus lines provided on the substrate;
a source driver arranged in the peripheral region, the source driver including a plurality of output terminals;
a plurality of signal output lines respectively coupled to the plurality of output terminals of the source driver; and
a demultiplexer circuit arranged in the peripheral region, the demultiplexer circuit including a plurality of unit circuits supported by the substrate,
wherein
the plurality of unit circuits of the demultiplexer circuit each distribute a display signal from one signal output line among the plurality of signal output lines to an n number of source bus lines, where n is an integer of 2 or greater, among the plurality of source bus lines,
the plurality of unit circuits each include
an n number of branch wiring lines coupled to the one signal output line, and
an n number of switching thin film transistors (TFTs) respectively coupled to the n number of branch wiring lines, the n number of switching TFTs being configured to separately on/off-control electrical couplings between the n number of branch wiring lines and the n number of source bus lines,
the demultiplexer circuit further includes a plurality of boost circuits configured to increase a voltage to be applied to gate electrodes of the n number of switching TFTs,
the plurality of boost circuits each include
a set up unit to be driven by a first drive signal S, the set up unit being configured to perform a set operation to pre-charge a node coupled to a corresponding one of the gate electrodes,
a reset unit to be driven by a second drive signal R, the reset unit being configured to perform a reset operation to reset a potential of the node, and
a boost unit to be driven by a third drive signal B, the boost unit being configured to perform a boost operation to increase the potential of the node pre-charged by the set up unit,
an amplitude of the first drive signal S and an amplitude of the second drive signal R are identical to each other, and
an amplitude of the third drive signal B differs from the amplitudes of the first drive signal S and the second drive signal R.

2. The active matrix substrate according to claim 1, wherein the amplitudes of the first drive signal S and the second drive signal R are each smaller than the amplitude of the third drive signal B.

3. The active matrix substrate according to claim 2, wherein high level potentials of the first drive signal S and the second drive signal R and a high level potential of the third drive signal B are identical to each other, and low level potentials of the first drive signal S and the second drive signal R are each higher than a low level potential of the third drive signal B.

4. The active matrix substrate according to claim 3 further comprising:
- a power source circuit unit configured to supply power source voltages at a plurality of levels used to generate the first drive signal S, the second drive signal R, and the third drive signal B,
- wherein the power source voltages at the plurality of levels include
- a high level power source voltage corresponding to each of the high level potentials of the first drive signal S, the second drive signal R, and the third drive signal B,
- a first low level power source voltage corresponding to each of the low level potentials of the first drive signal S and the second drive signal R, and
- a second low level power source voltage corresponding to the low level potential of the third drive signal B.

5. The active matrix substrate according to claim 2,
Wherein the low level potentials of the first drive signal S and the second drive signal R and the low level potential of the third drive signal B are identical to each other, and
the high level potentials of the first drive signal S and the second drive signal R are each lower than the high level potential of the third drive signal B.

6. The active matrix substrate according to claim 5 further comprising:
- a power source circuit unit configured to supply power source voltages at a plurality of levels used to generate the first drive signal S, the second drive signal R, and the third drive signal B,
- wherein the power source voltages at the plurality of levels include
- a low level power source voltage corresponding to each of the low level potentials of the first drive signal S, the second drive signal R, and the third drive signal B,
- a first high level power source voltage corresponding to each of the high level potentials of the first drive signal S and the second drive signal R, and
- a second high level power source voltage corresponding to the high level potential of the third drive signal B.

7. The active matrix substrate according to claim 1,
wherein a relationship of VDL1−Vsl−Vthsw<0 is satisfied, where Vthsw is a threshold voltage of each of the switching TFTs, Vsl is a low level potential of the display signal, and VDL1 is each of the low level potentials of the first drive signal S and the second drive signal R.

8. The active matrix substrate according to claim 1,
wherein the n number of switching TFTs included in each of the plurality of unit circuits are two switching TFTs,
the two switching TFTs include a first switching TFT and a second switching TFT configured to attain an on state at timings different from each other within one horizontal scan period, and
the plurality of boost circuits include
a first boost circuit coupled to the first switching TFT of one unit circuit among the plurality of unit circuits, and
a second boost circuit coupled to the second switching TFT of the one unit circuit.

9. The active matrix substrate according to claim 1,
wherein the n number of switching TFTs included in each of the plurality of unit circuits are two switching TFTs,
the two switching TFTs include a first switching TFT and a second switching TFT configured to attain the on state at timings different from each other within one horizontal scan period, and
the plurality of boost circuits include
a first boost circuit commonly coupled to the first switching TFTs of two unit circuits among the plurality of unit circuits, and
a second boost circuit commonly coupled to the second switching TFTs of the two unit circuits.

10. The active matrix substrate according to claim 1,
wherein the n number of switching TFTs included in each of the plurality of unit circuits are two switching TFTs,
the two switching TFTs include a first switching TFT and a second switching TFT configured to attain the on state at timings different from each other within one horizontal scan period, and
the plurality of boost circuits include
a first boost circuit commonly coupled to the first switching TFTs of three or more unit circuits among the plurality of unit circuits, and
a second boost circuit commonly coupled to the second switching TFTs of the three or more unit circuits.

11. The active matrix substrate according to claim 1,
wherein the n number of switching TFTs included in each of the plurality of unit circuits are three switching TFTs,
the three switching TFTs include a first switching TFT, a second switching TFT, and a third switching TFT configured to attain the on state at timings different from each other within one horizontal scan period, and
the plurality of boost circuits include
a first boost circuit coupled to the first switching TFT of one unit circuit among the plurality of unit circuits,
a second boost circuit coupled to the second switching TFT of the one unit circuit, and
a third boost circuit coupled to the third switching TFT of the one unit circuit.

12. The active matrix substrate according to claim 1,
wherein the n number of switching TFTs included in each of the plurality of unit circuits are three switching TFTs,
the three switching TFTs include a first switching TFT, a second switching TFT, and a third switching TFT configured to attain the on state at timings different from each other within one horizontal scan period, and
the plurality of boost circuits include
a first boost circuit commonly coupled to the first switching TFTs of two unit circuits among the plurality of unit circuits,
a second boost circuit commonly coupled to the second switching TFTs of the two unit circuits, and
a third boost circuit commonly coupled to the third switching TFTs of the two unit circuits.

13. The active matrix substrate according to claim 1,
wherein the n number of switching TFTs included in each of the plurality of unit circuits are three switching TFTs,
the three switching TFTs include a first switching TFT, a second switching TFT, and a third switching TFT configured to attain the on state at timings different from each other within one horizontal scan period, and
the plurality of boost circuits include
a first boost circuit commonly coupled to the first switching TFTs of three or more unit circuits among the plurality of unit circuits,
a second boost circuit commonly coupled to the second switching TFTs of the three or more unit circuits, and
a third boost circuit commonly coupled to the third switching TFTs of the three or more unit circuits.

14. The active matrix substrate according to claim 1,
wherein the demultiplexer circuit further includes a plurality of clear circuits respectively coupled to the plurality of boost circuits, the plurality of clear circuits being respectively configured to initialize the corresponding boost circuits each at a predetermined timing.

15. The active matrix substrate according to claim 1,
wherein the set up unit and the reset unit each include a plurality of TFTs coupled in series to each other.

16. The active matrix substrate according to claim 1,
wherein the plurality of boost circuits include two or more boost circuits to be driven at an identical timing, and
the demultiplexer circuit includes
a first drive signal line group configured to supply a drive signal group used to drive some boost circuits among the two or more boost circuits, and
a second drive signal line group configured to supply a drive signal group used to drive other boost circuits, the second drive signal line group being different from the first drive signal line group.

17. The active matrix substrate according to claim 1,
wherein the set up unit is a set up and reset unit configured to also function as the reset unit, the set up and reset unit being configured to perform the set operation and the reset operation at timings different from each other.

18. The active matrix substrate according to claim 1,
wherein the n number of switching TFTs each include an oxide semiconductor layer serving as an active layer.

19. The active matrix substrate according to claim 18,
wherein the oxide semiconductor layer contains an In-Ga—Zn—O based semiconductor.

20. The active matrix substrate according to claim 19,
wherein the In—Ga—Zn—O based semiconductor contains a crystalline portion.

21. The active matrix substrate according to claim 1,
wherein the n number of switching TFTs respectively are P-channel metal oxide semiconductor (PMOS) transistors each including a poly-crystal silicon semiconductor layer serving as an active layer.

22. A display device comprising the active matrix substrate according to claim 1.

* * * * *